(12) United States Patent
Ballantine et al.

(10) Patent No.: US 9,019,700 B2
(45) Date of Patent: *Apr. 28, 2015

(54) METHOD OF OPERATING AN ENERGY CENTER

(75) Inventors: Arne Ballantine, Palo Alto, CA (US); KR Sridhar, Los Gatos, CA (US); Jon Christopher Motta, San Francisco, CA (US); Peter Light, San Francisco, CA (US); Carl Cottuli, Franklin, MA (US); Jessica Mahler, Mountain View, CA (US)

(73) Assignee: Bloom Energy Corporation, Sunnyvale, CA (US)

( * ) Notice: Subject to any disclaimer, the term of this patent is extended or adjusted under 35 U.S.C. 154(b) by 479 days.

This patent is subject to a terminal disclaimer.

(21) Appl. No.: 13/533,755

(22) Filed: Jun. 26, 2012

(65) Prior Publication Data

US 2013/0163193 A1    Jun. 27, 2013

Related U.S. Application Data

(60) Provisional application No. 61/501,607, filed on Jun. 27, 2011.

(51) Int. Cl.
| | |
|---|---|
| *H05K 7/20* | (2006.01) |
| *G06F 1/20* | (2006.01) |
| *H05K 9/00* | (2006.01) |
| *H05K 7/00* | (2006.01) |
| *H05K 7/14* | (2006.01) |

(52) U.S. Cl.
CPC ........ *H05K 7/20763* (2013.01); *H05K 7/20709* (2013.01); *H05K 7/20718* (2013.01); *H05K 9/0001* (2013.01); *H05K 7/00* (2013.01); *H05K 7/1492* (2013.01); *H05K 7/20745* (2013.01); *H05K 7/20827* (2013.01)

(58) Field of Classification Search
USPC ........ 361/679.46, 679.48, 688, 695; 429/434, 429/439
See application file for complete search history.

(56) References Cited

U.S. PATENT DOCUMENTS

| | | | | |
|---|---|---|---|---|
| 7,203,574 | B2 * | 4/2007 | Caci et al. | 700/276 |
| 7,705,490 | B2 | 4/2010 | Srinivasan et al. | |
| 7,713,649 | B2 | 5/2010 | Hickey et al. | |
| 8,043,756 | B2 * | 10/2011 | Kim et al. | 429/436 |
| 8,216,732 | B2 * | 7/2012 | Lam | 429/431 |
| 8,232,676 | B2 | 7/2012 | Gurunathan et al. | |
| 8,318,381 | B2 * | 11/2012 | Black | 429/515 |
| 2004/0265662 | A1 * | 12/2004 | Brignone et al. | 429/26 |
| 2007/0042246 | A1 * | 2/2007 | Kubota et al. | 429/24 |
| 2009/0273240 | A1 | 11/2009 | Gurunathan et al. | |
| 2011/0156480 | A1 * | 6/2011 | Park | 307/23 |
| 2011/0281185 | A1 | 11/2011 | Sridhar et al. | |
| 2012/0327592 | A1 * | 12/2012 | Godrich et al. | 361/679.48 |
| 2013/0163192 | A1 | 6/2013 | Ballantine et al. | |
| 2013/0163193 | A1 | 6/2013 | Ballantine et al. | |
| 2013/0199032 | A1 | 8/2013 | Czamara et al. | |

(Continued)

OTHER PUBLICATIONS

Godrich, K., "Convergent Energized IT Apparatus for Commercial Use," U.S. Appl. No. 61/501,599, filed Jun. 27, 2011.

*Primary Examiner* — Robert J Hoffberg
(74) *Attorney, Agent, or Firm* — The Marbury Law Group PLLC

(57) ABSTRACT

Methods are provided for creating and operating data centers. A data center may include an information technology (IT) load and a fuel cell generator configured to provide power to the IT load.

32 Claims, 42 Drawing Sheets

(56) References Cited

U.S. PATENT DOCUMENTS

| | | |
|---|---|---|
| 2014/0059946 A1 | 3/2014 | Gardner et al. |
| 2014/0089055 A1* | 3/2014 | Smith et al. .................. 705/7.36 |
| 2014/0103678 A1 | 4/2014 | Slessman |
| 2014/0173299 A1* | 6/2014 | McKnight et al. ............ 713/300 |

* cited by examiner

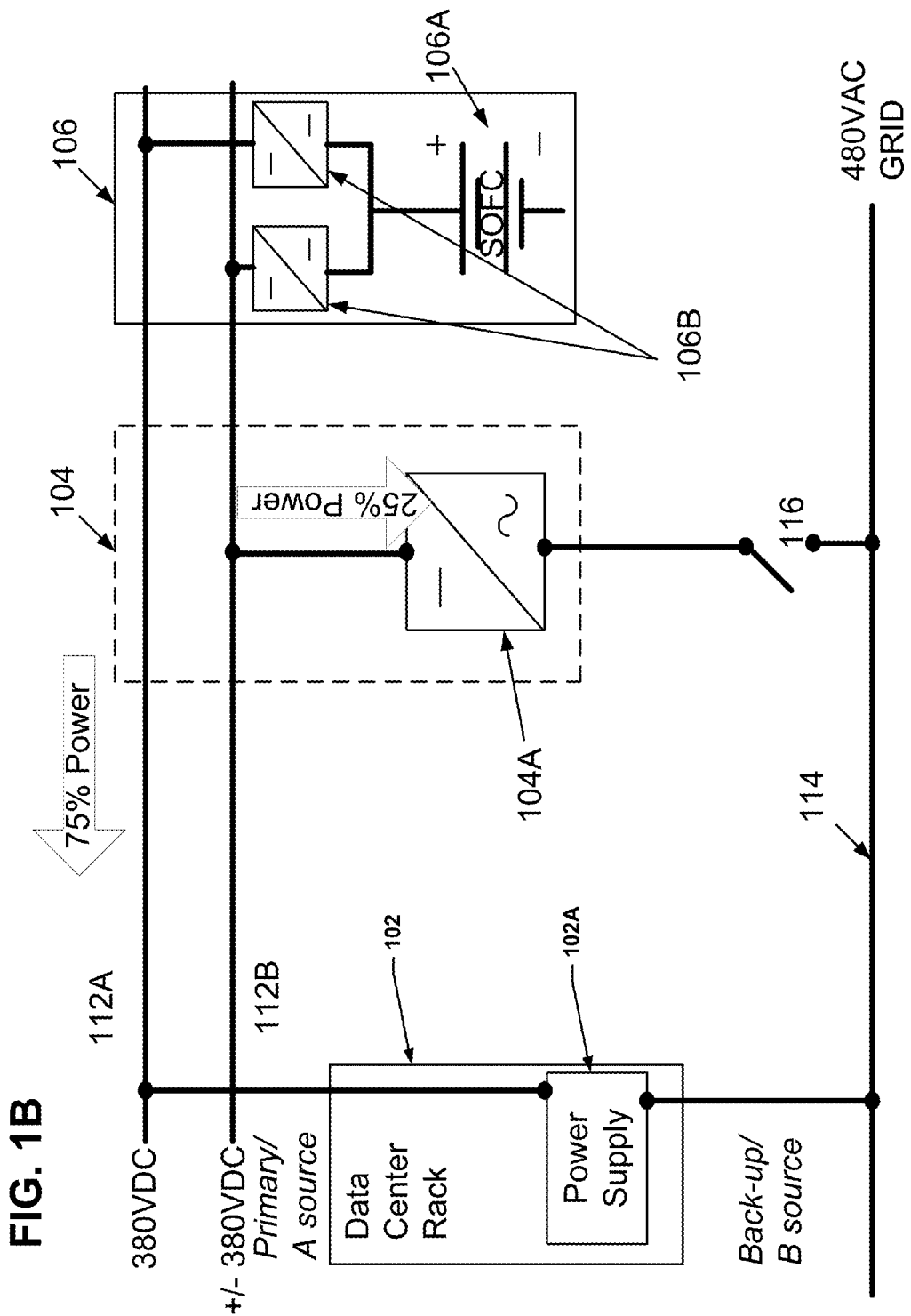

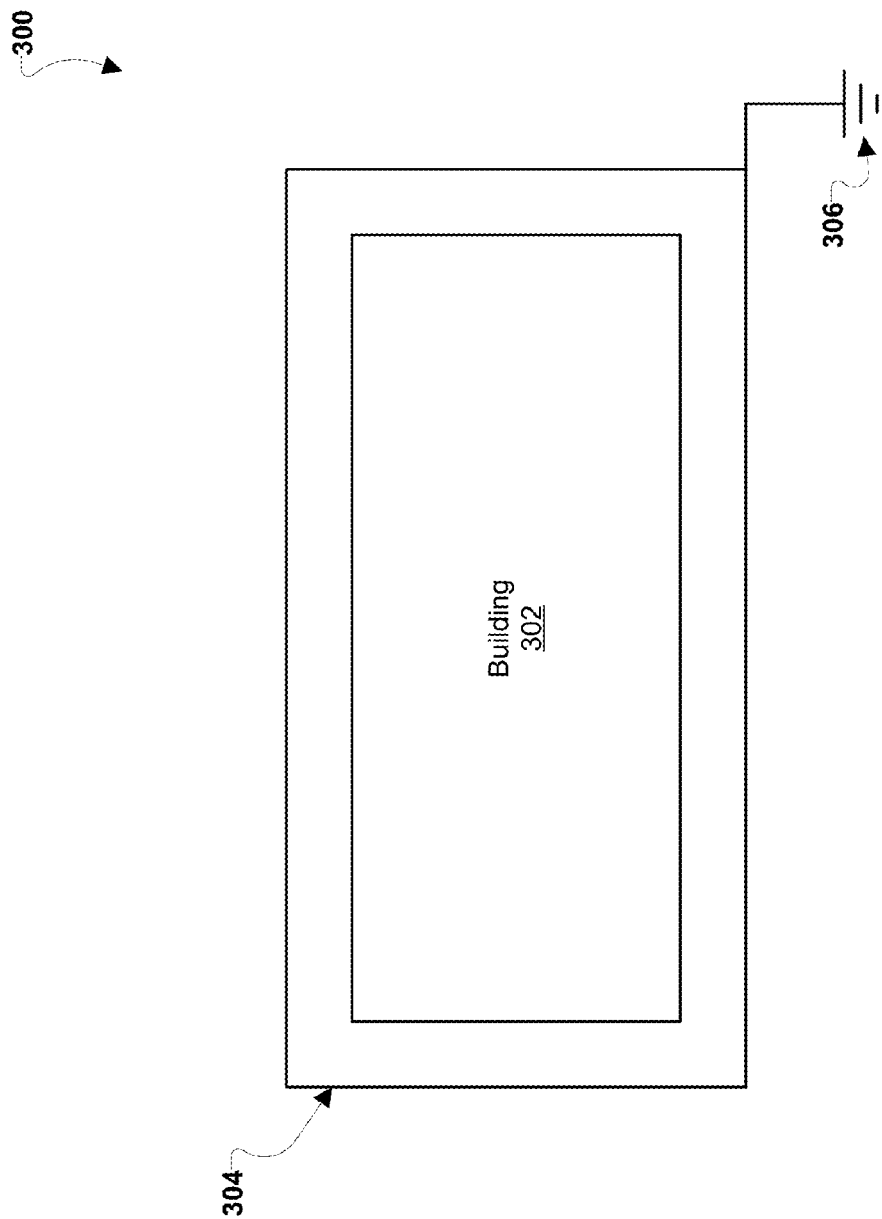

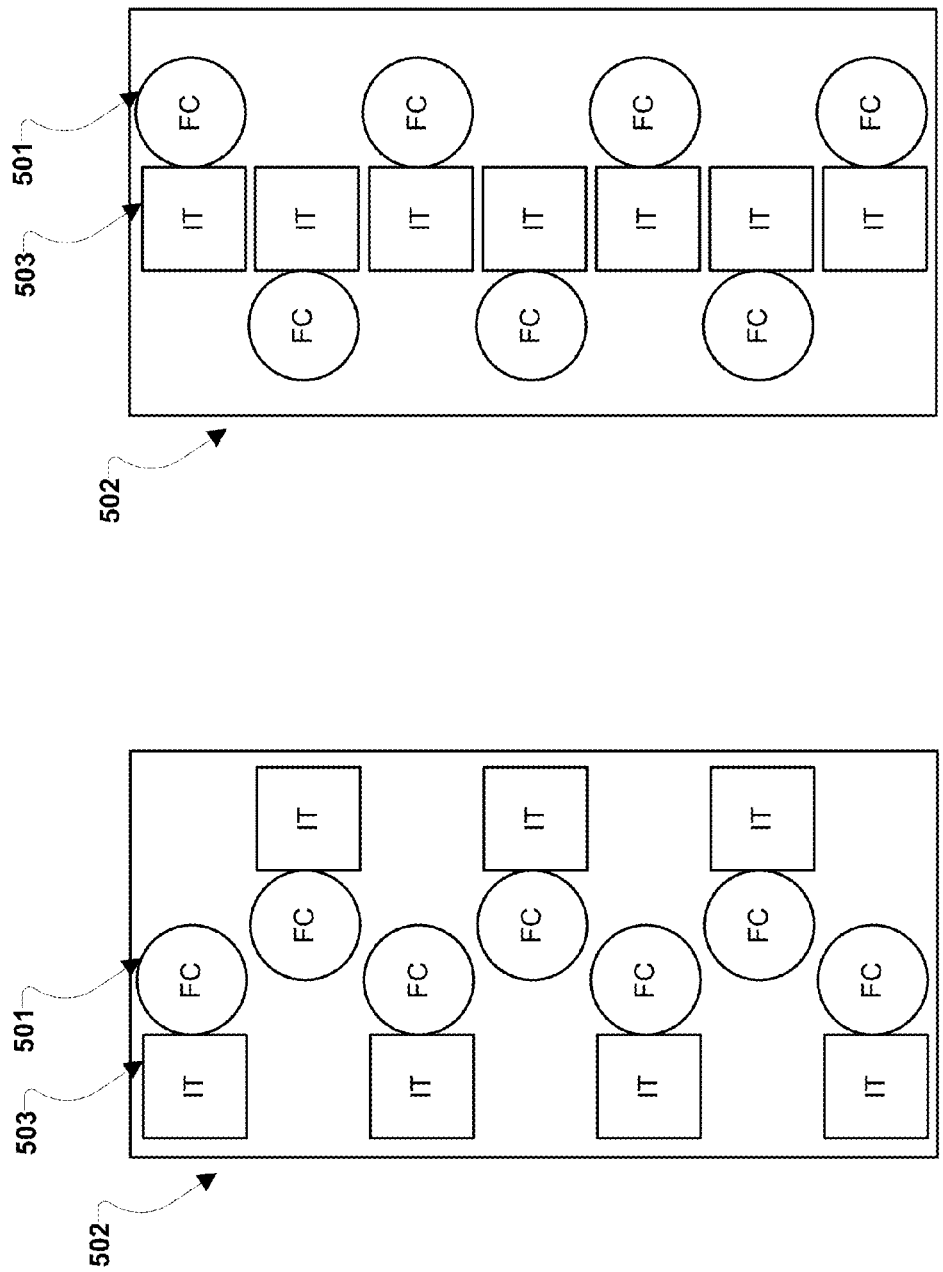

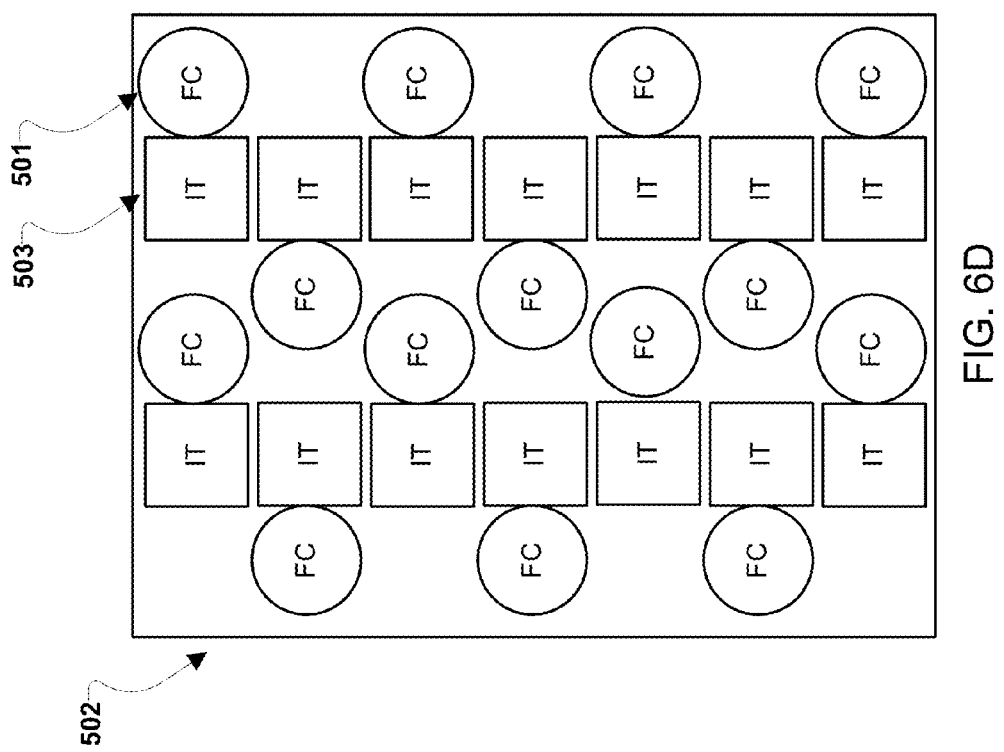

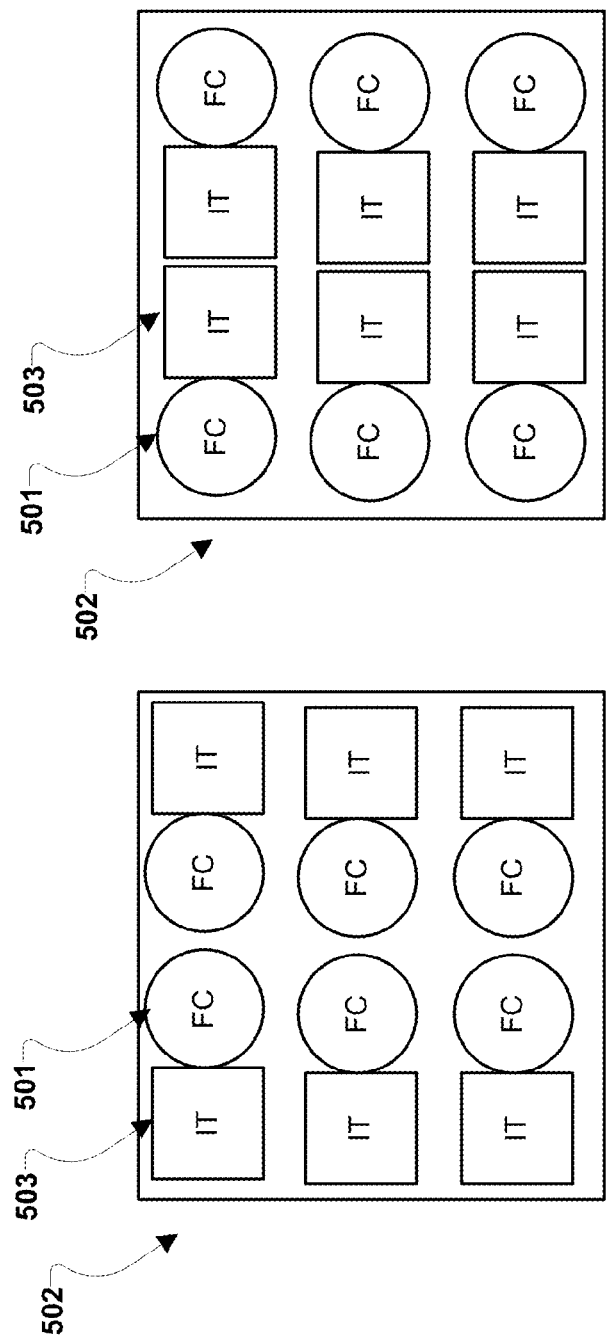

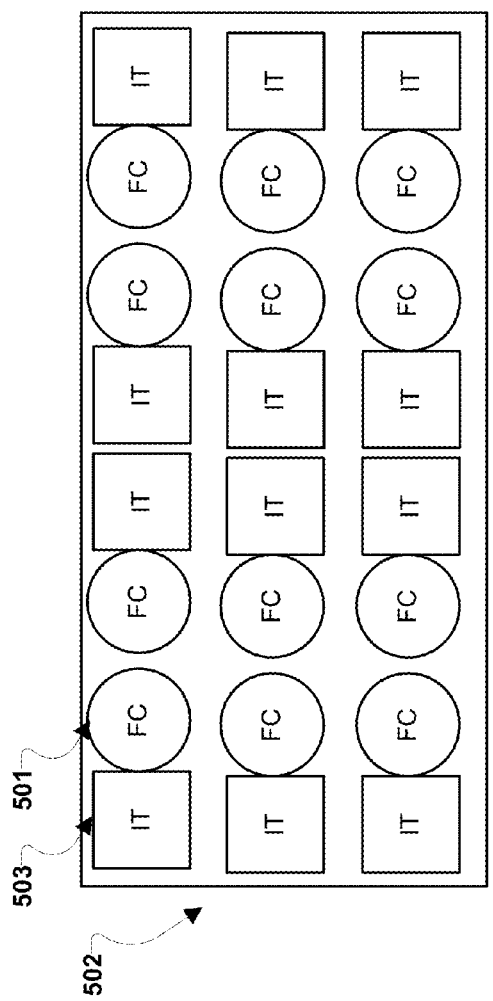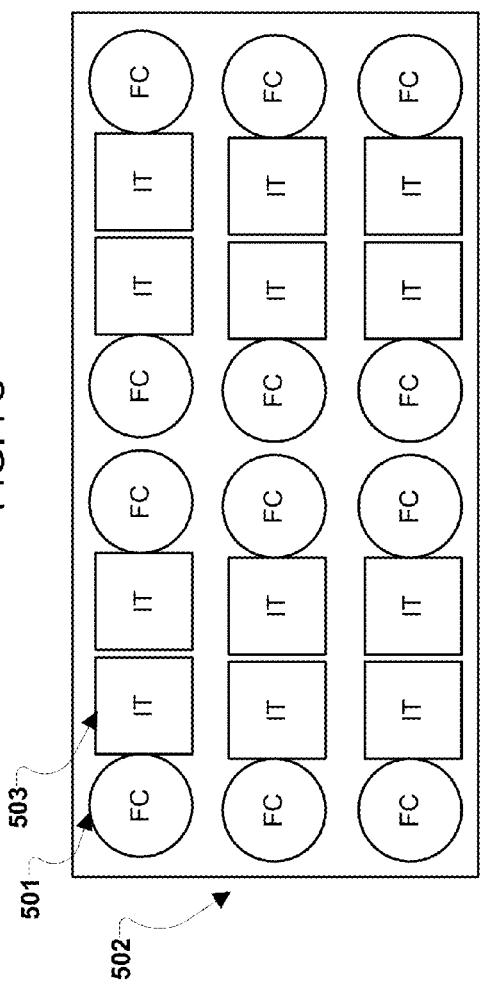

METHOD OF OPERATING AN ENERGY CENTER

CROSS REFERENCE TO RELATED APPLICATIONS

This application claims the benefit of priority to U.S. Provisional Patent Application Ser. No. 61/501,607 entitled "Energy Center" and filed Jun. 27, 2011, which is incorporated herein by reference in its entirety.

BACKGROUND

Electrical power systems can be used to provide electrical power to one more loads such as buildings, appliances, lights, tools, air conditioners, heating units, factory equipment and machinery, power storage units, computers, security systems, etc. The electricity used to power loads is often received from an electrical grid. However, the electricity for loads may also be provided through alternative power sources such as fuel cells, solar arrays, wind turbines, thermo-electric devices, batteries, other native DC generating sources, etc. The alternative power sources can be used in conjunction with the electrical grid, and a plurality of alternative power sources may be combined in a single electrical power system. Alternative power sources are generally combined after conversion of their direct current (DC) output into an alternating current (AC). As a result, synchronization of alternative power sources is required.

In addition, many alternative power sources use machines such as pumps and blowers which run off auxiliary power. Motors for these pumps and blowers are typically 3-phase AC motors which may require speed control. If the alternative power source generates a DC, the DC undergoes several states of power conversion prior to delivery to the motor(s). Alternatively, the power to the motors for pumps, blowers, etc. may be provided using the electrical grid, an inverter, and a variable frequency drive. In such a configuration, two stages of power conversion of the inverter are incurred along with two additional stages of power conversion for driving components of the AC driven variable frequency drive. In general, each power conversion stage that is performed adds cost to the system, adds complexity to the system, and lowers the efficiency of the system.

Operating individual distributed generators, such as fuel cell generators, both with and without a grid reference and in parallel with each other without a grid reference is problematic in that switch-over from current source to voltage source must be accommodated. Additionally, parallel control of many grid independent generators, utility anomalies, and/or non-critical load reflections can be problematic.

To address the mode-switch-over issue, a double-inverter arrangement may be utilized. This allows one inverter to be used in grid tie and a second inverter to be used with the stand-alone load. An exemplary double-inverter arrangement with a load dedicated inverter that is located internally in an input/output module of a solid oxide fuel cell (SOFC) system is described in U.S. patent application Ser. No. 12/148,488, filed May 2, 2008 and entitled "Uninterruptible Fuel Cell System", which is incorporated herein by reference in its entirety, now published as U.S. Patent Application Publication US 2008/0304067.

Another approach is to drop power for 5-10 cycles to switch modes. If a single inverter is used, a time of 5-10 cycles would be required to drop grid tie and establish voltage mode control.

Yet another approach is to use frequency droop to control the amount of power sharing in grid tied export or in load stand alone output control.

SUMMARY

The various embodiments provide methods for operating a data center, comprising an information technology (IT) load, a fuel cell generator electrically coupled to the IT load, a building structure housing the fuel cell generator and the IT load, and a cooling device.

In an embodiment, the method may comprise operating the fuel cell generator to provide power to the IT load, providing a process exhaust stream from at least one of the fuel cell generator and the IT load, and using the process exhaust stream to cool at least one of the fuel cell generator and the IT load.

In another embodiment, the method may comprise operating the fuel cell generator to provide power to the IT load, and operating the cooling device to cool at least one of the fuel cell generator and the IT load.

DESCRIPTION OF THE DRAWINGS

FIG. 1A-1C are block diagrams illustrating a system according to embodiments of the invention.

FIG. 3 illustrates an embodiment building structure.

FIGS. 6A-6D illustrate top views of various staggered IT load and fuel cell generator arrangements suitable for use in the various embodiments.

FIGS. 7A-7E illustrate top views of various back to back IT load and fuel cell generator arrangements suitable for use in the various embodiments.

DETAILED DESCRIPTION

Figure 1A:
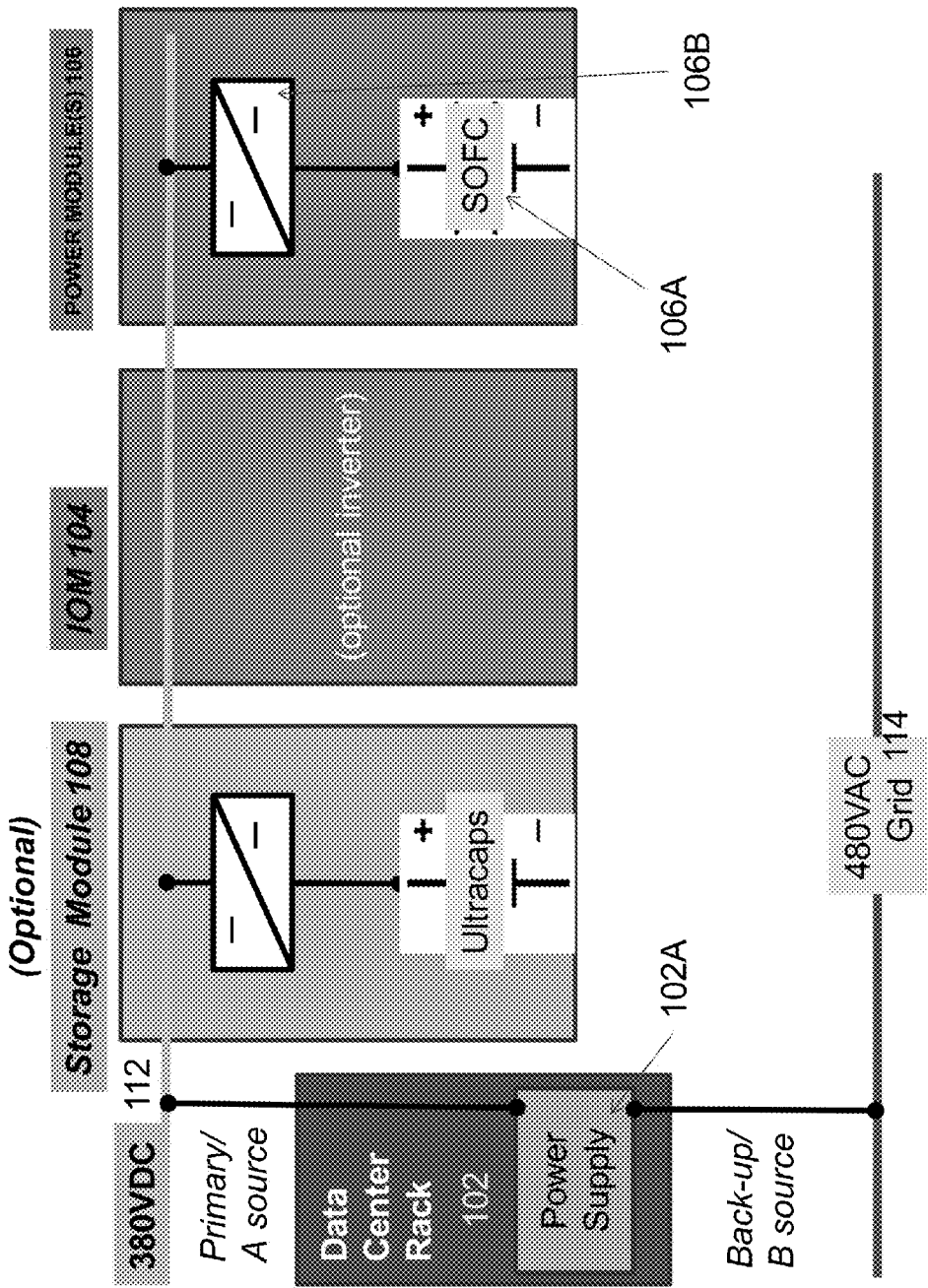

Referring to FIG. 1A, a fuel cell system according to an embodiment includes a DC load 102, such as an information technology (IT) load (i.e., devices operating in an IT system which may include one or more of computer(s), server(s), router(s), rack(s), power supply connections, and other components found in a data center environment.

As described herein, an IT load (i.e., devices operating in an IT system which may include one or more of computer(s), server(s), router(s), rack(s), power supply connections, and other components found in a data center environment) and IT system are distinguished from devices, such as computers, servers, routers, racks, controllers, power supply connections, and other components used to monitor, manage, and/or control the operation of DC power generators and DC power generation systems in that IT loads do not monitor, manage, and/or control the operation of any DC power generators or DC power generation systems that provide power to the IT loads themselves.

The optional input/output module (TOM) 104 may comprise one or more power conditioning components. The power conditioning components may include components for converting DC power to AC power, such as a DC/AC inverter 104A (e.g., a DC/AC inverter described in U.S. Pat. No. 7,705,490, incorporated herein by reference in its entirety) (illustrated in FIG. 1B, electrical connectors for AC power output to the grid, circuits for managing electrical transients, a system controller (e.g., a computer or dedicated control logic device or circuit), etc. The power conditioning components may be designed to convert DC power from the fuel cell modules to different AC voltages and frequencies. Designs for 208V, 60 Hz; 480V, 60 Hz; 415V, 50 Hz and other common voltages and frequencies may be provided.

Each power module (i.e., fuel cell generator) 106 cabinet is configured to house one or more hot boxes. Each hot box contains one or more stacks or columns of fuel cells 106A (generally referred to as "segments"), such as one or more stacks or columns of solid oxide fuel cells having a ceramic oxide electrolyte separated by conductive interconnect plates. Other fuel cell types, such as PEM, molten carbonate, phosphoric acid, etc. may also be used.

Fuel cells are often combined into units called "stacks" in which the fuel cells are electrically connected in series and separated by electrically conductive interconnects, such as gas separator plates which function as interconnects. A fuel cell stack may contain conductive end plates on its ends. A generalization of a fuel cell stack is the so-called fuel cell segment or column, which can contain one or more fuel cell stacks connected in series (e.g., where the end plate of one stack is connected electrically to an end plate of the next stack). A fuel cell segment or column may contain electrical leads which output the direct current from the segment or column to a power conditioning system. A fuel cell system can include one or more fuel cell columns, each of which may contain one or more fuel cell stacks, such as solid oxide fuel cell stacks.

The fuel cell stacks may be internally manifolded for fuel and externally manifolded for air, where only the fuel inlet and exhaust risers extend through openings in the fuel cell layers and/or in the interconnect plates between the fuel cells, as described in U.S. Pat. No. 7,713,649, which is incorporated herein by reference in its entirety. The fuel cells may have a cross flow (where air and fuel flow roughly perpendicular to each other on opposite sides of the electrolyte in each fuel cell), counter flow parallel (where air and fuel flow roughly parallel to each other but in opposite directions on opposite sides of the electrolyte in each fuel cell) or co-flow parallel (where air and fuel flow roughly parallel to each other in the same direction on opposite sides of the electrolyte in each fuel cell) configuration.

Power modules may also comprise other generators of direct current, such as solar cell, wind turbine, geothermal or hydroelectric power generators.

The segment(s) 106A of fuel cells may be connected to one or more the DC buses 112 such as a split DC bus, by one or more DC/DC converters 106B located in module 106. The DC/DC converters 106B may be located anywhere in the fuel cell system, for example in the IOM 104 instead of the power modules 106.

The system may also optionally include an energy storage module 108 including a storage device, such as a bank of supercapacitors, batteries, flywheel, etc. The storage device may also be connected to the DC bus 112 using one or more DC/DC converters as shown in FIG. 1A. Alternatively, the storage devices may be located in the power module 106 and/or together with the load 102. In an embodiment in which an energy storage module 108 is not used, the power module controls may be linked to the load 102 such that load 102 power draw may be increased and/or decreased in concert with increasing/decreasing fuel flow to the power modules and increasing/decreasing power module output. As an example, a CPU power usage in the servers comprising an IT load 102 may be increased and/or decreased in concert with increasing/decreasing fuel flow to the power modules and increasing/decreasing power module output.

As shown in FIG. 1B, the bus 112 may comprise a bipolar DC bus 112A and a unipolar DC bus 112B, such that one or more power modules (i.e., fuel cell generators) 106 (or columns in one module) are connected to bus 112A and one or more other power modules (i.e., fuel cell generators) (or other columns in one module) are connected to bus 112B. Bus 112A is connected to the DC load 102, while bus 112B is connected to an inverter 104A in IOM 104. The output from the inverter is provided to the grid 114 or to an AC load.

The fuel cell system and the grid 114 may be electrically connected to the power supply 102A of the load 102. The power supply may include a control logic unit controlling an AC/DC converter to convert back up power from the grid 114 to DC power in case power from modules 106 is not available or not sufficient. The control logic unit may be a computer or processor which switches power between the primary power from bus 112A and backup power from grid 114 using a switch or relay. Alternatively, the control logic unit may balance power consumption from both the primary power bus 112A (e.g., "A source") and backup power from grid 114 (e.g., "B source") to provide shared power to the power supply 102A of the load 102.

A second switch 116 controls the electrical connection between the IOM 104 and the grid 114. Switch 116 may be controlled by the control logic unit or by another system controller.

Figure 1C:
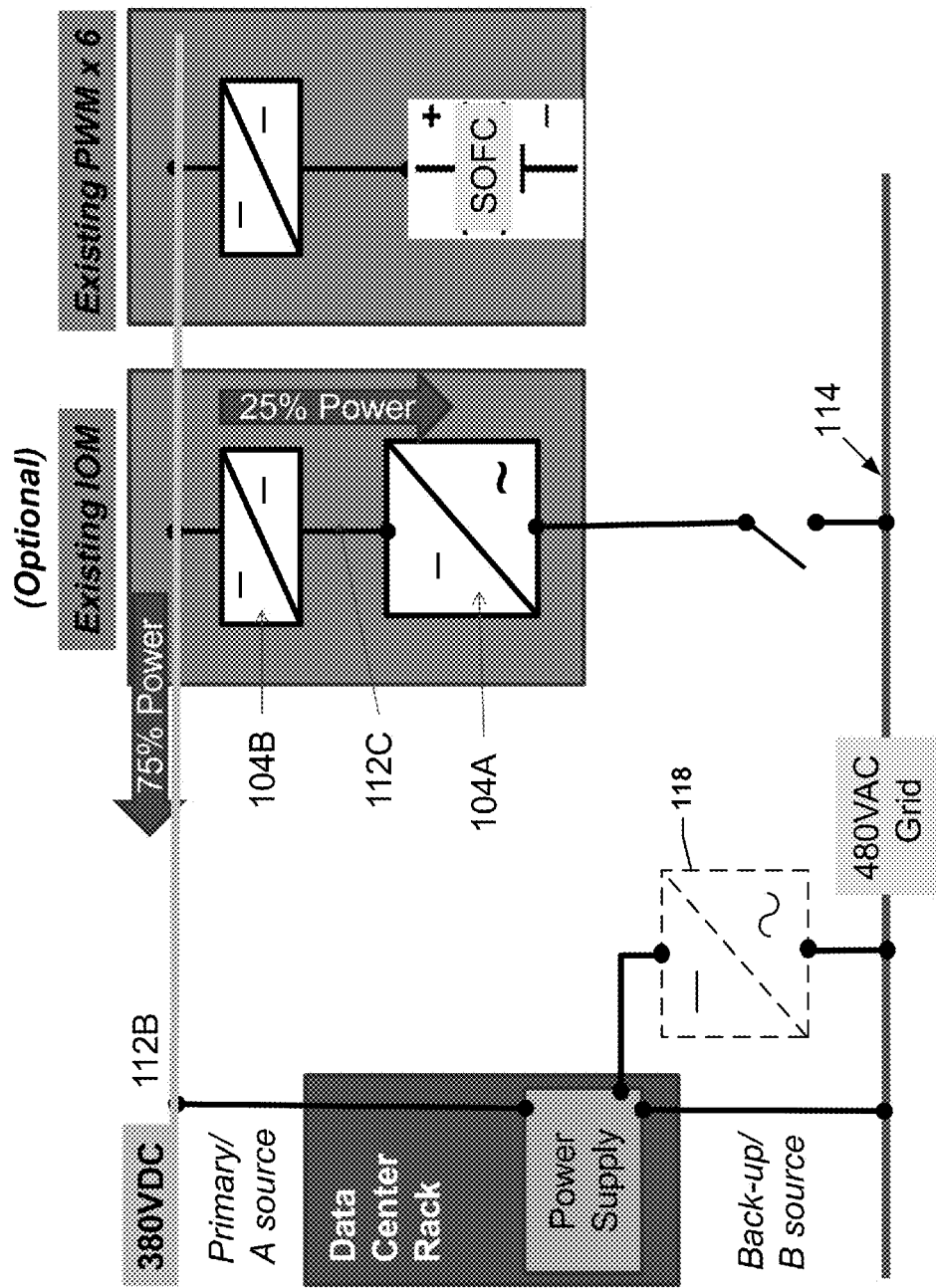

FIG. 1C illustrates an alternative embodiment, where all power modules 106 are connected in parallel to a single unipolar DC bus 112B. Bus 112B provides power to the load 102 and to the DC/DC converter 104B of IOM 104. A bipolar bus 112C connects converter 104B with inverter 104A in IOM 104. While the various buses 112A, 112B are illustrated as a +/−380 volt DC buses in FIGS. 1A-1C, buses 112A and 112B may be any value voltage buses, such as +/−120 volt, +/−280 volt, +/−600 volt, or +/−5000 volt.

In a further embodiment, an AC/DC converter 118 may be coupled between the grid 114 and the power supply 102A of the load 102. In this manner, AC and/or DC power may be input to the load 102 from the grid 114.

Figure 2A:
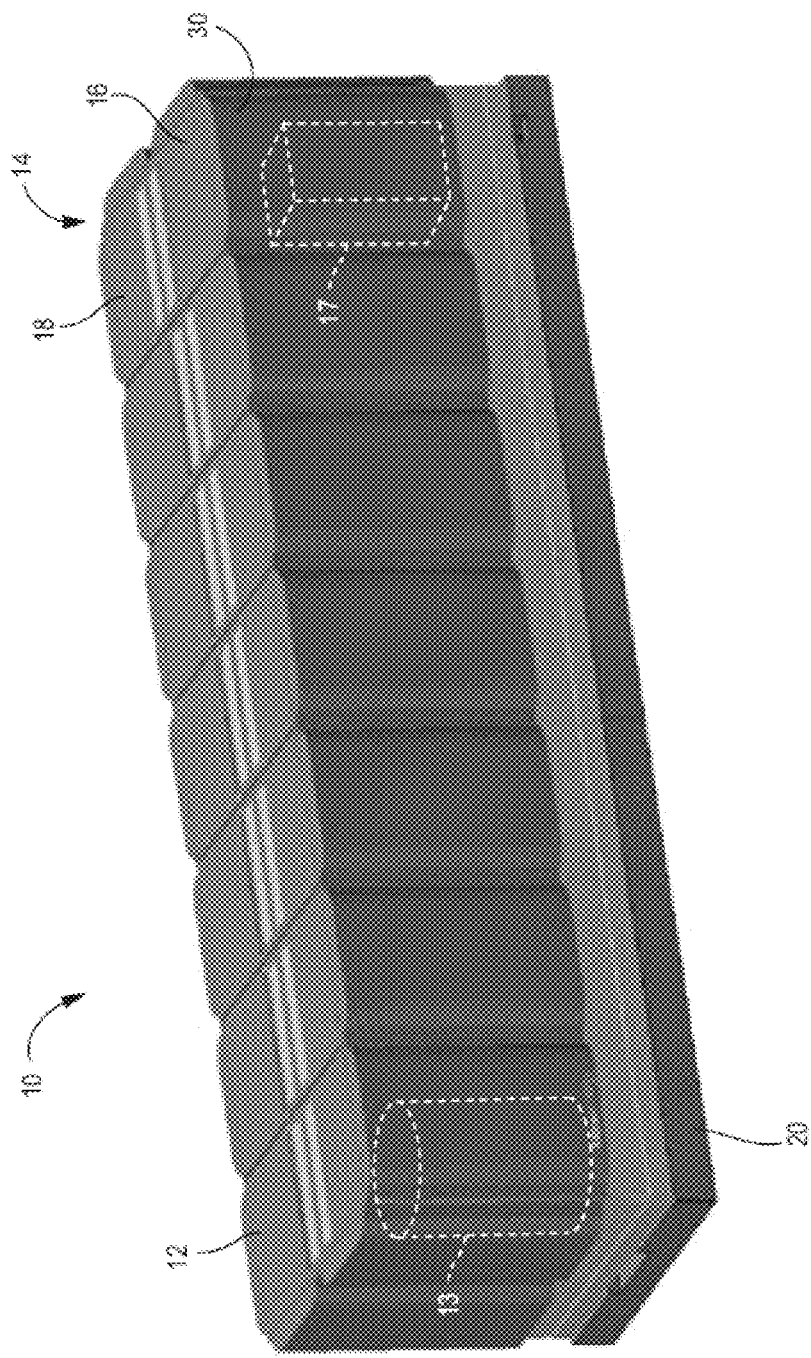
FIGS. 2A-2C are isometric views of a modular fuel cell system enclosures that may be used with the exemplary embodiments.
Figure 2C:
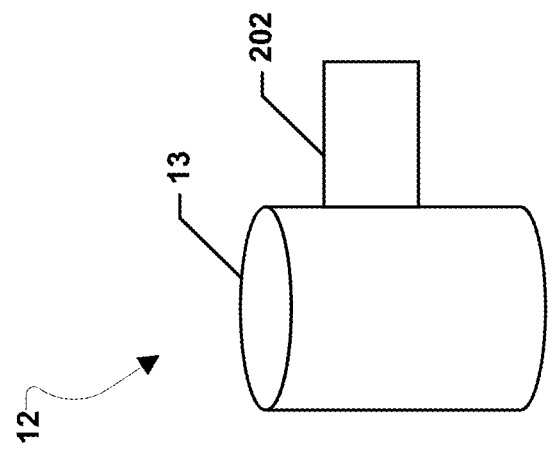
Figure 2B:
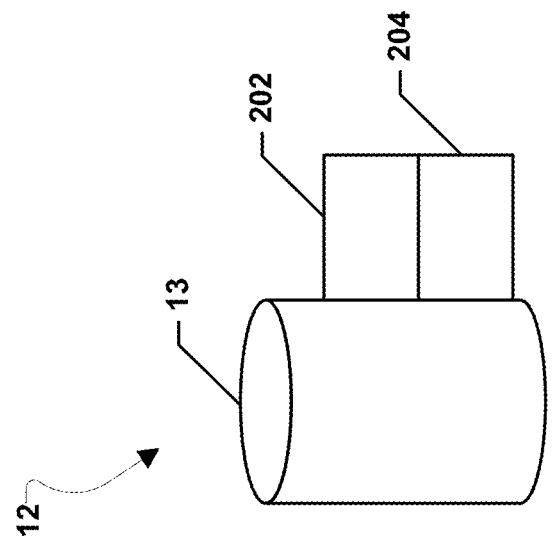

Referring to FIGS. 2a to 2c, a modular fuel cell system enclosure (i.e., fuel cell generator) 10 is shown according to an exemplary embodiment. The modular system may contain modules and components described above as well as in U.S. patent application Ser. No. 11/656,006, filed on Jan. 22, 2007, entitled "Modular Fuel Cell System" and incorporated herein by reference in its entirety, now published as U.S. Patent Application Publication US 2011/0281185. The modular design of the fuel cell system enclosure 10 provides flexible system installation and operation. Modules allow scaling of installed generating capacity, reliable generation of power, flexibility of fuel processing, and flexibility of power output voltages and frequencies with a single design set. The modular design results in an "always on" unit with very high availability and reliability. This design also provides an easy means of scale up and meets specific requirements of customer's installations. The modular design also allows the use of available fuels and required voltages and frequencies which may vary by customer and/or by geographic region. FIGS. 2a to 2c illustrates a preferred embodiment of a modular fuel cell system enclosure (i.e., fuel cell generator), however, other embodiment fuel cell generators may be used. Fuel cell generators comprising fuel cells, fuel inputs, and electrical outputs may have various physical configurations and orientations other than the preferred embodiment illustrated in FIGS. 2a to 2c. As an example, a fuel cell generator may be located on a mezzanine outside a building, and/or may span three vertical levels of a building to accommodate space constrained installations.

The modular fuel cell system enclosure (i.e., fuel cell power generator) 10 includes a plurality of power modules 12 (which are labeled 106 in FIGS. 1A-1C), one or more fuel input (i.e., fuel processing) modules 16, and one or more power conditioning (i.e., electrical output) modules 18 (which are labeled 104 and referred to as "IOM" in FIGS. 1A-1C). For example, the system enclosure may include any desired number of modules, such as 2-30 power modules, for example 6-12 power modules. FIG. 2a to 2c illustrates a system enclosure 10 containing six power modules 12 (one row of six modules stacked side to side), one fuel processing module 16, and one power conditioning module 18 on a common base 20. Each module 12, 16, 18 may comprise its own cabinet. Alternatively, as will be described in more detail below, modules 16 and 18 may be combined into a single input/output module 14 located in one cabinet. While one row of power modules 12 is shown, the system may comprise more than one row of modules 12. For example, the system may comprise two rows of power modules stacked back to back.

Each power module 12 is configured to house one or more hot boxes 13. Each hot box contains one or more stacks or columns of fuel cells (not shown for clarity), such as one or more stacks or columns of solid oxide fuel cells having a ceramic oxide electrolyte separated by conductive interconnect plates. Other fuel cell types, such as PEM, molten carbonate, phosphoric acid, etc. may also be used. In an embodiment illustrated in FIG. 2B, the internals of power module 12 may be provided without an external enclosure 10 or power conditioning module 18. The un-enclosed power module 12 may include the fuel cell hot box 13, auxiliary devices (e.g., blowers) 202 to provide reactant gases to the fuel cell hot box 13, and power electronics 204 to achieve the desired output voltage and waveform (such as DC/DC converters and/or DC/AC inverters). In a further embodiment illustrated in 2C, the power electronics 204 may be eliminated, and the un-enclosed power module 12 may include a fuel cell hot box 13 and auxiliary devices 202. In such an embodiment, the hot box 13 may be configured such that it is segmented to generate a voltage (e.g., 12 volts) appropriate for the IT load 102 (e.g., an IT power supply) to which it may be connected. In such an embodiment, the auxiliary devices 202 may be configured to use the same voltage as the IT load 102.

The fuel cell stacks may comprise externally and/or internally manifolded stacks. For example, the stacks may be internally manifolded for fuel and air with fuel and air risers extending through openings in the fuel cell layers and/or in the interconnect plates between the fuel cells.

Alternatively, the fuel cell stacks may be internally manifolded for fuel and externally manifolded for air, where only the fuel inlet and exhaust risers extend through openings in the fuel cell layers and/or in the interconnect plates between the fuel cells, as described in U.S. Pat. No. 7,713,649, which is incorporated herein by reference in its entirety. The fuel cells may have a cross flow (where air and fuel flow roughly perpendicular to each other on opposite sides of the electrolyte in each fuel cell), counter flow parallel (where air and fuel flow roughly parallel to each other but in opposite directions on opposite sides of the electrolyte in each fuel cell) or co-flow parallel (where air and fuel flow roughly parallel to each other in the same direction on opposite sides of the electrolyte in each fuel cell) configuration.

The modular fuel cell system enclosure 10 also contains one or more input or fuel processing modules 16. This module 16 includes a cabinet which contains the components used for pre-processing of fuel, such as desulfurizer beds. The fuel processing modules 16 may be designed to process different types of fuel. For example, a diesel fuel processing module, a natural gas fuel processing module, and an ethanol fuel processing module may be provided in the same or in separate cabinets. A different bed composition tailored for a particular fuel may be provided in each module. The processing module(s) 16 may processes at least one of the following fuels selected from natural gas provided from a pipeline, compressed natural gas, methane, propane, liquid petroleum gas, gasoline, diesel, home heating oil, kerosene, JP-5, JP-8, aviation fuel, hydrogen, ammonia, ethanol, methanol, syn-gas, bio-gas, bio-diesel and other suitable hydrocarbon or hydrogen containing fuels. If desired, a reformer 17 may be located in the fuel processing module 16. Alternatively, if it is desirable to thermally integrate the reformer 17 with the fuel cell stack(s), then a separate reformer 17 may be located in each hot box 13 in a respective power module 12. Furthermore, if internally reforming fuel cells are used, then an external reformer 17 may be omitted entirely.

The modular fuel cell system enclosure 10 also contains one or more power conditioning modules 18. The power conditioning module 18 includes a cabinet which contains the components for converting the fuel cell stack generated DC power to AC power (e.g., DC/DC and DC/AC converters described in U.S. Pat. No. 7,705,490, incorporated herein by reference in its entirety), electrical connectors for AC power output to the grid, circuits for managing electrical transients, a system controller (e.g., a computer or dedicated control logic device or circuit). The power conditioning module 18 may be designed to convert DC power from the fuel cell modules to different AC voltages and frequencies. Designs for 208V, 60 Hz; 480V, 60 Hz; 415V, 50 Hz and other common voltages and frequencies may be provided.

The fuel processing module 16 and the power conditioning module 18 may be housed in one input/output cabinet 14. If a single input/output cabinet 14 is provided, then modules 16 and 18 may be located vertically (e.g., power conditioning module 18 components above the fuel processing module 16 desulfurizer canisters/beds) or side by side in the cabinet 14. In an alternative embodiment, a single fuel processing module 16 and single power conditioning module 18 may be provided for groups of power modules 12 to include a single fuel processing module 16 and single power conditioning module 18 provided for all power modules 12 at an entire site, such as an entire data center or group of data centers.

As shown in one exemplary embodiment in FIGS. 2a to 2c, one input/output cabinet 14 is provided for one row of six power modules 12, which are arranged linearly side to side on one side of the input/output module 14. The row of modules may be positioned, for example, adjacent to a building for which the system provides power (e.g., with the backs of the cabinets of the modules facing the building wall). While one row of power modules 12 is shown, the system may comprise more than one row of modules 12. For example, as noted above, the system may comprise two rows of power modules stacked back to back.

The linear array of power modules 12 is readily scaled. For example, more or fewer power modules 12 may be provided depending on the power needs of the building or other facility serviced by the fuel cell system 10. The power modules 12 and input/output modules 14 may also be provided in other ratios. For example, in other exemplary embodiments, more or fewer power modules 12 may be provided adjacent to the input/output module 14. Further, the support functions could be served by more than one input/output module 14 (e.g., with a separate fuel processing module 16 and power conditioning module 18 cabinets). Additionally, while in the preferred embodiment, the input/output module 14 is at the end of the row of power modules 12, it could also be located in the center of a row power modules 12.

The modular fuel cell system enclosure 10 may be configured in a way to ease servicing of the system. All of the routinely or high serviced components (such as the consumable components) may be placed in a single module to reduce amount of time required for the service person. For example, the purge gas and desulfurizer material for a natural gas fueled system may be placed in a single module (e.g., a fuel processing module 16 or a combined input/output module 14 cabinet). This would be the only module cabinet accessed during routine maintenance. Thus, each module 12, 14, 16, and 18 may be serviced, repaired or removed from the system without opening the other module cabinets and without servicing, repairing or removing the other modules. In an embodiment the modular fuel cell system enclosure 10 may also include internal fuel storage. The internal fuel storage may provide additional run time for the various models in event of an external fuel supply interruption and/or maintenance.

For example, as described above, the enclosure 10 can include multiple power modules 12. When at least one power module 12 is taken off line (i.e., no power is generated by the stacks in the hot box 13 in the off line module 12), the remaining power modules 12, the fuel processing module 16 and the power conditioning module 18 (or the combined input/output module 14) are not taken off line. Furthermore, the fuel cell enclosure 10 may contain more than one of each type of module 12, 14, 16, or 18. When at least one module of a particular type is taken off line, the remaining modules of the same type are not taken off line.

Thus, in a system comprising a plurality of modules, each of the modules 12, 14, 16, or 18 may be electrically disconnected, removed from the fuel cell enclosure 10 and/or serviced or repaired without stopping an operation of the other modules in the system, allowing the fuel cell system to continue to generate electricity. The entire fuel cell system does not have to be shut down if one stack of fuel cells in one hot box 13 malfunctions or is taken off line for servicing. In an embodiment, a service module may be substituted for any disconnected module 12, 14, 16, or 18, to eliminate a loss of electrical generation capacity during servicing of a disconnected module 12, 14, 16, or 18. As an example, if a power module 12 is disconnected, a service module that functions as a power module may be connected in place of the disconnected power module 12 to keep electrical generation levels at full capacity. In another embodiment, temporary DC connections may enable additional temporary DC power to be supplied to the fuel cell generator from another power source (e.g., a DC generator, service company owned fuel cell, etc.) when a power module 12 is offline for service.

Each of the power modules 12 and input/output modules 14 include a door 30 (e.g., hatch, access panel, etc.) to allow the internal components of the module to be accessed (e.g., for maintenance, repair, replacement, etc.). According to an exemplary embodiment, the modules 12 and 14 are arranged in a linear array that has doors 30 only on one face of each cabinet, allowing a continuous row of systems to be installed abutted against each other at the ends. In this way, the size and capacity of the fuel cell enclosure 10 can be adjusted with additional modules 12 or 14 and bases 20 with minimal rearranging needed for existing modules 12 and 14 and bases 20. If desired, the door to module 14 may be on the side rather than on the front of the cabinet.

FIG. 3 illustrates an embodiment building structure 302 for a data center 300. In an embodiment, the building structure 302 may house one or more fuel cell generators coupled to one or more IT loads. The fuel cell generators may be configured to provide power to the one or more IT loads. As used herein a building structure may be a structure closed on all sides, or a building structure may be fully and/or partially open on one or more sides. While illustrated in the various embodiments as generally rectangular shaped building structures, any other shape of building structures may be used in the various embodiments, such as lean-to building structures, circular building structures, multi-faced trapezoidal building structures, etc. As used herein, housing a device, such as housing one or more fuel cell generators and/or IT loads, means to cover and/or protect, thus a building structure fully and/or partially open on one or more sides may house a device, such as one or more fuel cell generators and/or IT loads.

In an embodiment, electromagnetic pulse protection may be provided to the building structure 302, for example by an electromagnetic radiation shielding skin 304 forming the outside of the building structure 302. The electromagnetic radiation shielding skin 304 may shield components inside the building structure 302 from electromagnetic waves. The electromagnetic radiation shielding skin 304 may be coupled to its own independent ground 306. The ground 306 may be separate from the ground of any fuel cell generators housed within the building structure 302. Additionally, any fuel cell generators, IT loads, power supplies, and associated electronics may be fully isolated from ground. The electromagnetic radiation shielding skin 304 may be comprised of metal, such as iron, and may extend under the building structure 302 to create full shielding and isolation for the building structure 302. In an embodiment, the electromagnetic radiation shielding skin 304 may be a Faraday cage surrounding the building structure 302. Inlets, exhausts, and/or any access ways/openings into the building structure 302 may include attenuating materials on their surfaces to ensure the inlets, exhausts, and/or any access ways/openings do not act as waveguides and electromagnetic radiation does not propagate within the building structure 302 from the inlets, exhausts, and/or any access ways/openings. In an embodiment, the electromagnetic radiation shielding skin 304 may include metal mesh covering all openings in the electromagnetic radiation shielding skin 304. In an embodiment, the electromagnetic radiation shielding skin 304 may be configured such that the sides of the building structure are metal mesh and the bottom of the building is a solid metal surface. In an embodiment, the building structure 302 may be a data center and a data connection to the building structure 302 may be via a fiber optic line. Additionally, the fluid fuel stream (e.g., natural gas and/or liquid diesel) may be provided to the building structure 302. In such an embodiment, the inputs and/or outputs (e.g., fuel input, exhaust, data connections, etc.) from the building structure 302 may be made of dielectric materials which may not conduct an electromagnetic pulse into the building structure 302, thereby creating an electromagnetic pulse proof data center island.

Figure 4:
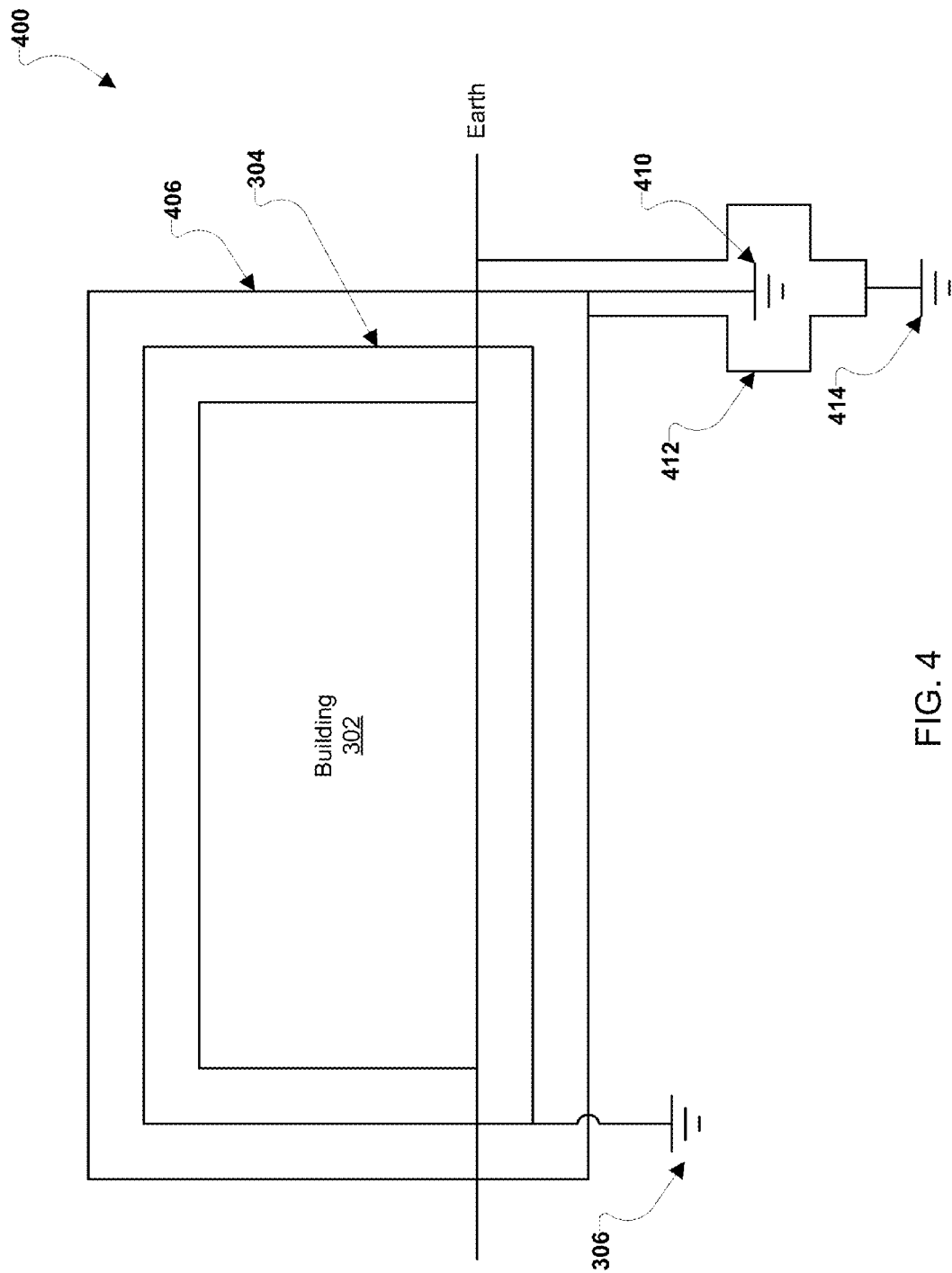
FIG. 4 illustrates another embodiment building structure.

FIG. 4 illustrates an embodiment building structure 302 for a data center 400. The data center 400 is similar to the data center 300 illustrated in FIG. 3 and contains a number of components in common. Those components which are common to both data centers 300 and 400 are numbered with the same numbers in FIGS. 3 and 4 and will not be described further.

One difference between data center 400 and 300 is that data center 400 includes an additional electromagnetic radiation shielding skin 406 surrounding the electromagnetic radiation shielding skin 304. In an embodiment, the second electromagnetic radiation shielding skin 406 may be comprised of metal, such as iron. The electromagnetic radiation shielding skin 304 and electromagnetic radiation shielding skin 406 may form alternating metal layers around the building structure 302. As discussed further below with reference to FIG. 10, in an embodiment, metal mesh may be placed between the electromagnetic radiation shielding skins 304, 406. In an embodiment, more than two electromagnetic radiation shielding skins may surround the building structure 302. In an embodiment the electromagnetic radiation shielding skin 406 may be grounded independently of the electromagnetic radiation shielding skin 304. In an embodiment, the ground 410 of the electromagnetic radiation shielding skin 406 may be buried in the earth within its own additional shielding 412 with its own ground 414. In this manner, an isolated ground vault may be created.

Figure 5A:
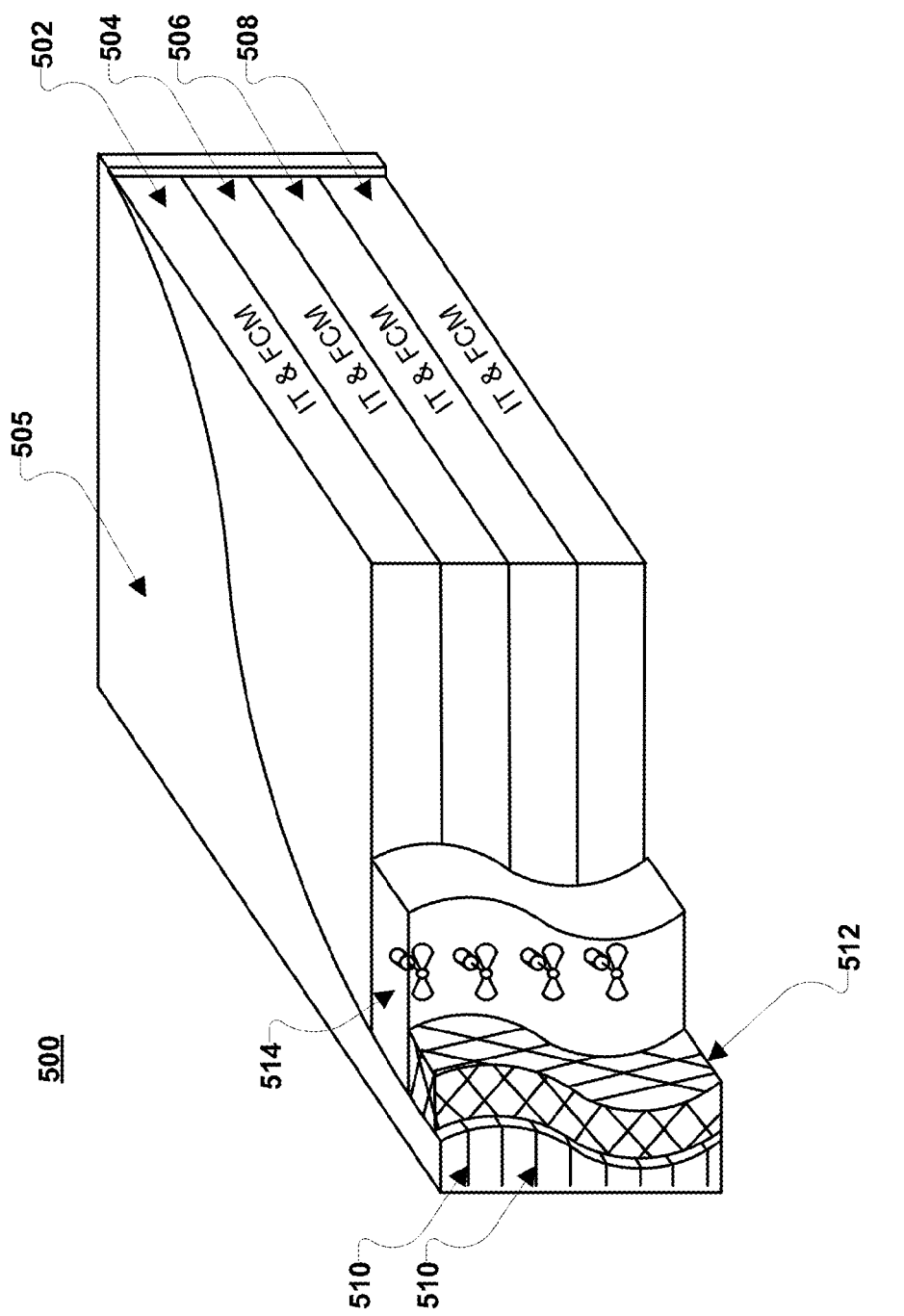
FIG. 5A is a cut-away perspective view of an embodiment data center.
Figure 5B:
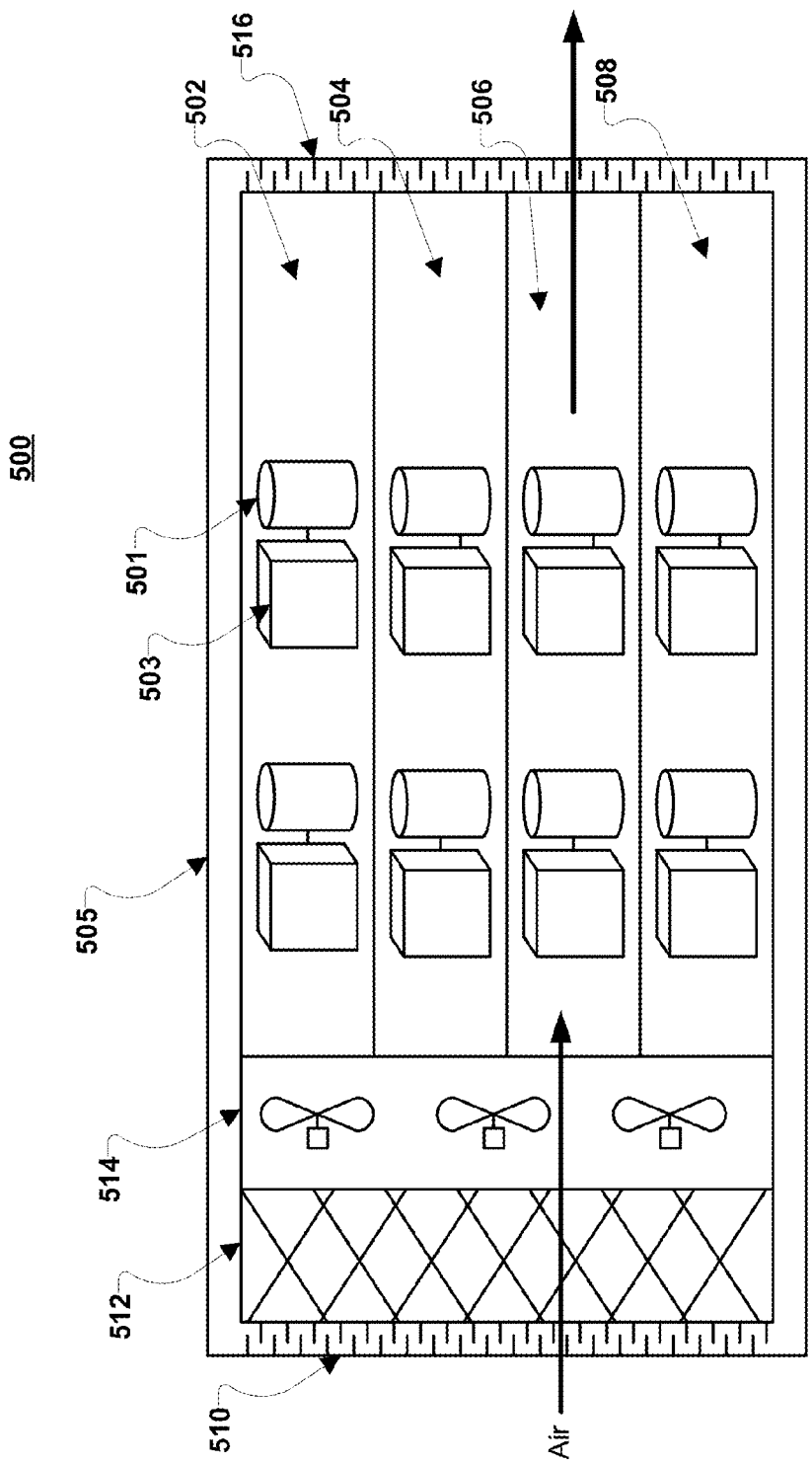
FIG. 5B is a cut-away side view of the embodiment data center illustrated in FIG. 5A.

FIGS. 5A and 5B illustrate a data center 500 according to an embodiment. FIG. 5A illustrates the data center 500 in a cut-away perspective view and FIG. 5B illustrates the data center 500 in a cut-away side view. The data center 500 may include a building structure 505 housing one or more fuel cell generators 501 and one or more IT loads 503. In an embodiment, the fuel cell generators 501 may any type fuel cell based DC generator, such as the modular fuel cell system 10 described above with reference to FIG. 2. In an alternative embodiment, the fuel cell generators 501 may be merely one or more hot boxes 13 in the power modules 12 described above with reference to FIG. 2 without the modules 14 and/or 16. The one or more fuel cell generators 501 may electrically be coupled to the one or more IT loads 503, and the one or more fuel cell generators 501 may be configured to provide power to the one or more IT loads 503, such as via a bus. In an embodiment, each fuel cell generator 501 may be configured to provide power to one IT load 503. In another embodiment, each fuel cell generator 501 may be configured to provide power to one or more IT loads 503, such as via one or more buses. As described further below, one or more buses may be included in the data center 500, and various embodiments of buses within the data center 500 may used to connect individual fuel cell generators 501 and IT loads 503, groups of fuel cell generators 501 and IT loads 503, and/or all fuel cell generators 501 and IT loads 503.

In data center 500, fuel cell generators 501 and IT loads 503 may be located on the same floors 502, 504, 506, and 508 of the building structure 505. In this manner, fuel cell generators 501 and IT loads 503 may be co-located. In an embodiment, each floor 502, 504, 506, and 508 of the building structure 505 may be isolated from other floors (i.e., the fuel cell generators 501 and the IT loads 503 may not share data, power, fuel, air, and/or process exhaust across floors 502, 504, 506, and 508). In another embodiment, floors 502, 504, 506, and 508 may be partially or fully interconnected (i.e., connections for fuel cell generators 501 and/or IT loads 503, such as power, fuel, air, process exhaust, and/or data connections, etc.) may be made between fuel cell generators 501 and/or IT loads 503 located on some or all of floors 502, 504, 506, and 508. While illustrated as including four floors, 502, 504, 506, and 508, the data center 500 may include less than four floors, such as one, two, or three floors, or may include more than four floors, such as five, ten, or twenty floors, etc.

As used herein, process exhaust may include exhaust from one or both of an IT load or a fuel cell generator. Process exhaust from a fuel cell generator may include hot box exhaust (e.g., Anode Tail Gas Oxidizer (ATO) exhaust), fuel cell generator cabinet ventilation exhaust, or both hot box exhaust and fuel cell generator cabinet ventilation exhaust. Process exhaust from an IT load may include air heated by IT load during IT load operation.

In an embodiment, the building structure 505 may be similar to building structure 302 described above with reference to FIGS. 3 and 4, and the skin(s) of the building structure 505 may be similar to the skin(s) discussed above with reference to FIGS. 3 and 4.

The data center 500 may include one or more air inlet conduits 510. In an embodiment, the air inlet conduits 510 may be low pressure air inlets. The air inlet conduits 510 may be configured to draw air into the data center 500. In an embodiment, the air inlet conduits 510 may be louvered inlets, as described further below with reference to FIG. 10. The louvers may be positioned such that air accelerates as it moves across the louvers and decelerates after passing the louvers. The acceleration and deceleration of the air entering the data center 500 may cause dirt to drop out of the air entering the data center 500. The louvers may also block rain and foreign objects from entering the data center 500. In an embodiment, the air inlet conduits 510 may be configured to provide air to the one or more fuel cell generators 501 and/or the one or more IT loads 503 within the data center 500. In an embodiment, separate air inlet conduits 510 may provide air to different floors 502, 504, 506, and 508 of the building structure 505. In another embodiment, air inlet conduits 510 may provide air to one or more of floors 502, 504, 506, 508. In a further embodiment, air inlet conduits 510 may be configured to provide air to individual fuel cell generators 501 and/or IT loads 503. In another embodiment, air inlet conduits 510 may be configured to provide air to one or more (e.g., group(s) of six) fuel cell generators 501 and/or IT loads 503.

An air filter 512 may be coupled to the air inlet conduits 510. The air filter 512 may be configured to filter air entering the building structure 505 and/or air circulated within the building structure 505. Air filter 512 may be a single air filter, such as a fibrous screen, or may be an air filtration system employing more than one air filter and/or air filtration method, such as fibrous screens, electrostatic filters, and/or bed filters. In an embodiment, a single air filter 512 may filter air for all air inlet conduits. In another embodiment, each air inlet conduit 510 to the building structure 505 may be coupled to its own air filter 512.

In an embodiment, the building structure 505 may include one or more fans 514. The fans 514 may be configured to draw air into the building structure 505 via the air inlet conduit 510 and/or circulate air within the buildings structure 505. Additionally, the fans may force air through the building structure 505 to exhaust air from the building structure 505 via one or more air exhaust conduits 516. In an embodiment, the fans 514 may be powered partially, or entirely, by connections to one or more fuel cell generators 501 housed within the building structure 505. Additionally, the fans 514 may be powered partially, or entirely, by connection to other power sources, such as a grid connection. The air exhaust conduits 516 may be configured to exhaust air from the building structure 505. In an embodiment, the air inlet conduits 510 may be louvered which may block rain and foreign objects from entering the data center 500. In an embodiment, the air exhaust conduits 516 may be configured to exhaust air and/or process exhaust from the one or more fuel cell generators 501 and/or the one or more IT loads 503 within the data center 500. In an embodiment, separate air exhaust conduits 516 may exhaust air and/or process gas from different floors 502, 504, 506, and 508 of the building structure 505. In another embodiment, air exhaust conduits 516 may exhaust air and/or process gas from one or more of floors 502, 504, 506, 508. In a further embodiment, air exhaust conduits 516 may be configured to exhaust air and/or process gas from individual fuel cell generators 501 and/or IT loads 503. In an embodiment, air exhaust conduits 516 may be configured to exhaust air and/or process gas from one or more fuel cell generators 501 and/or IT loads 503.

Figure 5C:
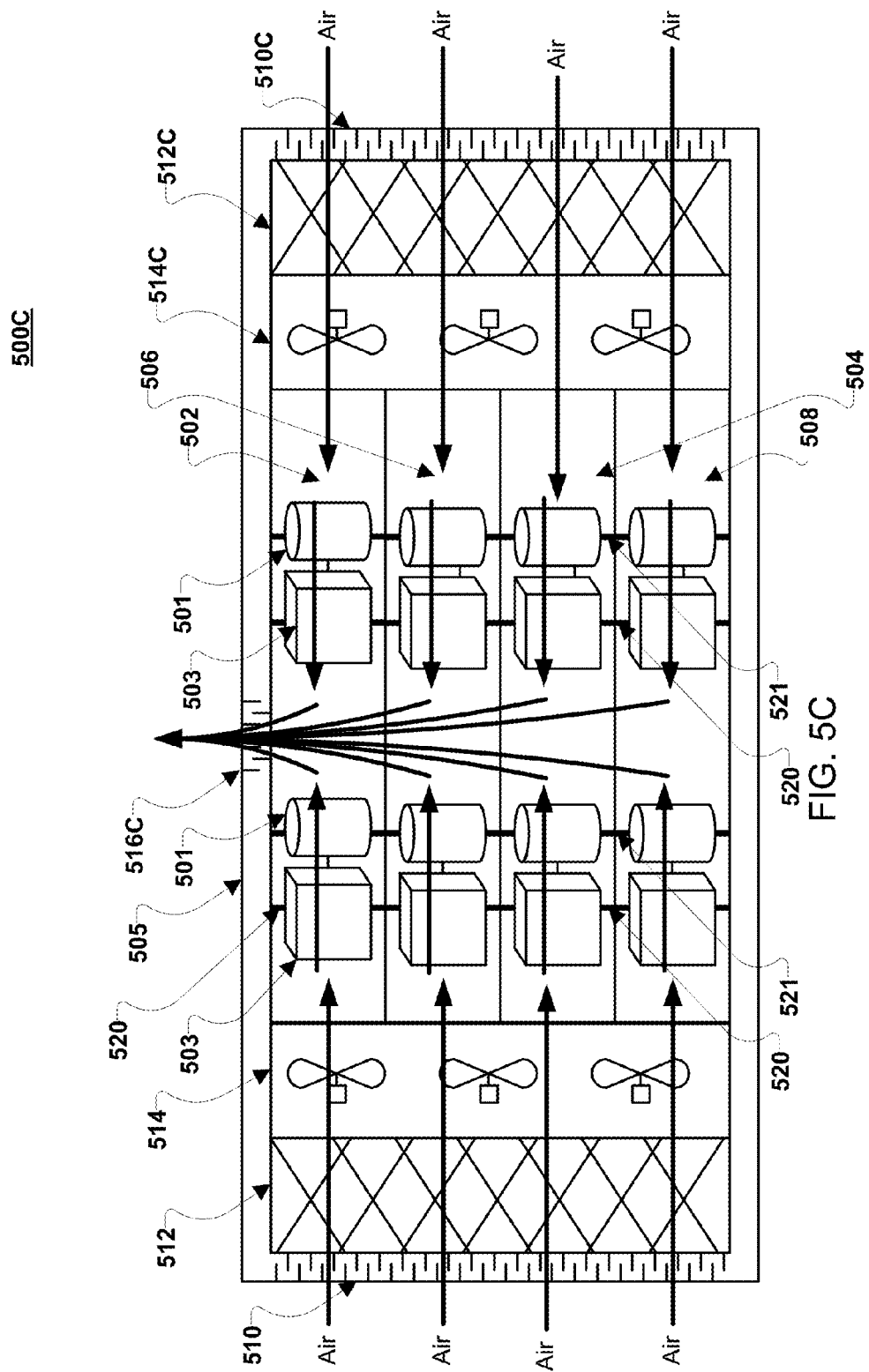
FIG. 5C is a cut-away side view of another embodiment data center.

FIG. 5C illustrates an embodiment data center 500C similar to data center 500 described above with reference to FIGS. 5A and 5B and contains a number of components in common. Those components which are common to both data centers 500 and 500C are numbered with the same numbers in FIGS. 5A, 5B, and 5C and will not be described further.

One difference between the data center 500C and 500 is that in data center 500C air may be drawn in on a second side of the building structure 505 through additional air inlet conduits 510C and additional filters 512C, by additional fans 514C. Rather than exhausted out the side of the building structure, air may be exhausted out the roof of the building structure via air exhaust conduits 516C which may be located on the roof, such as in the middle of the roof. In an embodiment, air may flow between each floor 502, 504, 506, and 508 to exit the building structure 505 via exhaust conduits 516C. In another embodiment, one or more conduits (e.g., ducting) may provide the air exhaust from each floor 502, 504, 506, and 508 to the exhaust conduits 516C without providing air from one floor to another floor.

In an optional embodiment, the building structure 505 may include optional walls 520, 521 configured such that cooling air flow may not be allowed to bypass the IT loads 503 and/or the fuel cell generators 501 and/or flow back from an exhaust side of the IT loads 503 and/or the fuel cell generators 501 to an inlet side of the IT loads 503 and/or fuel cell generators 501. The optional walls 520, 521 may be any type walls, such as a rigid barriers, flexible blockages, etc. While walls 520 and 521 are illustrated as single walls, walls 520 and/or 521 may be comprised of multiple walls. In an embodiment, both walls 520 and 521 may be provided. In another embodiment, either walls 520 or walls 521 may be provided. By providing the walls 520 and/or 521 a cold aisle at the inlet of each of the IT loads 503 and/or fuel cell generators 501 may be created and a hot aisle at the ventilation discharge side of the IT loads 503 and/or fuel cell generators 501 may be created. In an embodiment in which cooling air passes from IT loads 503 then to fuel cell generators 501, the walls 520 and/or 521 may separate a row of the IT loads 503 from a row of the fuel cell generators 501 such that the walls 520 and/or 521 may allow the cooling air to pass from the fans 514, through the row of IT loads 503 (e.g., through ventilation openings in the IT load cabinets) to the row of the fuel cell generators 501 and out the roof of the building structure 505, but substantially prevent the air from passing back from the row of fuel cell generators 501 back to the row of IT loads 503. In an embodiment in which cooling air passes from fuel cell generators 501 then to IT loads 503, the walls 520 and/or 521 may separate a row of the fuel cell generators 501 from a row of the IT loads 503 such that the walls 520 and/or 521 may allow the cooling air to pass from the fans 514C, through the row of fuel cell generators 501 to the row of the IT loads 503 and out the roof of the building structure 505, but substantially prevent the air from passing back from the row of IT loads 503 back to the row of fuel cell generators 501. In an embodiment, the positive pressure created by the movement of air through the IT loads 503 and/or the fuel cell generators 501, such as the pressure created by the fans 514, 514C may substantially prevent air from flowing back through the IT loads 503 and/or the fuel cell generators 501.

When fuel cell generators 501 and IT loads 503 are located on the same floors 502, 504, 506, and/or 508 of the data center 500, the fuel cell generators 501 and IT loads 503 may be arranged in any configuration. FIGS. 6A-6D illustrate various staggered IT load 503 and fuel cell generator 501 arrangements suitable for use in the various embodiments in which fuel cell generators 501 and IT loads 503 are located on the same floors 502, 504, 506, and/or 508 of the data center 500. FIGS. 7A-7E illustrate various back to back IT load 503 and fuel cell generator 501 arrangements suitable for use in the various embodiments in which fuel cell generators 501 and IT loads 503 are located on the same floors 502, 504, 506, and/or 508 of the data center 500. In FIGS. 6A-7E each fuel cell generator 501 may be paired with its own IT load 503 for physical placement purposes, however, each fuel cell generator 501 and/or IT load 503 may be connected to other fuel cell generators 501 and/or IT loads 503. For ease of description, only one floor 502 of the data center is illustrated in FIGS. 6A-7E. In an embodiment, fuel cell generators 501 and IT loads 503 on the floors 502, 504, 506, 508 of the data center may all be arranged in the same manner. In another embodiment, the fuel cell generators 501 and the IT loads 503 on one or more of floors 502, 504, 506, 508 may be laid out in different manners from each other. In an embodiment, the fuel cell generators 501 and the IT loads 503 housed in the building structure 505 may occupy more than 95% of the usable space within the building structure 505. Usable space may be floor space on the one or more floors 502, 504, 506, 508 not including structural elements of the building structure 505.

FIG. 6A illustrates an embodiment in which the fuel cell generators 501 and the IT loads 503 are located in a staggered arrangement on the same floor 502 of the building structure 505 of data center 500. In FIG. 6A the IT loads 503 are arranged along the sides of the building structure 505 running the length of the floor 502. The fuel cell generators 501 are located directly behind the IT loads 503. In this manner, the fuel cell generators 501 may form a row between the rows of IT loads 503. The fuel cell generators 501 may be offset from each other in a staggered arrangement.

FIG. 6B illustrates another embodiment in which the fuel cell generators 501 and the IT loads 503 are located in a staggered arrangement on the same floor 502 of the building structure 505 of data center 500. In FIG. 6B the IT loads 503 are arranged along the center of the floor 502 in a single row. The fuel cell generators 501 are located directly behind the IT loads 503 along the sides of the building structure 505 running the length of the floor 502. Starting from an end of the row of IT loads 503, each successive fuel cell generator 501 may be placed on an alternate side of the building structure 505. In this manner, the fuel cell generators 501 may form a two staggered rows along each side of the building structure 505 outside the row of IT loads 503.

Figure 6C:
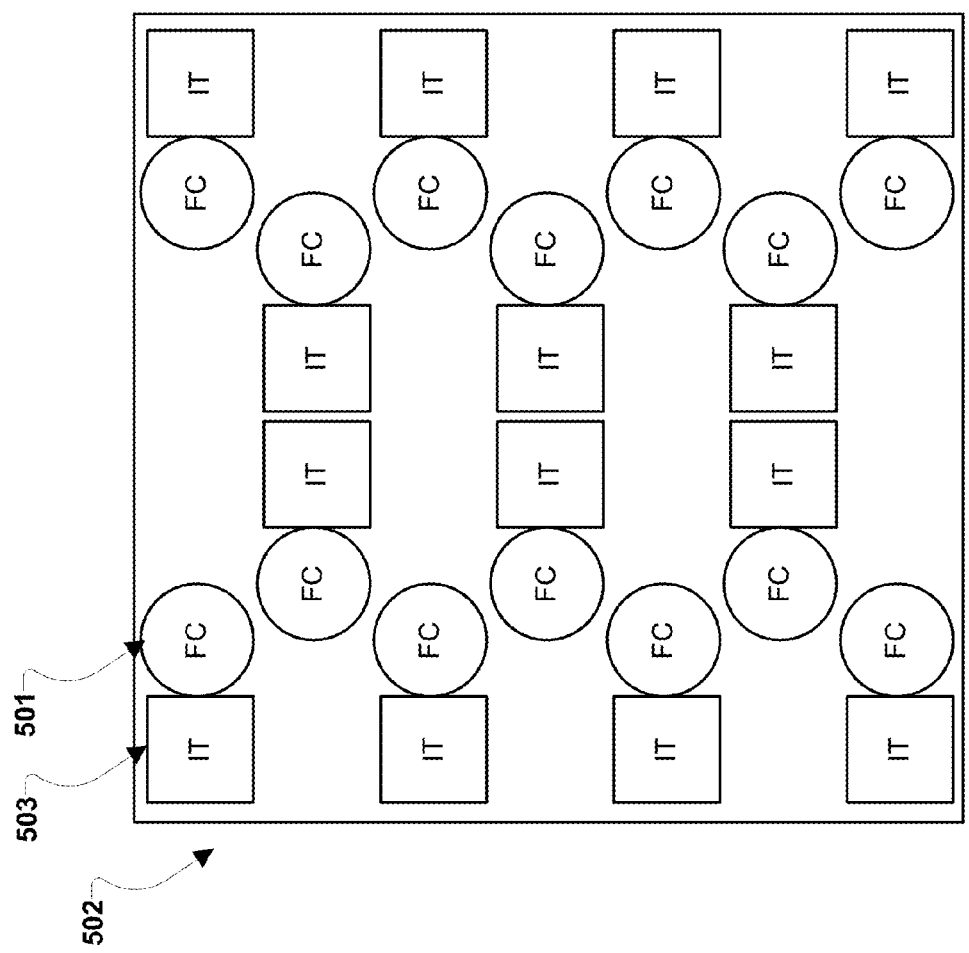

FIG. 6C illustrates an embodiment in which the fuel cell generators 501 and the IT loads 503 are located in a multiple row staggered arrangement on the same floor 502 of the building structure 505 of data center 500. In FIG. 6C, a first row (extending up-down in FIG. 6C) of IT loads 503 are arranged along a first side of the building structure 505 running the length of the floor 502. The fuel cell generators 501 are located directly behind the IT loads 503 in the first row. Additional fuel cell generators 501 are staggered with the fuel cell generators 501 located directly behind the IT loads 503 in the first row in a manner similar to that described above with reference to FIG. 6A. A second row of IT loads 503 is located directly behind the staggered additional fuel cell generators 501, and another set of IT loads 503 is located directly behind the second row of IT loads 503 to create a third row of IT loads 503. Another staggered row of fuel cell generators 501 is located behind the third row of IT loads 503, and a fourth row of IT loads 503 is located behind the additional staggered row of fuel cell generators 501. In this manner, multiple staggered rows of fuel cell generators 501 and multiple rows of IT loads may be located on the floor 502. While discussed in terms of two staggered rows of fuel cell generators 501 and four IT load 503 rows, additional staggered rows of fuel cell generators 501 and additional IT load 503 rows may be located on the floor 502 in a similar manner.

FIG. 6D illustrates another embodiment in which the fuel cell generators 501 and the IT loads 503 are located in a multiple row staggered arrangement on the same floor 502 of the building structure 505 of data center 500. In FIG. 6D the IT loads 503 are arranged along the center of the floor 502 in two rows. The fuel cell generators 501 are located directly behind the IT loads 503 along the sides IT load 503 rows running the length of the floor 502. Starting from an end of a first row of IT loads 503, each successive fuel cell generator 501 may be placed on an alternate side of the IT loads 503 in the first IT load 503 row. In this manner, the fuel cell generators 501 may form a two staggered rows along each side of the first IT load 503 row. The fuel cell generators 501 for the second row of IT loads 503 may be placed on alternating sides of the second row of IT loads 503, such that the fuel cells between the two IT load 503 rows are staggered to form a staggered row of fuel cell generators 501 in a manner similar to that described above with reference to FIG. 6A. While discussed in terms of two IT load 503 rows and one row of staggered fuel cell generators 501, additional staggered rows of fuel cell generators 501 and additional IT load 503 rows may be located on the floor 502 in a similar manner.

FIG. 7A illustrates an embodiment in which the fuel cell generators 501 and the IT loads 503 are located in a back to back arrangement on the same floor 502 of the building structure 505 of data center 500. In FIG. 7A, the IT loads 503 are arranged along a first side of the building structure 505 running the length of the floor 502. A first set of fuel cell generators 501 are located directly behind the IT loads 503. A second set of fuel cell generators 501 is located directly behind the first set of fuel cell generators 501. A second row of IT loads 503 is located directly behind the second set of fuel cell generators 501. In this manner, the fuel cell generators 501 and the IT loads 503 may be located in a back to back arrangement (i.e., forming alternating rows of IT loads 503 and fuel cell generators 501, and columns having both IT loads 503 and fuel cell generators 501).

FIG. 7B illustrates another embodiment in which the fuel cell generators 501 and the IT loads 503 are located in a back to back arrangement on the same floor 502 of the building structure 505 of data center 500. In FIG. 7B, the fuel cell generators 501 are arranged along a first side of the building structure 505 running the length of the floor 502. A first set of IT loads 503 are located directly behind the fuel cell generators 501. A second set of IT loads 503 is located directly behind the first set of IT loads 503. A second row of fuel cell generators 501 is located directly behind the second set of IT loads 503. In this manner, the fuel cell generators 501 and the IT loads 503 may be located in a back to back arrangement.

FIG. 7C illustrates an embodiment in which the fuel cell generators 501 and the IT loads 503 are located in a multiple row back to back arrangement on the same floor 502 of the building structure 505 of data center 500. The embodiment illustrated in FIG. 7C is similar to the embodiment illustrated in FIG. 7A, except additional sets of IT loads 503 and fuel cell generators 501 are successively located behind the second row of IT loads 503. In this manner, additional rows of IT loads 503 and fuel cell generators 501 may be located on floor 502 in a multiple row back to back arrangement. While illustrated in FIG. 7C as four rows of IT loads 503 and fuel cell generators 501, additional back to back rows of fuel cell generators 501 and additional IT load 503 rows may be located on the floor 502 in a similar manner.

FIG. 7D illustrates another embodiment in which the fuel cell generators 501 and the IT loads 503 are located in a multiple row back to back arrangement on the same floor 502 of the building structure 505 of data center 500. The embodiment illustrated in FIG. 7D is similar to the embodiment illustrated in FIG. 7B, except additional sets of fuel cell generators 501 and IT loads 503 are successively located behind the second row of fuel cell generators 501. In this manner, additional rows of fuel cell generators 501 and IT loads 503 may be located on floor 502 in a multiple row back to back arrangement. While illustrated in FIG. 7D as four rows of fuel cell generators 501 and IT loads 503, additional back to back rows of IT loads 503 and fuel cell generator 501 rows may be located on the floor 502 in a similar manner.

Figure 7E:
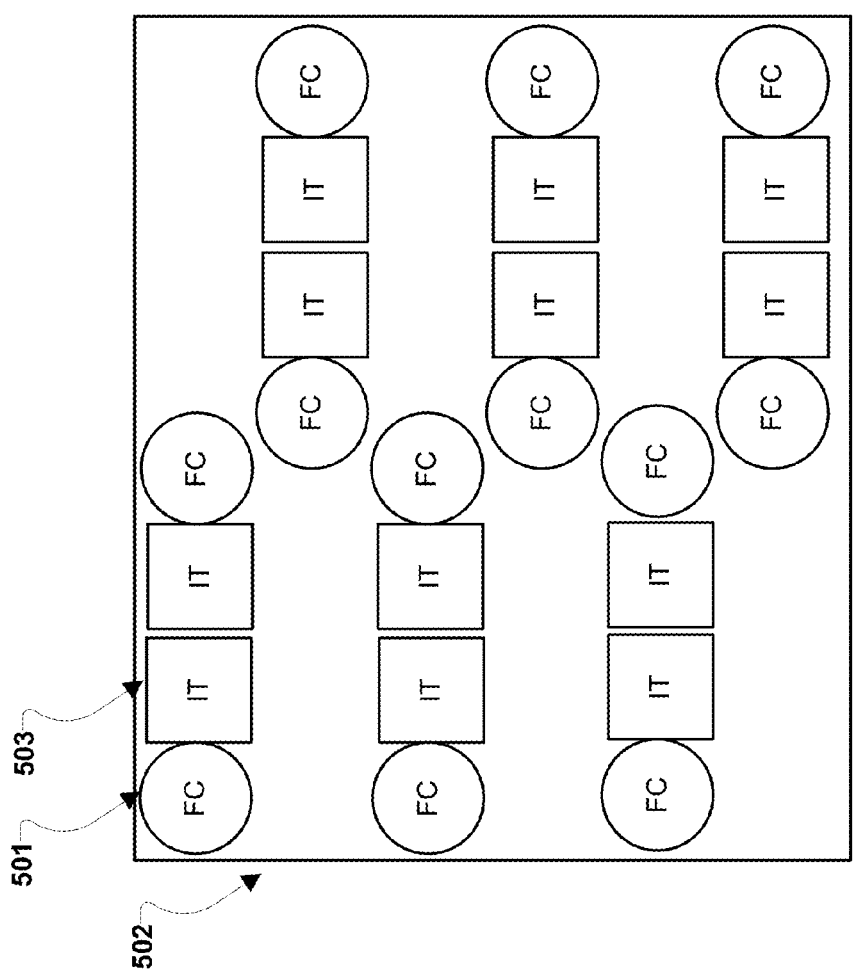

FIG. 7E illustrates an embodiment in which back to back rows of fuel cell generators 501 and IT loads 503 may be located in a staggered arrangement (i.e., in staggered columns). In a manner similar to that discussed above with reference to FIG. 6A, a center staggered row of fuel cell generators 501 may have IT loads 503 located directly behind them creating two rows of IT loads 503 outside the staggered fuel cell generators 501. Each of these rows of IT loads 503 may have another set of IT loads 503 located directly behind them and a row of fuel cell generators 501 located directly behind the another set of IT loads 503. In this manner, rows of IT loads 503 and fuel cell generators 501 may be located in both staggered and back to back arrangements on the same floor 502.

Figure 8A:
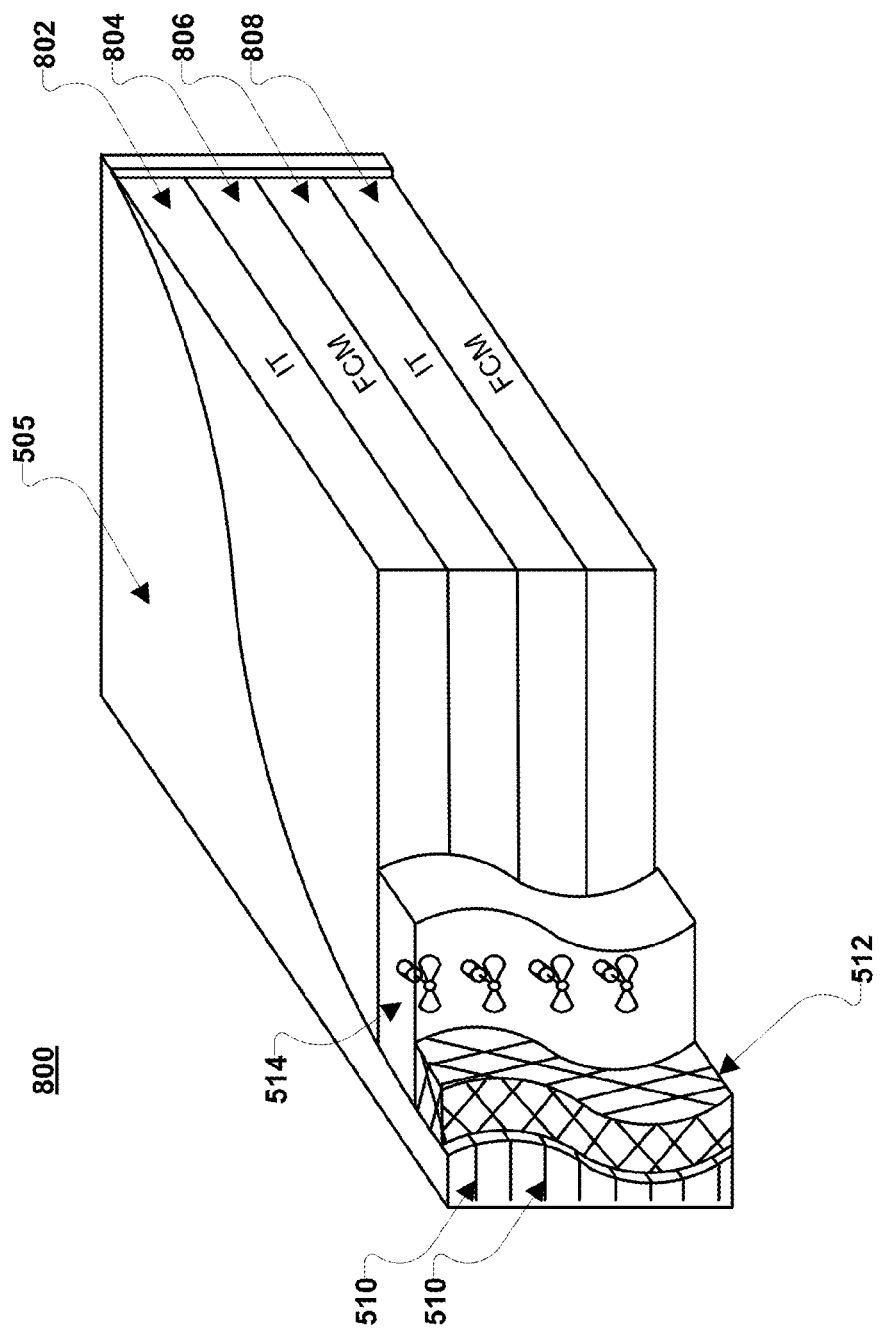
FIG. 8A is a cut-away perspective view of another embodiment data center.
Figure 8B:
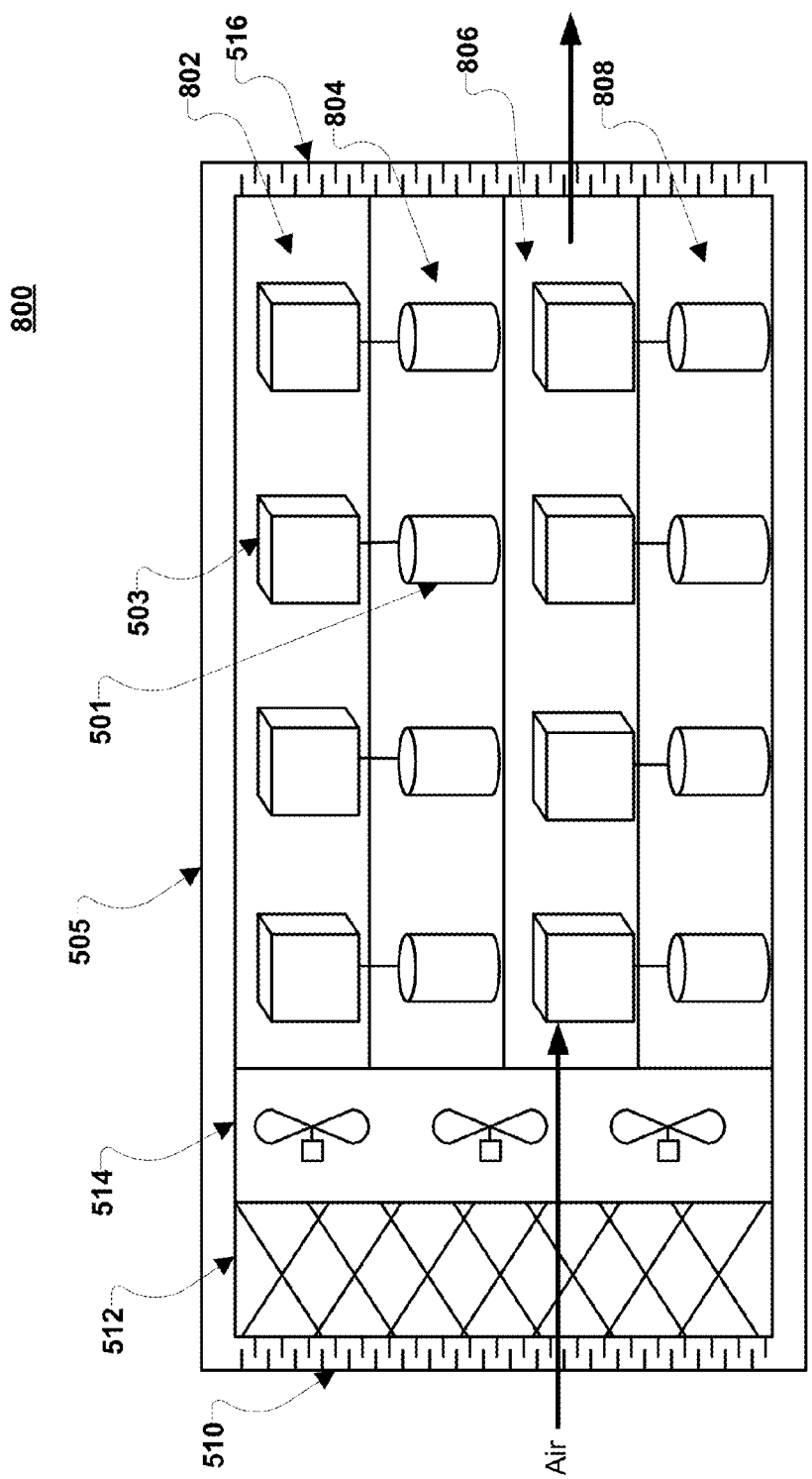
FIG. 8B is a cut-away side view of the embodiment data center illustrated in FIG. 8A.

FIGS. 8A and 8B illustrate an embodiment data center 800 similar to data center 500 described above with reference to FIGS. 5A and 5B and contains a number of components in common. Those components which are common to both data centers 500 and 800 are numbered with the same numbers in FIGS. 5A, 5B, 8A, and 8B and will not be described further. One difference between the data center 800 and 500 is that in data center 800 fuel cell generators 501 and IT loads 503 may be located on different floors 802, 804, 806, and 808 of the building structure 505. As an example, fuel cell generators 501 may be located on the first floor 808 and the third floor 804, while IT loads 503 may be located on the second floor 806 and the fourth floor 802. In a preferred embodiment, fuel cell generators 501 and IT loads 503 may be located on adjacent floors. In another embodiment, the fuel cell generators 501 and IT loads 503 may not all be adjacent, such as IT loads 503 on floors 802 and 804 and fuel cell generators 501 on floors 806 and 808. While illustrated as including four floors, 802, 804, 806, and 808, the data center 800 may include less than four floors, such as one, two, or three floors, or may include more than four floors, such as five, ten, or twenty floors, etc. While illustrated as including equal numbers of IT load floors 802, 806 and fuel cell generator floors 804, 808, the ratio of IT load floors to fuel cell power generator floors need not be equal. As an example, the building structure may include one floor of fuel cell power generators and five floors of IT loads. In an embodiment, the fuel cell generators 501 and the IT loads 503 housed in the building structure 505 may occupy more than 95% of the usable space within the building structure 505. Usable space may be floor space on the one or more floors 802, 804, 806, 808 not including structural elements of the building structure 505.

In an embodiment, each IT load floor 802, 806 may be isolated from each other (i.e., no data, power, fuel, air, and/or process exhaust shared by IT loads 503 across floors 802 and 806). In an embodiment, each fuel cell generator floor 804, 808 may be isolated from each other (i.e., no data, power, fuel, air, and/or process exhaust shared by fuel cell generators 501 across floors 804 and 808). In an embodiment, IT load floors 802 and 806 may be isolated from each other, while fuel cell generator floors 804 and 808 may be partially or fully interconnected (i.e., connections for fuel cell generators 501 and/or IT loads 503, such as power, fuel, air, process exhaust, and/or data connections, etc.) with each other and/or the IT load floors 802, 806. In an embodiment, fuel cell generator floors 804 and 808 may be isolated from each other, while the IT load floors 802 and 806 may be partially or fully interconnected with each other and/or the fuel cell generator floors 804, 808. In an embodiment, all floors 802, 804, 806, and 808 may be fully or partially interconnected.

Figure 9:
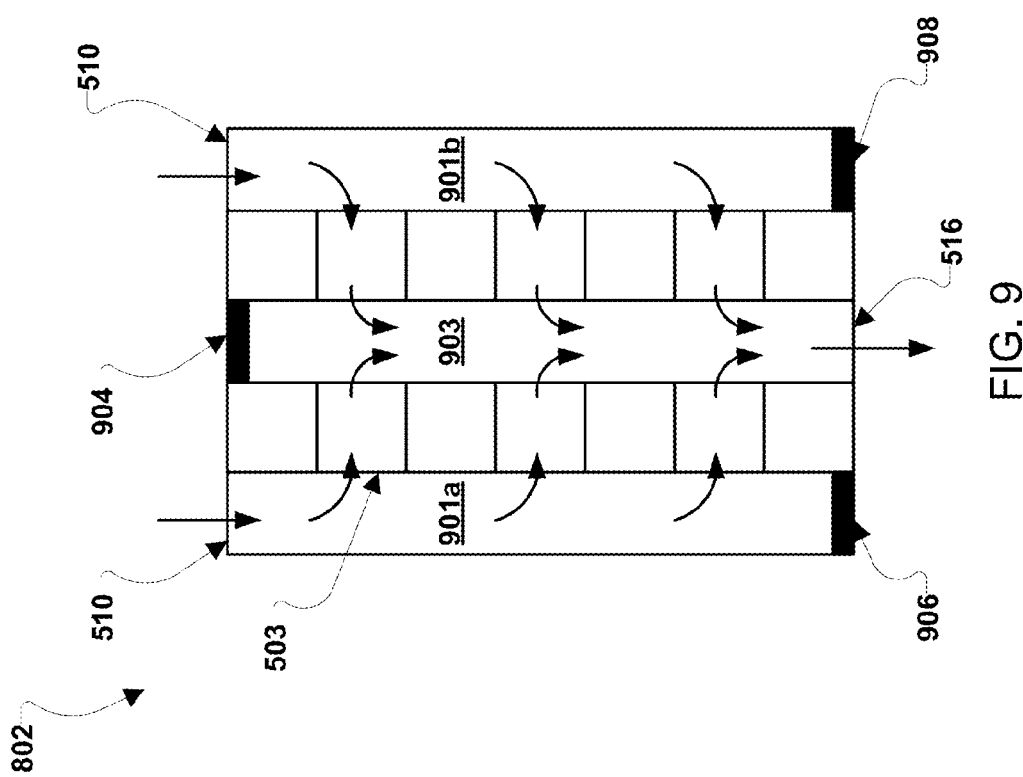
FIG. 9 is a top view of an IT load floor according to an embodiment.

In an embodiment, the fuel cell generators 501 may be located on the fuel cell generator floors 804, 808 and the IT loads 503 may be located on the IT load floors 802, 806 in any manner, such as arranged in rows separated by an aisle. In an embodiment illustrated in FIG. 9, the IT loads 503 may be arranged in rows to form aisles 901a, 901b, and 903 between the rows of the IT loads 503 on an IT load floor 802. Aisles 901a and 901b may be intake aisles, configured to receive air from an air inlet conduit 510. The ends of the intake aisles 901a and 901b opposite the air inlet conduit 510 may include air stops 906 and 908, respectively, ensuring the intake aisles 901a and 901b have no outlet to the air exhaust conduit 516. Aisle 903 may be an outlet aisle, configured to exhaust air to the air exhaust conduit 516. The end of the outlet aisle 903 opposite the air exhaust conduit 516 may include an air stop 904 ensuring the outlet aisle 903 does not have an inlet from the air inlet conduit 510. In this manner, consecutive aisles 901a, 903, and 901b may be alternately intake and outlet aisles. The building structure 505 may configured such that air passes from the air inlet conduit 510, down the intake aisles 901a, 901b, across the IT loads 503, down the outlet aisle 903, out the air exhaust conduit 516, and out of the building structure 505. In an embodiment, fans 514 may operate to move air down the intake aisles 901a, 901b, across the IT loads 503, down the outlet aisle 903, and out the air exhaust conduit 516.

In an embodiment, access to the IT load floors 802, 806 may be controlled by a different security protocol than access to the fuel cell generator floors 804, 808. As an example, different keys, security numbers, badges, doors, etc., may control access to the IT load floors 802, 806 and the fuel cell generator floors 804, 808. In this manner, personnel with authorization to access one type of floor may not be able to access the other type of floor. In a further embodiment, a security violation on the fuel cell generator floors 804, 808, and/or the IT load floors 802, 806, may results in a pre-programmed response. Pre-programmed response may include, security team paging, data wiping, write-out of master boot sectors, local electromagnetic pulse trigger, server shutdown, or power shutdown.

Figure 10:
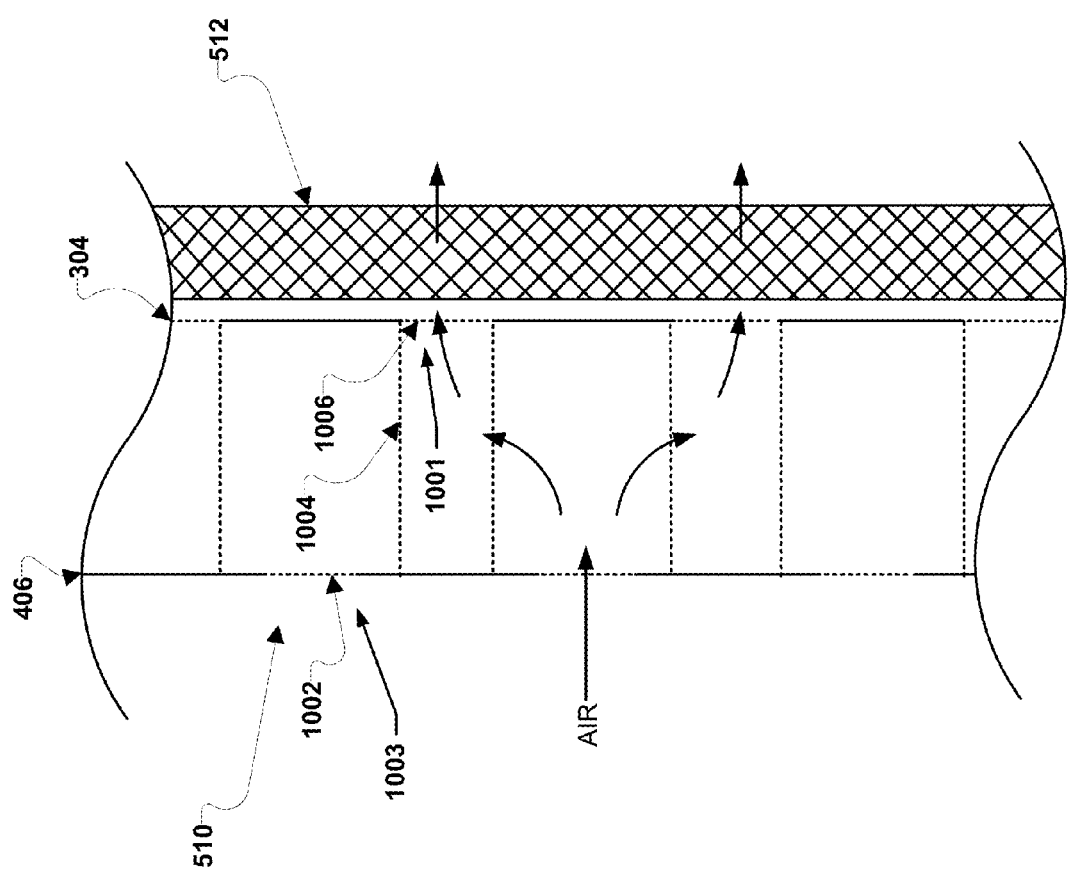
FIG. 10 is cut-away view of an embodiment building structure.

FIG. 10 illustrates a cut-away view of a portion of an embodiment building structure skins 304, 406, and filter 512 in a data center, such as data center 500 and/or 800 discussed above. FIG. 10 illustrates that the first electromagnetic radiation shielding skin 304 may include openings 1001 forming the air inlet 510. The openings 1001 may each be covered by at least one metal mesh 1006 placed over the opening. The second electromagnetic radiation shielding skin 406 may include openings 1003 forming the air inlet 510 as well. In an embodiment, the offset of the openings 1001 in the first electromagnetic radiation shielding skin 304 and the openings 1003 in the second electromagnetic radiation shielding skin 406 may create louvers forming the air inlet 510. In an embodiment, the openings 1003 in the second electromagnetic radiation shielding skin 406 may be covered by at least one metal mesh 1002 placed over the opening. In an embodiment, a metal mesh 1004 may be placed between the first electromagnetic radiation shielding skin 304 and the second electromagnetic radiation shielding skin 406. In an embodiment, the metal mesh 1004 may extend between the first electromagnetic radiation shielding skin 304 and the second electromagnetic radiation shielding skin 406 perpendicular to the direction the metal meshes 1004 and 1006 extend. Air inlet 510 may be formed in the shape of a louvered conduit from opening 1003, through metal mesh 1004, and to opening 1001. In this manner, air may flow through the metal mesh coverings 1002, 1004, and 1006 in the air inlet conduit 510 and from the air inlet conduit 510 to the filter 512, but the metal mesh coverings may attenuate any electromagnetic waves entering the air inlet conduit 510.

Figure 11:
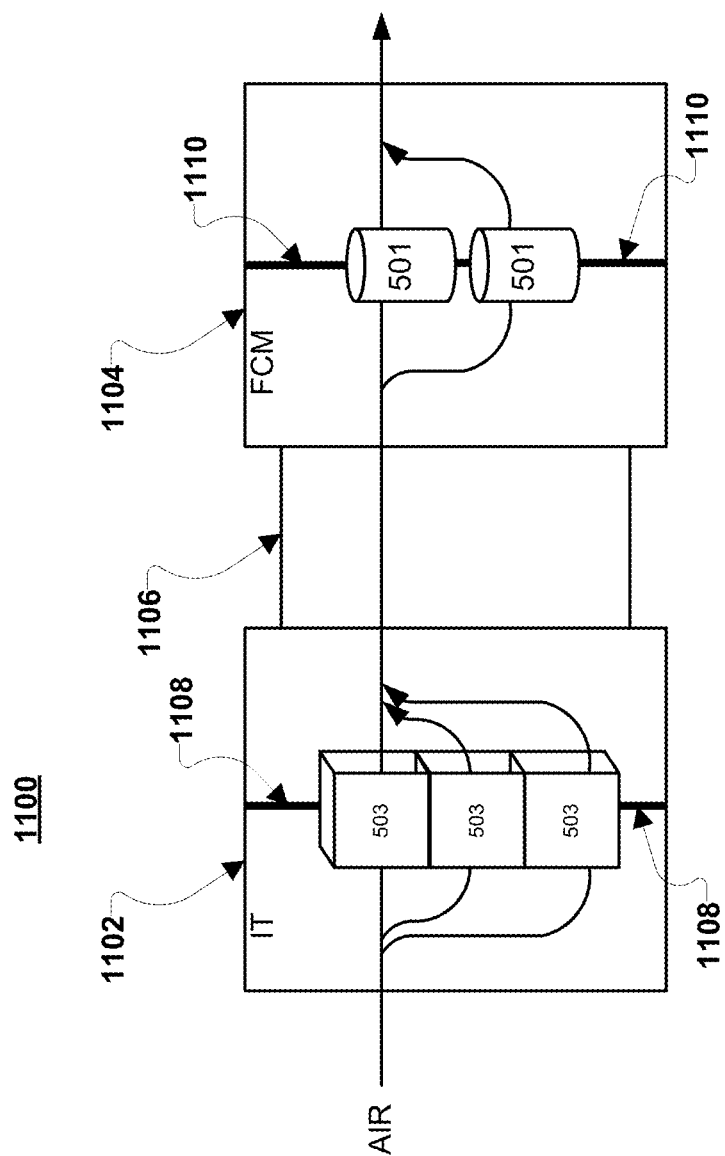
FIG. 11 illustrates a portion of an embodiment building structure.

FIG. 11 illustrates an embodiment building structure 1100 suitable for use in the various embodiment data centers. Building structure 1100 comprises two separate building portions 1102 and 1104 connected together by a connection structure 1106. In an embodiment, the first building portion 1102 may house one or more IT loads 503 and the second building portion 1104 may house one or more fuel cell generators 501 configured to provide power to the one or more IT loads 503. In an embodiment, the building structure 1100 may be configured such that air passes from the first building portion 1102 to the second building portion 1104 via the connection structure 1106. In an embodiment, the building structure 1100 may be configured, such as with cooling devices, to maintain the air temperature in the connection structure between 50 and 70 degrees Celsius. In this manner, air used to cool the IT loads 503 in the first building portion 1102 may be drawn through the connection structure 1106 and used to cool the fuel cell generators 501 in the second building portion 1104, and/or used as an air inlet stream for the fuel cell generators 501. Thus, the IT loads 503 may act as a pre-heater for the air inlet stream of the fuel cell generators 501, and less pre-heating of the air inlet stream for the fuel cell generators 501 may be required when compared with using room temperature air in the air inlet stream.

In an optional embodiment, the building structure 1100 may include optional walls 1108 and/or 1110 configured such that cooling air flow may not be allowed to bypass the IT loads 503 and/or the fuel cell generators 501 and/or flow back from an exhaust side of the IT loads 503 and/or the fuel cell generators 501 to an inlet side of the IT loads 503 and/or fuel cell generators 501. The optional walls 1108, 1110 may be any type walls, such as a rigid barriers, flexible blockages, etc. While walls 1108 and 1110 are illustrated as single walls, walls 1108 and/or 1110 may be comprised of multiple walls. In an embodiment, both walls 1108 and 1110 may be provided. In another embodiment, either walls 1108 or walls 1110 may be provided. By providing the walls 1108 and/or 1110 a cold aisle at the inlet of each of the IT loads 503 and/or fuel cell generators 501 may be created and a hot aisle at the ventilation discharge side of the IT loads 503 and/or fuel cell generators 501 may be created. In an embodiment in which cooling air passes from IT loads 503 then to fuel cell generators 501, the walls 1108 and/or 1110 may separate a row of the IT loads 503 from a row of the fuel cell generators 501 such that the walls 1108 and/or 1110 may allow the cooling air to pass through the row of IT loads 503 to the row of the fuel cell generators 501, but substantially prevent the air from passing back from the row of fuel cell generators 501 back to the row of IT loads 503.

Figure 12:
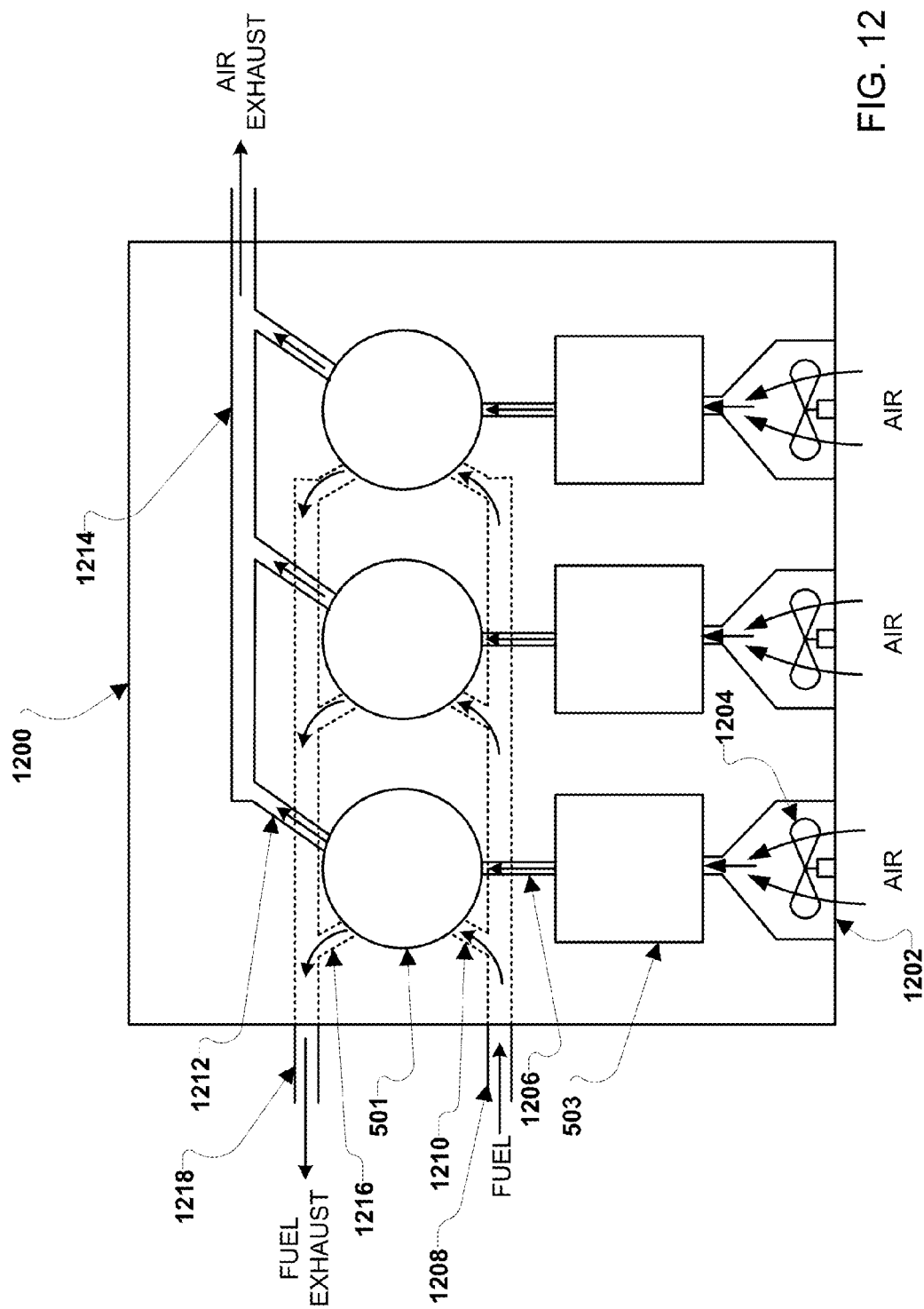
FIG. 12 illustrates a floor of a data center according to an embodiment.

FIG. 12 illustrates a floor 1200 of a data center according to an embodiment. The floor 1200 may be similar to floors 502, 504, 506, and 508 described above with reference to FIGS. 5A and 5B in that fuel cell generators 501 may be located on the same floor 1200 as IT loads 503.

In an embodiment, fans 1204 may be placed along a length of the floor 1200, paralleling rows of fuel cell generators 501 and IT loads 503. Air may be drawn into the floor 1200 (and optionally the building structure of the data center) via air inlet conduits 1202 on a first side of the floor 1200 and funneled through the IT loads 503. An IT load exhaust conduit 1206 may couple each IT load 503 to each fuel cell generator 501, and air exhausted (i.e., IT load cooling air exhaust) from the IT loads 503 may be provided to each fuel cell generator 501, respectively, via the IT load exhaust conduit 1206. In an embodiment, the air exhausted from the IT loads 503 may be provided to a cathode side of the fuel cell(s) within the fuel cell generators 501. The exhaust outlet of the cathode of the fuel cell(s) within the fuel cell generators 501 may be coupled to a cathode exhaust conduit 1212. The cathode exhaust conduits 1212 may be coupled to an air exhaust conduit 1214. The air exhaust conduit 1214 may exhaust air out a side of the floor 1200 and/or building structure of the data center different from the side of the floor 1200 and/or building structure from which the air inlet conduits 1202 draw air. A pipeline 1208 to a side of the floor 1200 (and optionally the building structure of the data center) may provide fuel to the fuel cell generators 501 via fuel inlet conduits 1210 coupled between each fuel cell generator 501 and the fuel pipeline 1208. An anode (i.e., fuel) exhaust conduit 1216 may be coupled to an anode exhaust outlet of the fuel cell(s) within the fuel cell generators 501 and coupled to a process exhaust conduit 1218. Anode exhaust from the fuel cell(s) within the fuel cell generators 501 may be exhausted to the process exhaust conduit 1218 via the anode exhaust conduit 1216. The process exhaust conduit 1218 may exhaust process exhaust out a side of the floor 1200 and/or building structure of the data center different from the side of the floor 1200 and/or building structure from which the air inlet conduits 1202 draw air and different from the side of the floor 1200 and/or building structure of the data center from which the air exhaust conduit 1214 exhausts air.

Figure 13:
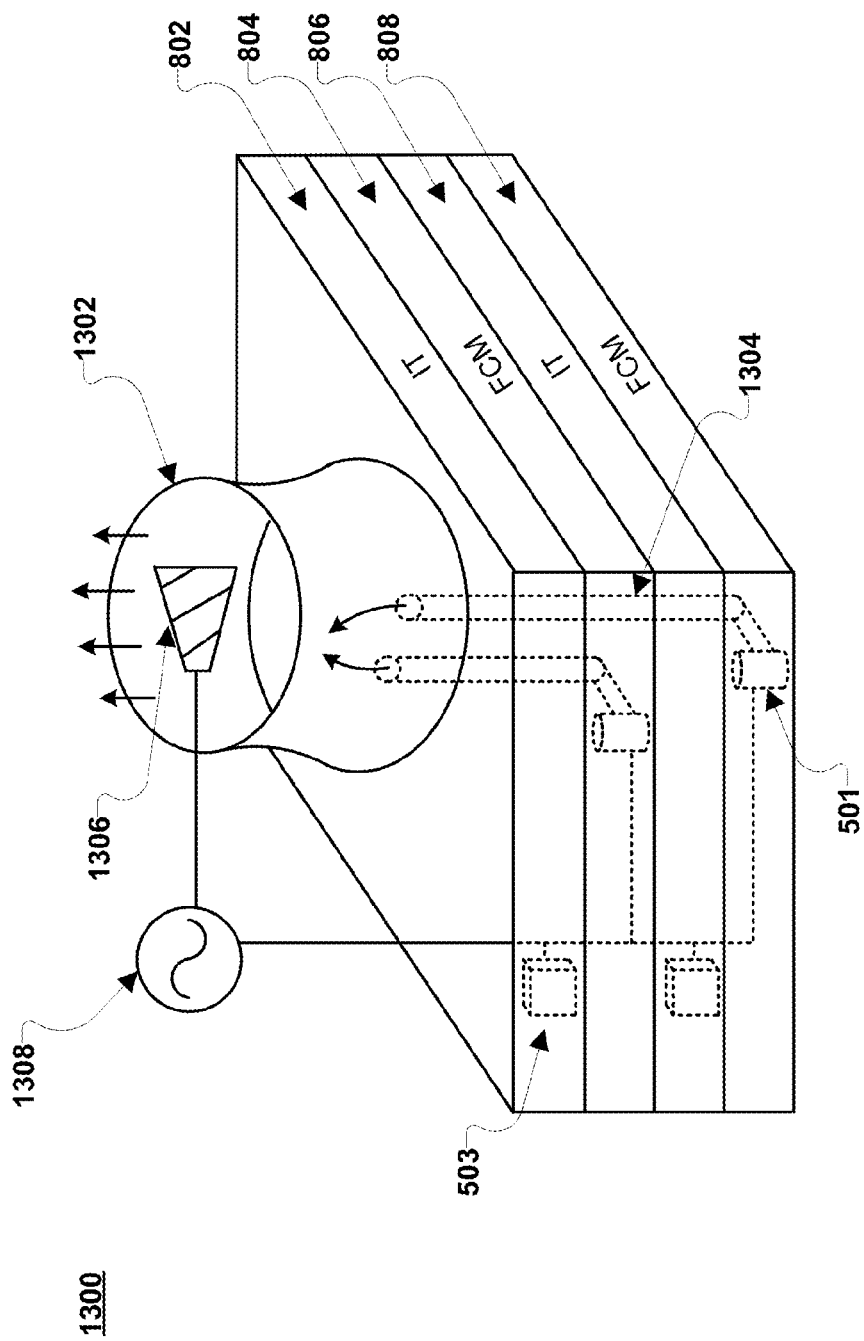
FIG. 13-16 are perspective views of data centers according to the various embodiments.

FIG. 13 is a perspective view of an embodiment data center 1300 similar to data center 800 described above with reference to FIGS. 8A and 8B and contains a number of components in common. Those components which are common to both data centers 800 and 1300 are numbered with the same numbers in FIGS. 8A, 8B, and 13 and will not be described further.

One difference between the data center 1300 and 800 is that data center 1300 may include a cooling tower 1302 configured to convert the enthalpy of the process exhaust to work energy and a power device 1308 to convert the work energy to power for the IT loads 503. The cooling tower 1302 may receive process exhaust (e.g., fuel and/or air exhaust, such as air exhaust passed through an anode tail gas oxidizer (ATO) where fuel exhaust is oxidized followed by providing the ATO exhaust to the hot box exhaust conduit (e.g., duct) 1304, or exhaust from air exhaust conduit 1214 and/or process exhaust conduit 1218 discussed above) from the fuel cell generators 501 via a hot box exhaust conduit (e.g., duct) 1304 configured to receive a process exhaust from the fuel cell generators 501. The hot box exhaust conduit (e.g., duct) 1304 may provide the process exhaust to the cooling tower 1302. The cooling tower 1302 may be configured to convert the enthalpy of the process exhaust to work energy. For example, the cooling tower 1302 may include a turbine 1306, and the process exhaust may spin the turbine 1306. The work energy from the cooling tower 1302 may be converted into power for the IT loads 503 by a device 1308, such as a generator. As an example, the generator 1308 may be coupled to the turbine 1306 of the cooling tower 1302. As the turbine 1306 is spun by the process exhaust in the cooling tower 1302 the turbine 1306 may spin the rotor of the generator 1308 producing electricity. The electricity produced by the generator 1308 may be provided to the IT loads 503. In addition to and/or in place of a turbine 1306, other heat recovery power generators may be used, such as a reciprocating heat engine, Stirling engine, thermoelectric devices, pyroelectric devices, etc. In this manner, the capture of energy from the process exhaust may increase the efficiency of the overall data center 1300 and/or reduce the required power output of the fuel cell generators 501.

One advantage to the vertical orientation illustrated in FIG. 13 and FIG. 5C (i.e., with process exhaust exiting the top of the building structure 505), is that a data center may be designed such that natural convection may drive the flow through the air inlets 510, 510C and filters 512, 512C, reducing and/or eliminating the need for fans 514, 514C. Fuel cell 501 and/or IT load 503 associated blowers and fans may push heated process exhaust out of the fuel cells 501 and/or IT loads 503, convection may push air out of the building structure 505. In an embodiment, the cooling tower 1302 may act as a chimney allowing for a velocity build over a vertical rise.

Figure 14:
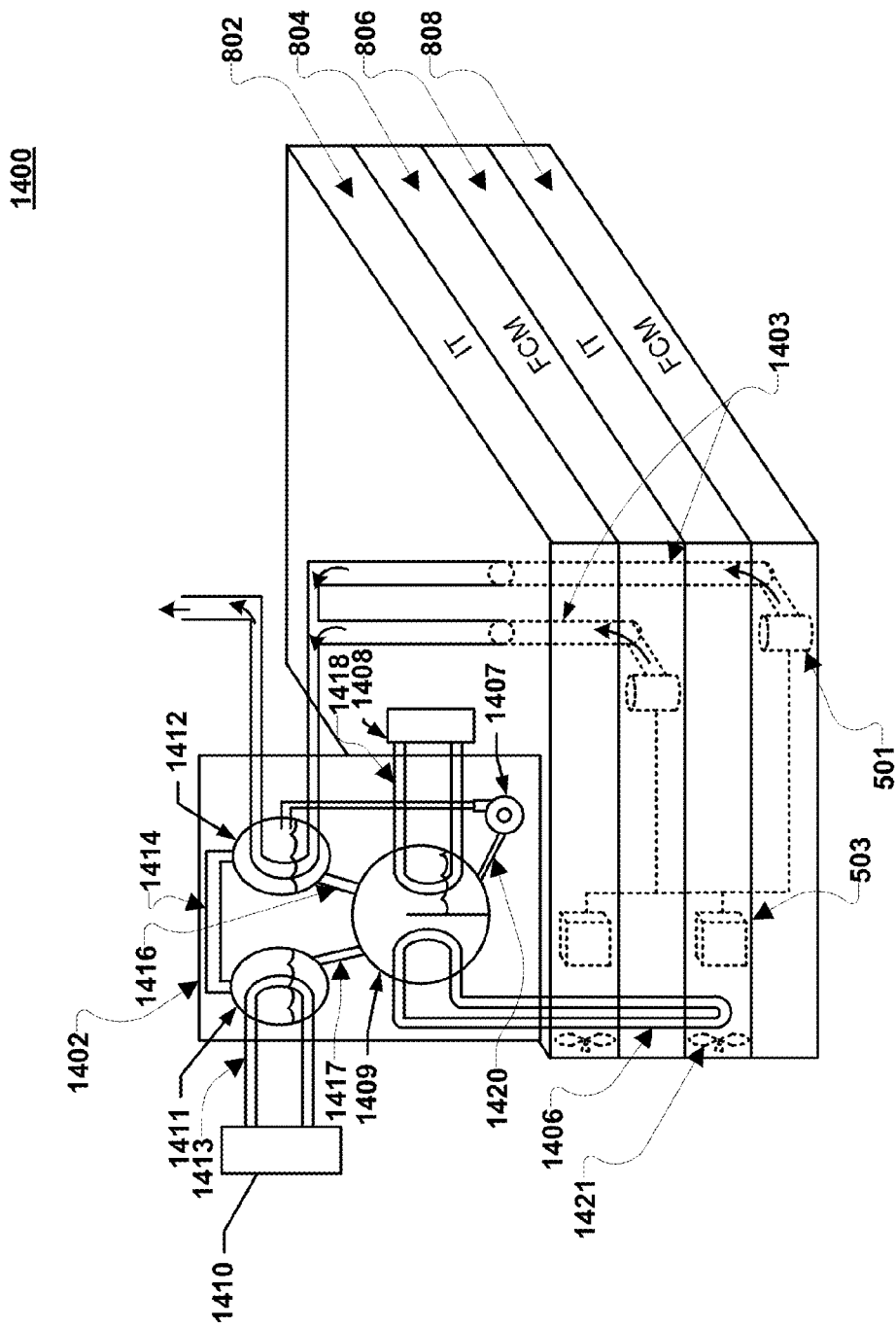

FIG. 14 is a perspective view of an embodiment data center 1400 similar to data center 800 described above with reference to FIGS. 8A and 8B and contains a number of components in common. Those components which are common to both data centers 800 and 1400 are numbered with the same numbers in FIGS. 8A, 8B, and 14 and will not be described further.

One difference between the data center 1400 and 800 is that data center 1400 may include an absorptive chiller 1402 configured to use the process exhaust from the fuel cell generators 501 to cool the IT loads 503. The absorptive chiller 1402 may receive process exhaust from the fuel cell generators 501 via a hot box exhaust conduit (e.g., duct) 1403 configured to receive a process exhaust from the fuel cell generators 501. The hot box exhaust conduit (e.g., duct) 1403 may provide the process exhaust through the generator 1412 of the absorptive chiller 1402 to heat the absorbed refrigerant and separate the refrigerant from the absorber as refrigerant vapors. The refrigerant vapors may pass via the vapor conduit 1414 to the condenser 1411. Cooling water from a water supply (e.g., tank, well, municipal water source, etc.) 1410 may be provided through the condenser 1411 via cool water conduit 1413 to condense the refrigerant vapors to a liquid. The liquid refrigerant may pass to the evaporator 1409 via a refrigerant conduit 1417. As the liquid refrigerant evaporates it may cool the water in the chill water loop 1406. Absorber fluid may pass to the evaporator 1409 via an absorber conduit 1416, and cooling water from a water supply (e.g., tank, well, municipal water source, etc.) 1408 may be provided through the evaporator 1409 via cool water conduit 1418 to condense the refrigerant vapors which are absorbed by the absorber fluid. The mixture of absorber fluid and refrigerant is drawn from the evaporator 1409 to the generator 1412 via conduit 1420 by pump 1407, and the process of separating refrigerant via heat from the process exhaust continues. Fans 1421 may circulate the air for the IT loads 501 across the chill water loop 1406 to cool the air for the IT loads 503. In this manner process exhaust may be used by the absorptive chiller 1402 to cool the IT loads 503.

Figure 15:
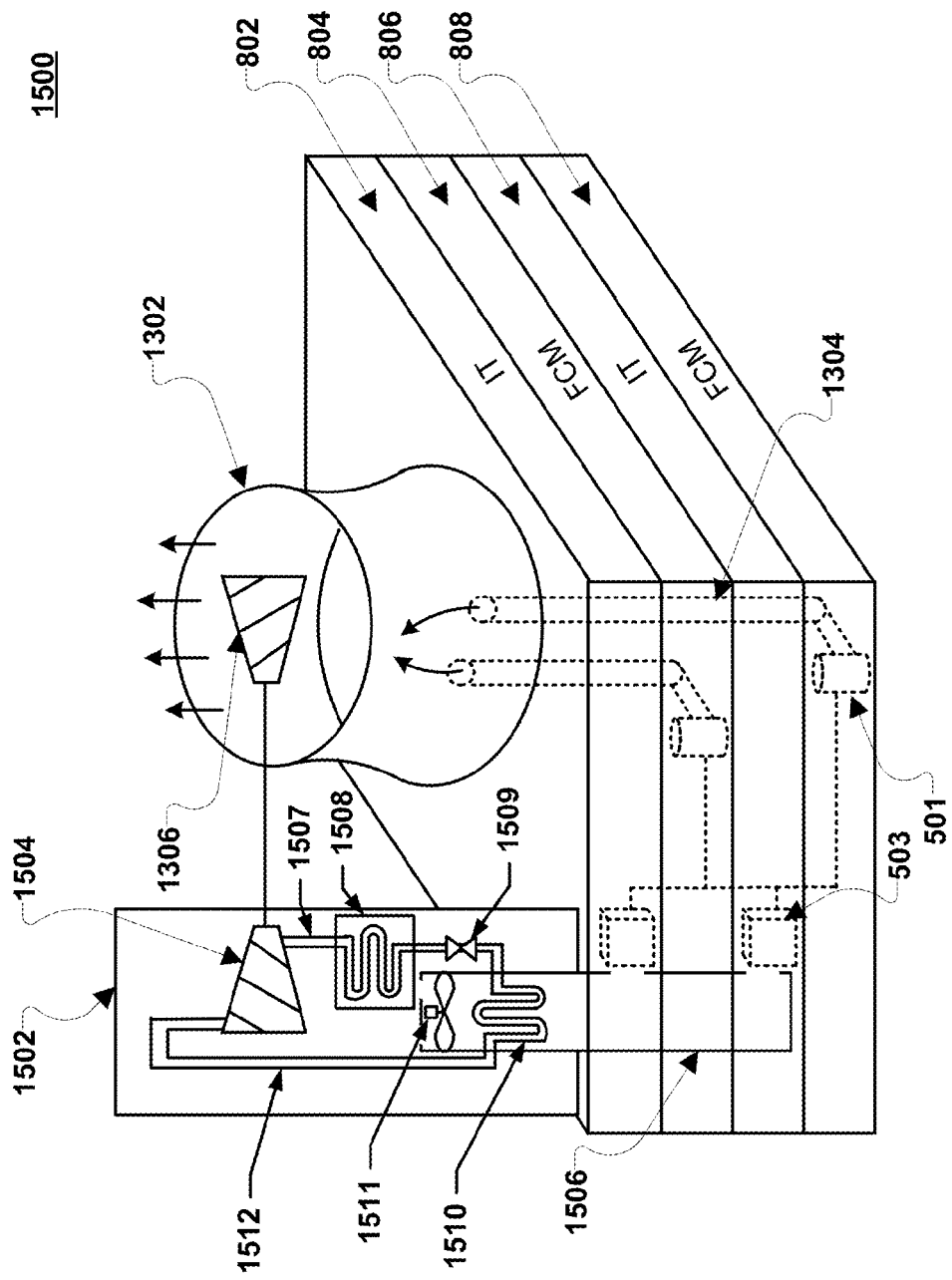

FIG. 15 is a perspective view of an embodiment data center 1500 similar to data center 1300 described above with reference to FIG. 13 and contains a number of components in common. Those components which are common to both data centers 1300 and 1500 are numbered with the same numbers in FIGS. 13 and 15 and will not be described further.

One difference between the data center 1500 and 1300 is that data center 1500 may include a compression chiller 1502 instead of, or in addition to, the device 1308 to convert the work energy to power for the IT loads 503. The turbine 1306 in the cooling tower 1302 may be configured to drive the compressor 1504 of the compression chiller 1052. The compressor 1504 may compress the cooling fluid (e.g., R134) of the compression chiller 1502, pass the cooling fluid to a condenser 1508 and expansion valve 1509 via conduit 1507, and then an evaporator 1510 to cool air for the IT loads 503. The cooling fluid may return to the compressor 1504 to be compressed again via return conduit 1512. A fan 1511 may blow air across the evaporator 1510 to be cooled, and an air duct 1506 may circulate the cooled air to the IT loads 503.

Figure 16:
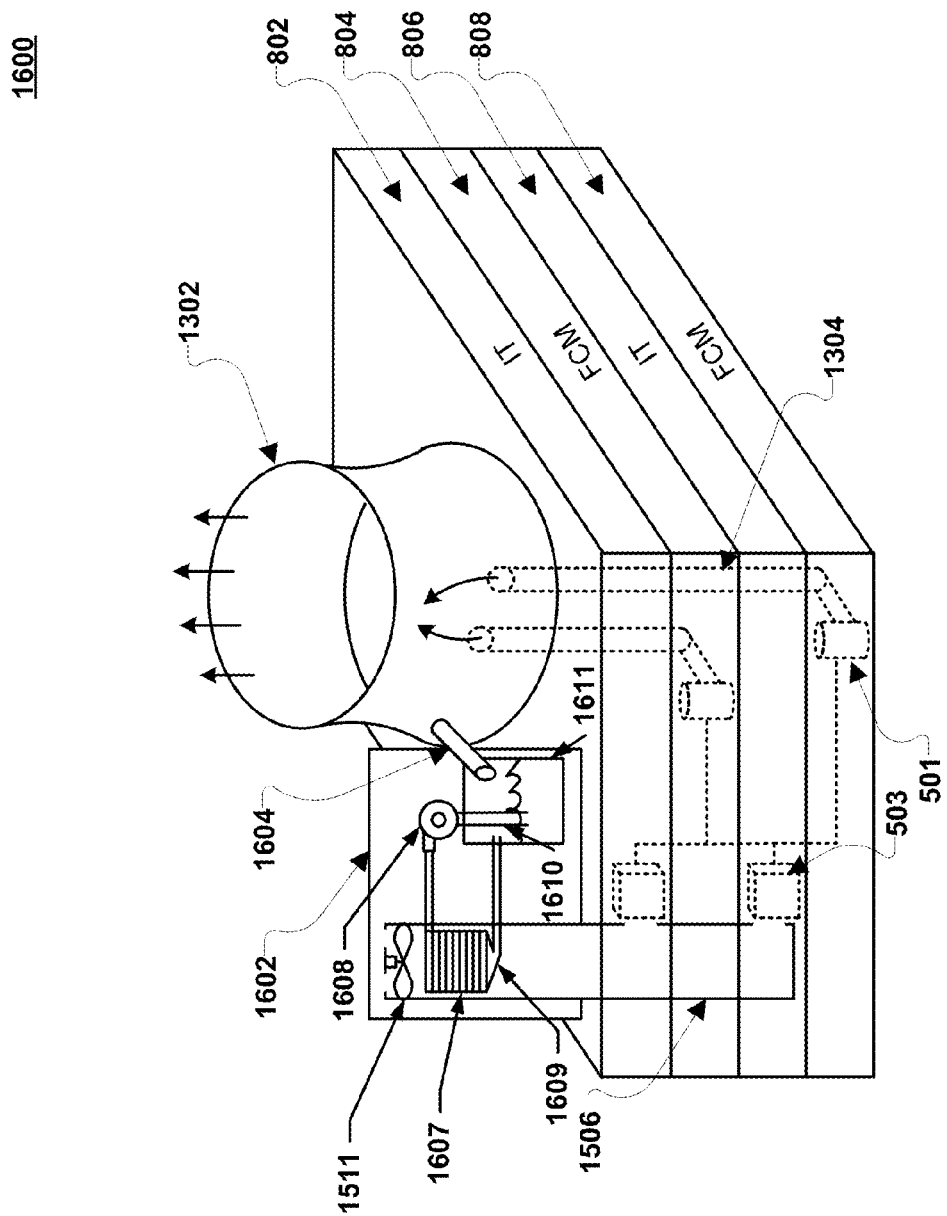

FIG. 16 is a perspective view of an embodiment data center 1600 similar to data center 1500 described above with reference to FIG. 15 and contains a number of components in common. Those components which are common to both data centers 1500 and 1600 are numbered with the same numbers in FIGS. 15 and 16 and will not be described further.

One difference between the data center 1600 and 1500 is that data center 1600 may include an evaporative cooling device 1602 rather than a compression chiller 1502. Additionally, the cooling tower 1302 may not include a turbine. In an embodiment, a condenser, such as the cooling tower 1302, may be configured to remove water from the fuel cell generator exhaust provided by the fuel cell generator hot box exhaust conduit (e.g., duct) 1304. As an example, steam within the fuel cell generator exhaust may condense to water and may be removed from the cooling tower via a drain tube 1604. In an embodiment, the drain tube may be coupled to the reservoir 1611 of an evaporative cooling device 1602, such as a "swamp cooler". The water from the reservoir 1611 may be drawn through supply conduit 1610 by pump 1608 and pumped over an evaporative pad 1607. The evaporation of the water in the evaporative pad 1607 may remove heat from the air blown over the evaporative pad 1607 by the fan 1511. The cooled air may be circulated to the IT loads 503 by air duct 1506. Un-evaporated water may be collected in return conduit 1609 and returned to the reservoir 1611.

Figure 17:
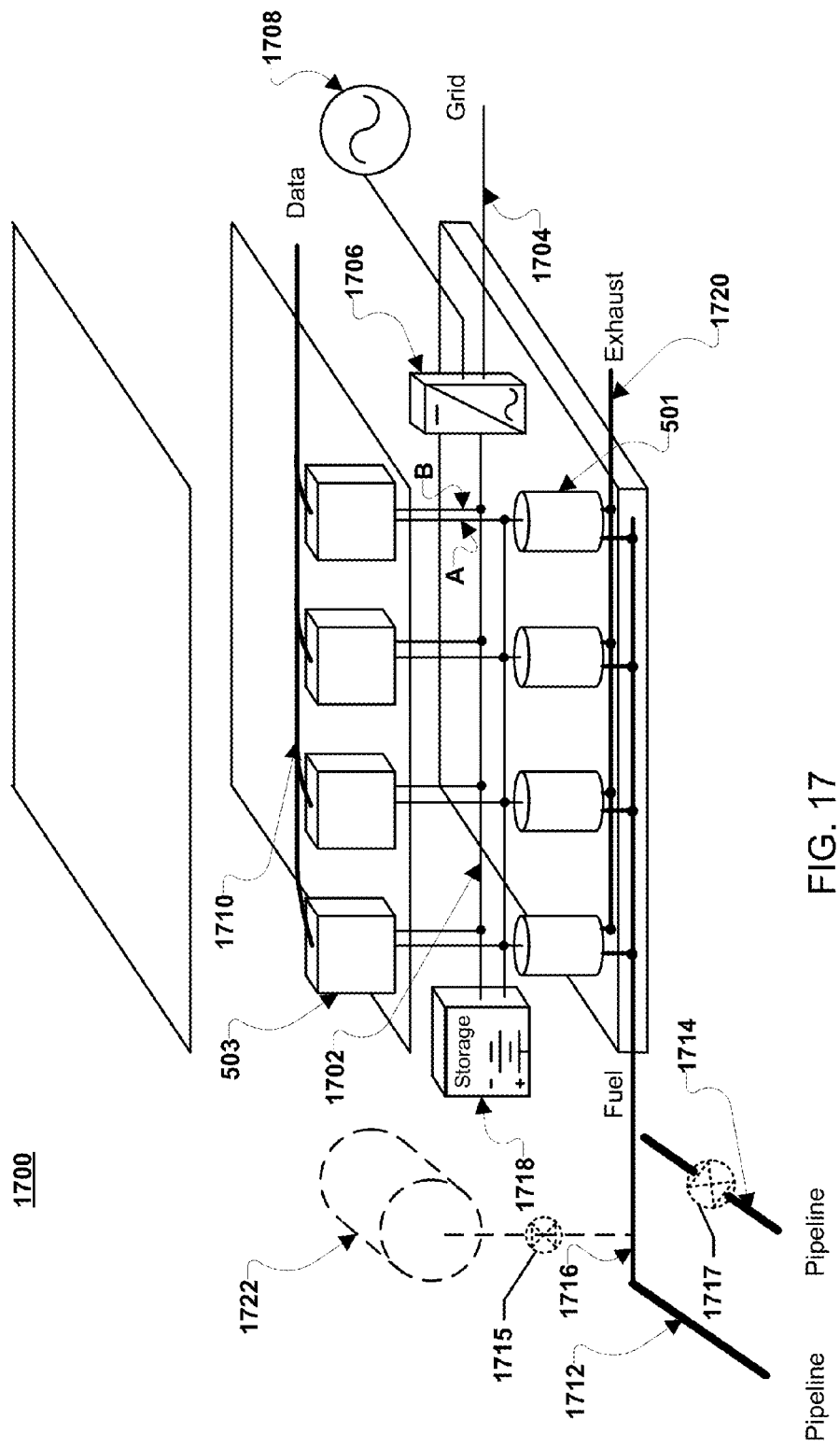
FIG. 17 is a block diagram of another data center according to another embodiment.

FIG. 17 illustrates an embodiment data center 1700 including fuel cell power generators 501 and IT loads 503 housed within a building structure. While illustrated as a building structure with fuel cell generators 501 and IT loads 503 located on different floors of the building structure, in an alternative embodiment, the fuel cell generators 501 and IT loads 503 may be located on the same floor(s).

In an embodiment, the fuel cell generators 501 may be coupled to various fuel sources via a fuel inlet 1716. In an embodiment, the fuel inlet 1716 may be coupled to a fuel source pipeline 1712, such as a public utility pipeline, and in this manner, the fuel source pipeline 1712 may be coupled to the fuel cell generators 501 and configured to provide fuel to the fuel cell generators 501. In an optional embodiment, the fuel inlet 1716 may also be coupled to a fuel source pipeline 1714, which may be a fuel source pipeline independent of the fuel source pipeline 1712. In this manner, the fuel source pipeline 1714 may also be coupled to the fuel cell generators 501 and configured to provide fuel to the fuel cell generators 501. In an embodiment, a valve 1717 may control the flow of fuel from the fuel source pipeline 1714 to the fuel inlet conduit 1716. Valve 1717 may be manually operated, remotely operated, and/or controlled by logic, such as a controller. The pipelines 1712, 1714 may supply the same or different fuels to the fuel cell generators 501. As examples, both pipelines 1712, 1714 may supply natural gas, pipeline 1712 may supply natural gas and pipeline 1714 may supply syn-gas, pipeline 1712 may supply bio-fuel and pipeline 1714 may supply natural gas, pipeline 1712 may supply natural gas and pipeline 1714 may supply hydrogen ($H_2$), or pipeline 1712 may supply oil and pipeline 1714 may supply natural gas.

In operation the fuel cell generators 501 may produce various process exhausts, such as anode and/or cathode exhaust for the fuel cell(s) within the fuel cell generators 501, which may be exhausted to an exhaust conduit 1720. In an embodiment, the exhaust conduit 1720 may exhaust the process exhaust (e.g., ATO exhaust) out of the data center 1700.

In an optional embodiment, the data center 1700 may include an energy storage device 1718 coupled to the IT loads 503 and/or the fuel cell generators 501. In an embodiment, the energy storage device 1718 may be any device configured to store electrical energy, such as a battery, supercapacitor, or flywheel. The energy storage device 1718 may be configured to provide power to the IT loads 503 and receive power from the fuel cell generators 501. In an embodiment, the energy storage device 1718 may also provide power to the fuel cell generators 501 (e.g., during start up or shutdown of the fuel cell generators 501 to power blowers and/or other devices of plant equipment. In an embodiment, a controller may be coupled to the IT loads 503, fuel cell generators 501, and energy storage device 1718 to monitor the power requirements of the IT loads 503 and control the operation of the fuel cell generators 501 and/or energy storage device 1718 based on the power requirements of the IT loads 503. In an alternative embodiment, voltage control (i.e., voltage set points) may be used to control charging and/or discharging of the energy storage device 1718.

In an embodiment, the IT loads 503 may be coupled to a data bus 1710 which may be configured to share data among the IT loads 503 and output data, such as to a network via a network connection to the data bus 1710. In an embodiment, the IT loads 503, fuel cell generators 501, and/or energy storage device 1718 may be coupled to a grid connection 1704, such as a public utility electrical grid connection. In an embodiment, the IT loads 503, fuel cell generators 501, and/or energy storage device 1718 may be coupled to the grid connection 114 via an AC/DC converter 1706. In a further embodiment, an AC generator 1708 may be coupled to the IT loads 503, fuel cell generators 501, and/or energy storage device 1718 via the AC/DC converter 1706. In this manner, the data center 1700 may have varied additional power sources beyond the fuel cell generators 501 which may provide power to the IT loads 503.

In an optional embodiment, a fuel storage tank 1722 may be co-located with the building structure of the data center 1700. The fuel storage tank 1722 may be coupled to the fuel inlet conduit 1716. In this manner, the fuel storage tank 1722 may be coupled to the fuel cell generators 501 and configured to provide a stored fuel from the fuel storage tank 1722 to the fuel cell generators 501. In an embodiment, a valve 1715 may control the flow of fuel from the fuel storage tank 1722 to the fuel inlet conduit 1716. Valve 1715 may be manually operated, remotely operated, and/or controlled by logic, such as a controller. In an embodiment, the stored fuel may be any type fuel suitable for use with fuel cells, such as liquid propane, propane, compressed natural gas, liquid natural gas, hydrogen (liquid or compressed $H_2$ or $H_2$ stored in solid media, such as metal hydride or carbon nanotubes), ethanol, etc. In an embodiment, the fuel cell generators 501 may use fuel supplied from the pipeline 1712 in normal operation, but may rely on stored fuel in the fuel storage tank 1722 as a backup fuel source, such as when the natural gas utility may be out of service. In an embodiment, a cooling device may be coupled to the outlet of the fuel storage tank 1722. The cooling device may be configured to use heat removal by the stored fuel to cool the IT loads 503. As an example, the cooling device may use heat removal as the stored fuel converts from a liquid fuel to a gaseous fuel to cool the air provided to the IT loads 503. As another example, the cooling device may use heat removal as the stored fuel expands from a compressed state to cool the air provided to the IT loads 503.

Figures 18A, 18B, 18C:
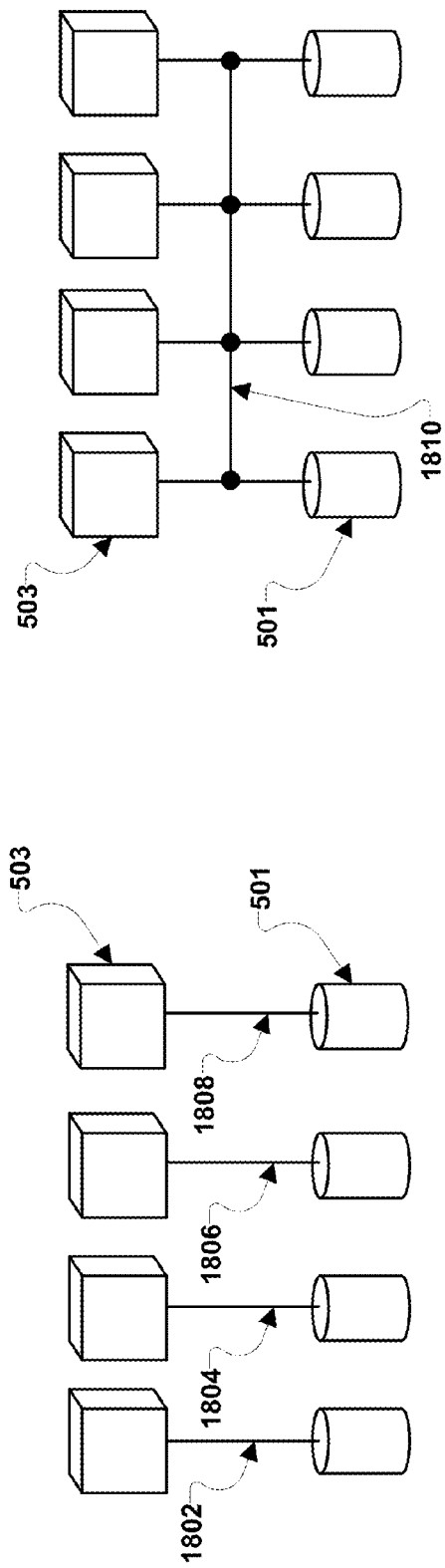
FIGS. 18A-18C illustrate IT load and fuel cell generator connections according to the various embodiments.

FIGS. 18A-18C illustrate IT load 503 and fuel cell generator 501 connections suitable for use in the various embodiments. FIG. 18A illustrates individual bus connections 1802, 1804, 1806, and 1808 between each fuel cell generator 501 and each IT load 503. In this manner, each fuel cell generator 501 and IT load 503 pair may be isolated from other fuel cell generator 501 and IT load 503 pairs. FIG. 18B illustrates a shared common bus 1810 between all fuel cell generators 501 and all IT loads 503. In this manner, any fuel cell generator 501 may provide power to any IT load. FIG. 18C illustrates two shared buses 1812 and 1814 which may connect a first group of fuel cell generators 501 and IT loads 503 together, independent of a second group of fuel cell generators 501 and IT loads 503. In this manner, groups of fuel cell generators 501 may provide power to groups of IT loads 503, but each grouping may be isolated from other groupings. While illustrated as a single buses, buses 1802, 1804, 1806, 1808, 1810, 1812, and/or 1814 may be split buses, such as three conductor buses. In the various embodiment, buses 1802, 1804 1806 1808, 1810, 1812, and 1814 may be used to connect fuel cell generators 501 and IT loads 503 on the same floor and/or across more than one floor in a data center.

Figure 19:
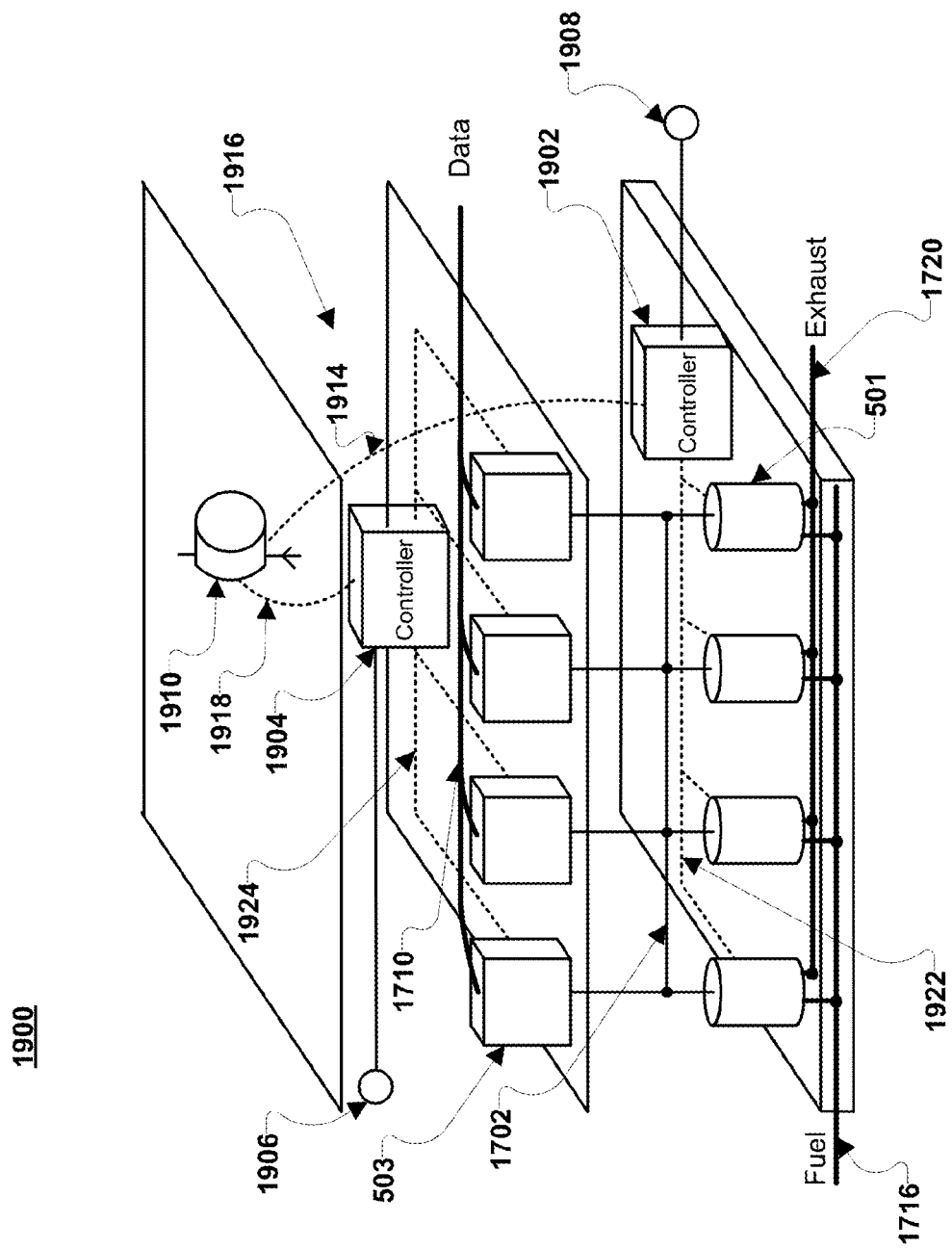
FIG. 19 is a block diagram of another data center according to another embodiment.

FIG. 19 is a perspective view of an embodiment data center 1900 similar to data center 1700 described above with reference to FIG. 17 and contains a number of components in common. Those components which are common to both data centers 1700 and 1900 are numbered with the same numbers in FIGS. 17 and 19 and will not be described further.

One difference between the data center 1900 and 1700 is that data center 1900 may include an IT load controller 1904 in communication with the IT loads 503 and a fuel cell generator controller 1902 in communication with the fuel cell generators 501. In an embodiment, one or both of the IT load controller 1904 and fuel cell generator controller 1902 may be powered partially or fully by the fuel cell generators 501. In an embodiment, the IT load controller 1904 and fuel cell generator controller 1902 may be physically the same device (e.g., single computer).

The IT load controller 1904 may be in communication with various IT loads 503 in the data center 1900 for controlling/scheduling the operation the various devices comprising the IT loads 503. In an embodiment, the IT load controller 1904 may include a connection 1906 to a communication network (e.g., a cellular, Wi-Fi, Ethernet, or other connection to the Internet) for sending/receiving information with devices/systems/entities, such as public utilities, fuel dispatchers, data center 1900 operators, various devices comprising the IT loads 503, emergency response personnel, security personnel, etc. In this manner, information may be exchanged between the devices/systems/entities and the IT load controller 1904. In an embodiment, the various devices comprising the IT loads 503 may include wired and/or wireless modems and logic to enable communication between the IT load controller 1904 and various IT load 503 devices and various logic and controls (e.g., switches, transistors, relays, etc.) to enable the IT load 503 devices to perform operations (such as start-ups, shut downs, data wiping, write-out of master boot sectors, server shutdown, electromagnetic pulse triggers, disconnects, discharges, etc.) in response to signals received from the IT load controller 1904. In this manner, IT load controller 1904 may control the operations of the various IT load 503 devices via wired or wireless communication. In an optional embodiment, the IT load controller 1904 may be connected to the IT loads 503 by a series of wires 1924, such as electrical and/or fiber optic transmission lines.

The fuel cell generator controller 1902 may be in communication with various fuel cell generators 501 in the data center 1900 for controlling/scheduling the operation the various devices comprising the fuel cell generators 501. In an embodiment, the fuel cell generator controller 1902 may include a connection 1908 to a communication network (e.g., a cellular, Wi-Fi, Ethernet, or other connection to the Internet) for sending/receiving information with devices/systems/entities, such as public utilities, fuel dispatchers, data center 1900 operators, various devices comprising the fuel cell generators 501, emergency response personnel, security personnel, etc. In this manner, information may be exchanged between the devices/systems/entities and the fuel cell generator controller 1902. In an embodiment, the various devices comprising the fuel cell generators 501 may include wired and/or wireless modems and logic to enable communication between the fuel cell generator controller 1902 and various fuel cell generator 501 devices and various logic and controls (e.g., switches, transistors, relays, etc.) to enable the fuel cell generator 501 devices to perform operations (such as start-ups, shut downs, disconnects, discharges, etc.) in response to signals received from the fuel cell generator controller 1902. In this manner, fuel cell generator controller 1902 may control the operations of the various fuel cell generator 501 devices via wired or wireless communication. In an optional embodiment, the fuel cell generator controller 1902 may be connected to the fuel cell generator 501 by a series of wires 1922, such as electrical and/or fiber optic transmission lines.

In an embodiment, microwave transmission equipment 1910, such as a microwave transceiver, may be provided in the data center 1900. The IT load controller 1904 and/or the fuel cell generator controller 1902 may be connected to the microwave transmission equipment, via data connections 1918 and 1914, respectively, such as electrical and/or fiber optic transmission lines. The microwave transmission equipment may serve as a backup to connections 1906 and/or 1908 to communication networks (e.g., a cellular, Wi-Fi, Ethernet, or other connection to the Internet) for sending/receiving information with devices/systems/entities.

Figure 20:
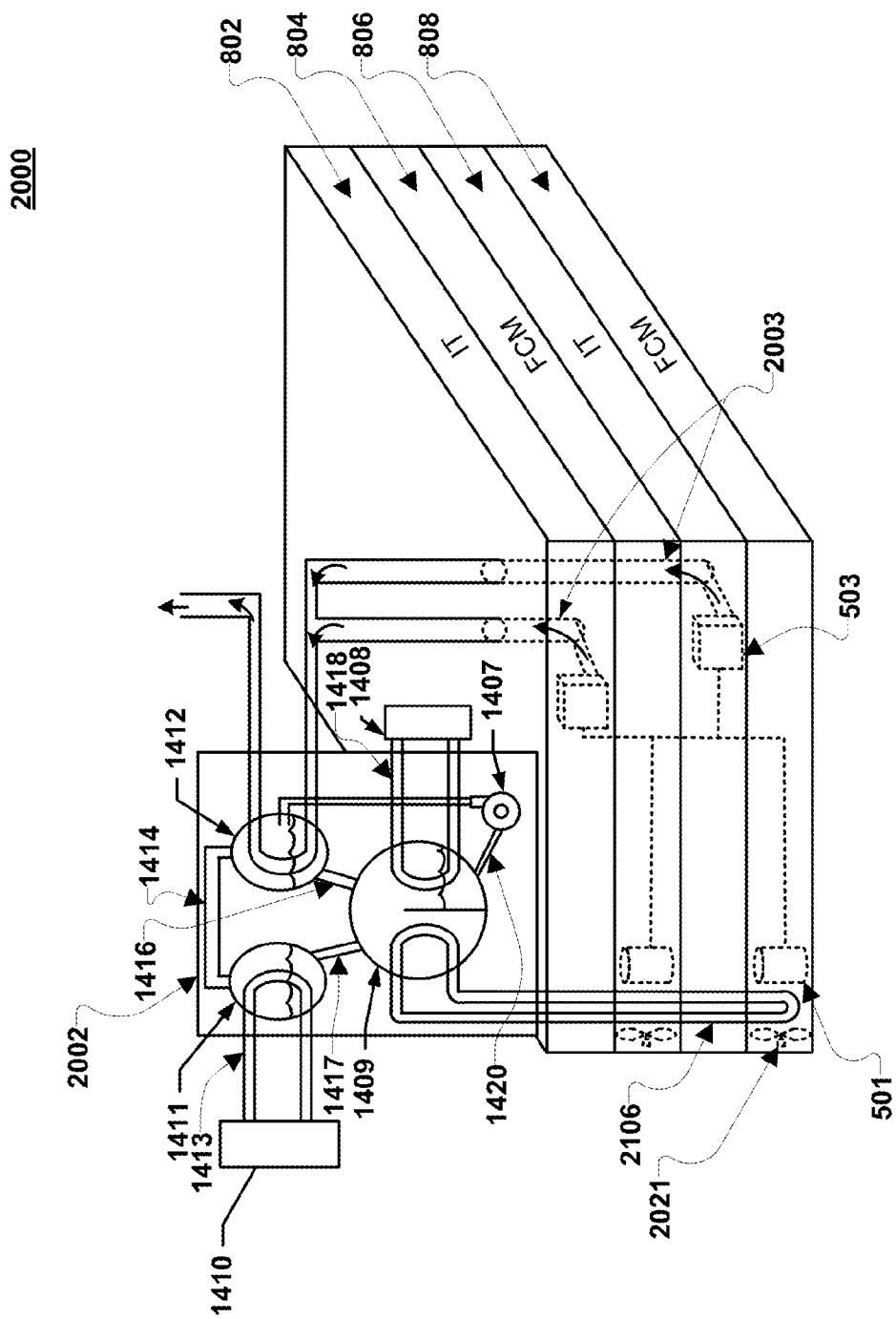
FIGS. 20-22 are perspective views of data centers according to the various embodiments.

FIG. 20 is a perspective view of an embodiment data center 2000 similar to data center 1400 described above with reference to FIG. 14 and contains a number of components in common. Those components which are common to both data centers 1400 and 2000 are numbered with the same numbers in FIGS. 14 and 20 and will not be described further.

One difference between the data center 2000 and 1400 is that data center 2000 may include an absorptive chiller 2002 instead of, or in addition to, absorptive chiller 1402. Absorptive chiller 2002 may be configured to use the process exhaust from the IT loads 503 to cool the fuel cell generators 501. The absorptive chiller 2002 may be similar to absorptive chiller 1402, except that absorptive chiller 2002 may receive process exhaust from the IT loads 503 via an IT load exhaust conduit 2003 configured to receive a process exhaust from the IT loads 503, rather than process exhaust from the fuel cell generators 501 via a hot box exhaust conduit (e.g., duct) 1403. The IT load exhaust conduit 2003 may provide the process exhaust through the generator 1412 of the absorptive chiller 2002. Absorptive chiller 2002 may operate in a similar manner as absorptive chiller 1402 described above with reference to FIG. 14 to cool the water in chill water loop 2106. Fans 2021 may circulate the air for the fuel cell generators 501 across the chill water loop 2106 to cool the air for the fuel cell generators. In this manner process exhaust may be used by the absorptive chiller 2002 to cool the fuel cell generators 501.

Figure 21:
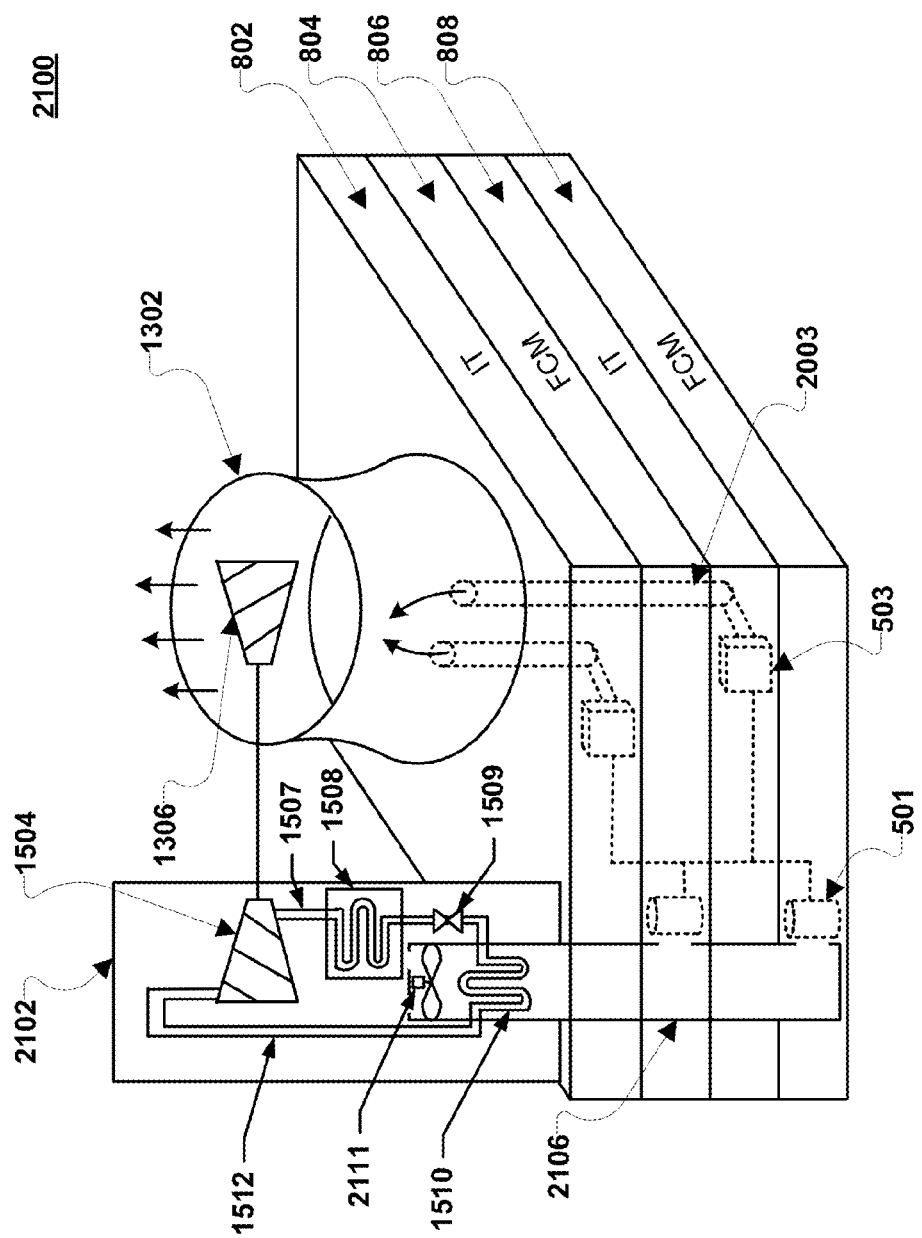

FIG. 21 is a perspective view of an embodiment data center 2100 similar to data center 1500 described above with reference to FIG. 15 and contains a number of components in common. Those components which are common to both data centers 1500 and 2100 are numbered with the same numbers in FIGS. 15 and 21 and will not be described further.

One difference between the data center 2100 and 1500 is that data center 2100 may include a compression chiller 2102 instead of, or in addition to, the compression chiller 1502. Compression chiller 2102 may be configured to use the process exhaust from the IT loads 503 to cool the fuel cell generators 501. The compression chiller 2102 may be similar to compression chiller 1502, except that compression chiller 2102 may receive process exhaust from the IT loads 503 via an IT load exhaust conduit 2003 configured to receive a process exhaust from the IT loads 503, rather than process exhaust from the fuel cell generators 501 via a hot box exhaust conduit (e.g., duct) 1304 configured to receive a process exhaust from the fuel cell generators 501. Compression chiller 2102 may operate in a similar manner as compression chiller 1502 described above with reference to FIG. 15 to cool air for the fuel cell generators 501. A fan may blow air across the evaporator 1510 to be cooled, and an air duct 2106 may circulate the cooled air to the fuel cell generators 501.

Figure 22:
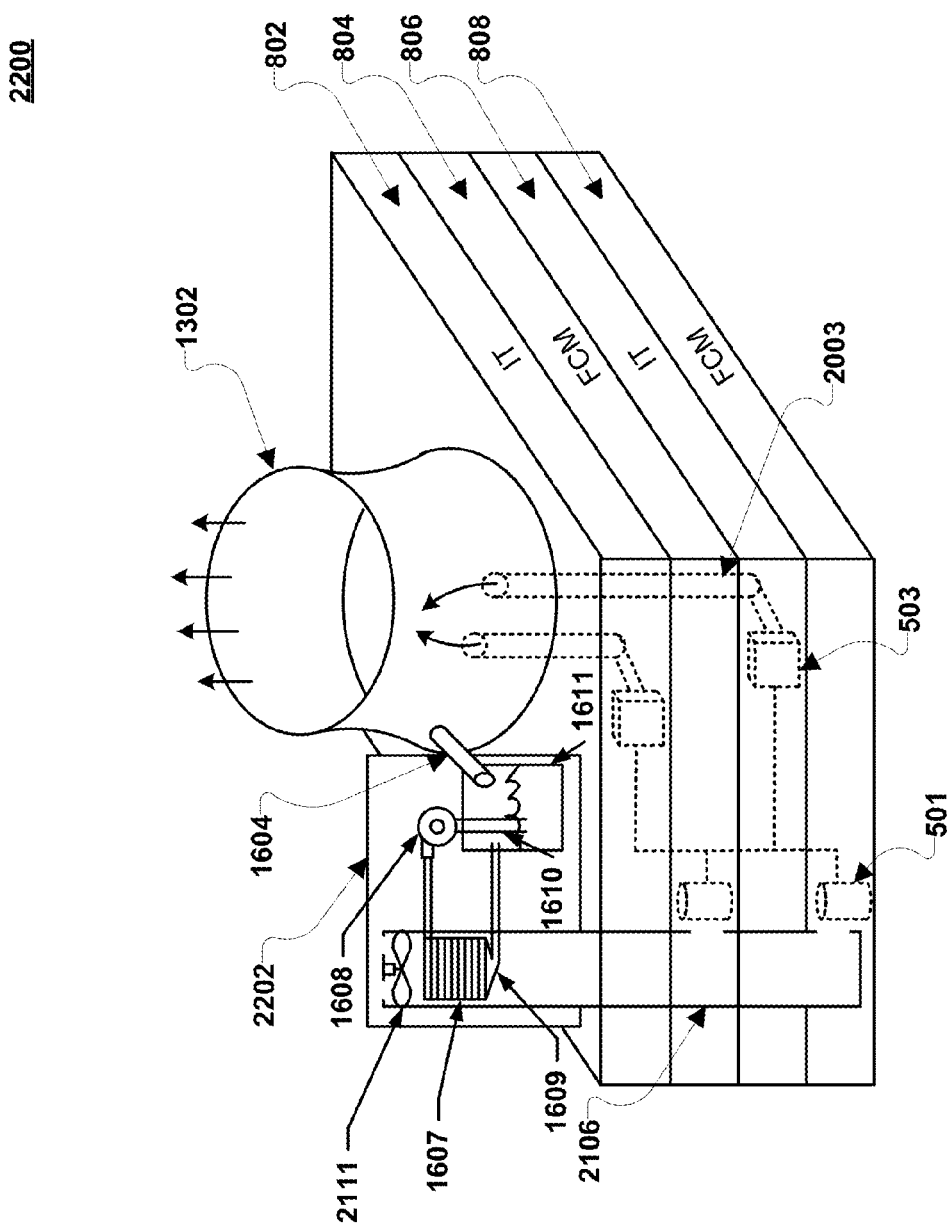

FIG. 22 is a perspective view of an embodiment data center 2200 similar to data center 1600 described above with reference to FIG. 16 and contains a number of components in common. Those components which are common to both data centers 1600 and 2200 are numbered with the same numbers in FIGS. 16 and 21 and will not be described further.

One difference between the data center 2200 and 1600 is that data center 2200 may include an evaporative cooling device 2202 instead of, or in addition to, the evaporative cooling device 1602. Evaporative cooling device 2202 may be configured to use the water from the process exhaust from the IT loads 503 to cool the fuel cell generators 501. The evaporative cooling device 2202 may be similar to evaporative cooling device 1602, except that evaporative cooling device 2202 may receive water from a condenser, such as cooling tower 1302, configured to remove water from the process exhaust from the IT loads 503 provided to the condenser via an IT load exhaust conduit 2003 configured to receive a process exhaust from the IT loads 503, rather than water removed from process exhaust from the fuel cell generators 501. The evaporative cooling device 2202 may operate in a similar manner as evaporative cooling device 1602 described above with reference to FIG. 16 to cool air for the fuel cell generators 501. The evaporation of the water in the evaporative pad 1607 may remove heat from the air blown over the evaporative pad 1607 by the fan 2111. The cooled air may be circulated to the fuel cell generators 501 by air duct 2106.

Figure 23:
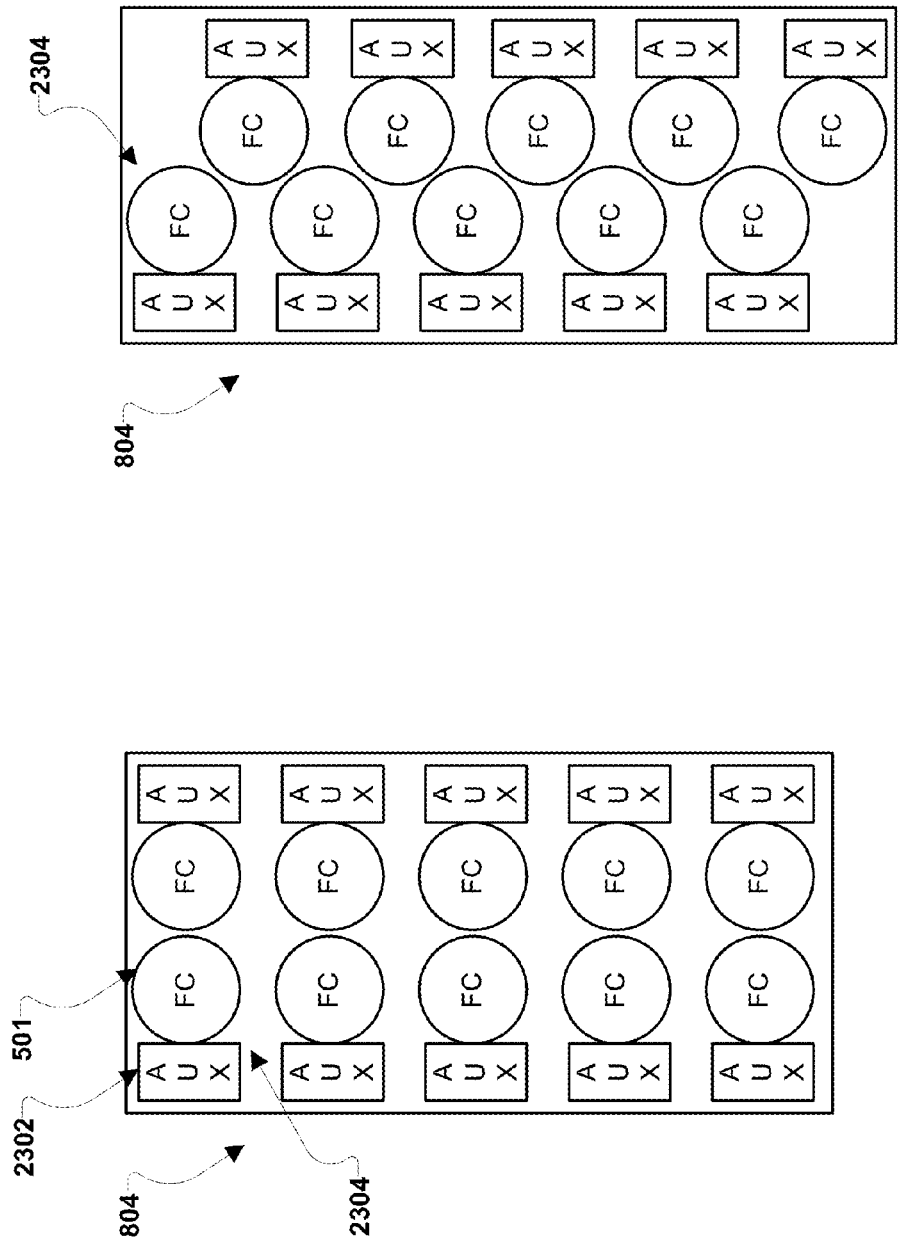
FIGS. 23A-23B illustrate top views of various fuel cell generator and auxiliary device arrangements suitable for use in the various embodiments.

FIGS. 23A and 23B illustrate various fuel cell generator 501 and auxiliary device 2302 arrangements suitable for use in the various embodiments in which the fuel cell generators 501 and IT loads 503 are located on different floors 802, 804, 806, 808 of the data center 800 described above with reference to FIG. 8. When fuel cell generators 501 and IT loads 503 are located on different floors 802, 804, 806, and/or 808 of the data center 800, the fuel cell generators 501 and IT loads 503 may be arranged in any configuration. Auxiliary devices 2302 may include blowers, pumps, fans, fuel lines, water lines, air lines, reactors (e.g., catalytic partial oxidation reactors), electronics (e.g., DC/DC converters) valves, and/or other equipment necessary for operation of the fuel cell generators 501. Each fuel cell generator 501 may be paired with its own set of auxiliary devices 2302 to form a fuel cell module 2304. In an embodiment, the fuel cell module 2304 may be similar to fuel cell power module 12 described above with reference to FIG. 2. For ease of description, only one floor 804 of the data center 800 is illustrated in FIGS. 23A and 23B.

FIG. 23A illustrates an embodiment in which the fuel cell generators 501 and the auxiliary devices 2302 forming the fuel cell module 2304 are arranged aligned columns and rows in the center of the fuel cell generator floor 804. FIG. 23B illustrates another embodiment in which the fuel cell modules 2304 are staggered in two interlocking columns to increase the density of fuel cell modules 2304 on the floor 804.

Figure 24:
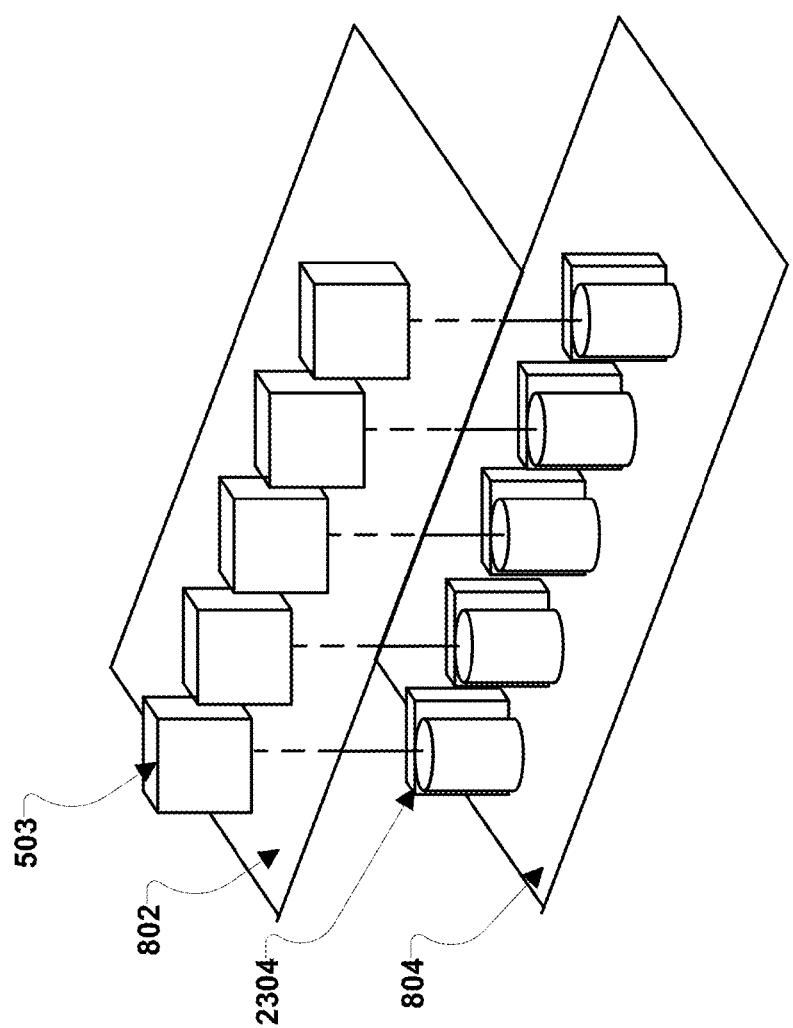
FIG. 24 is a perspective view of IT load, fuel cell generator, and auxiliary device arrangements suitable for use in the various embodiments.

FIG. 24 illustrates a perspective view of two floors of data center 800, floors 802 and 804. In the embodiment illustrated in FIG. 24 IT loads 503 on floor 802 are located directly over the fuel cell modules 2304 on floor 804 which are electrically connected to the IT loads 503. In an alternative embodiment, fuel cell modules 2304 on floor 802 may be directly over IT loads 503 on floor 806 and may be electrically connected to the IT loads 503 on floor 806.

Figure 25B:
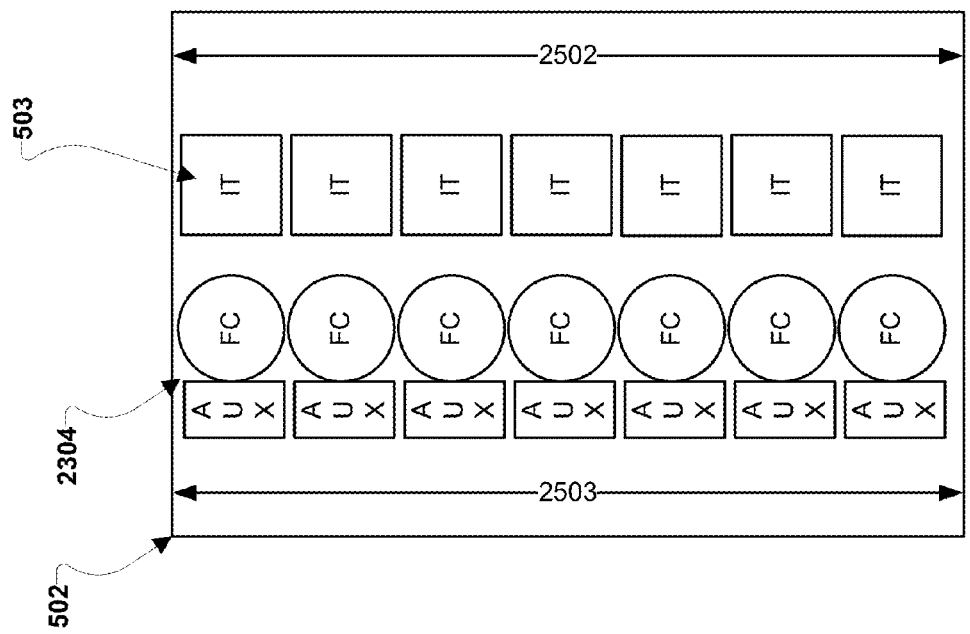
FIGS. 25A-25C illustrate top view of various fuel cell generator, auxiliary device, and IT load arrangements suitable for use in the various embodiments.
Figure 25A:
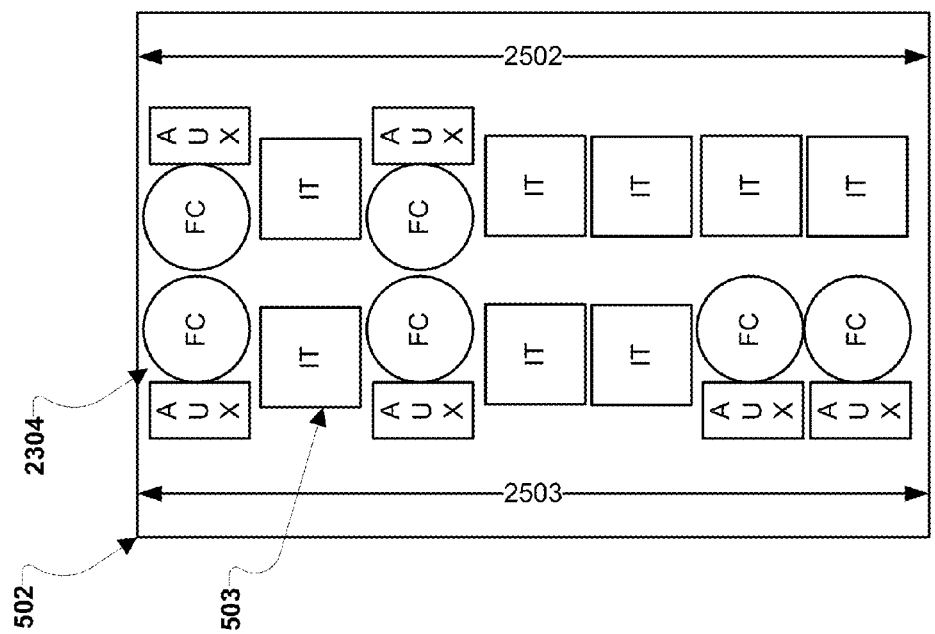
Figure 25C:
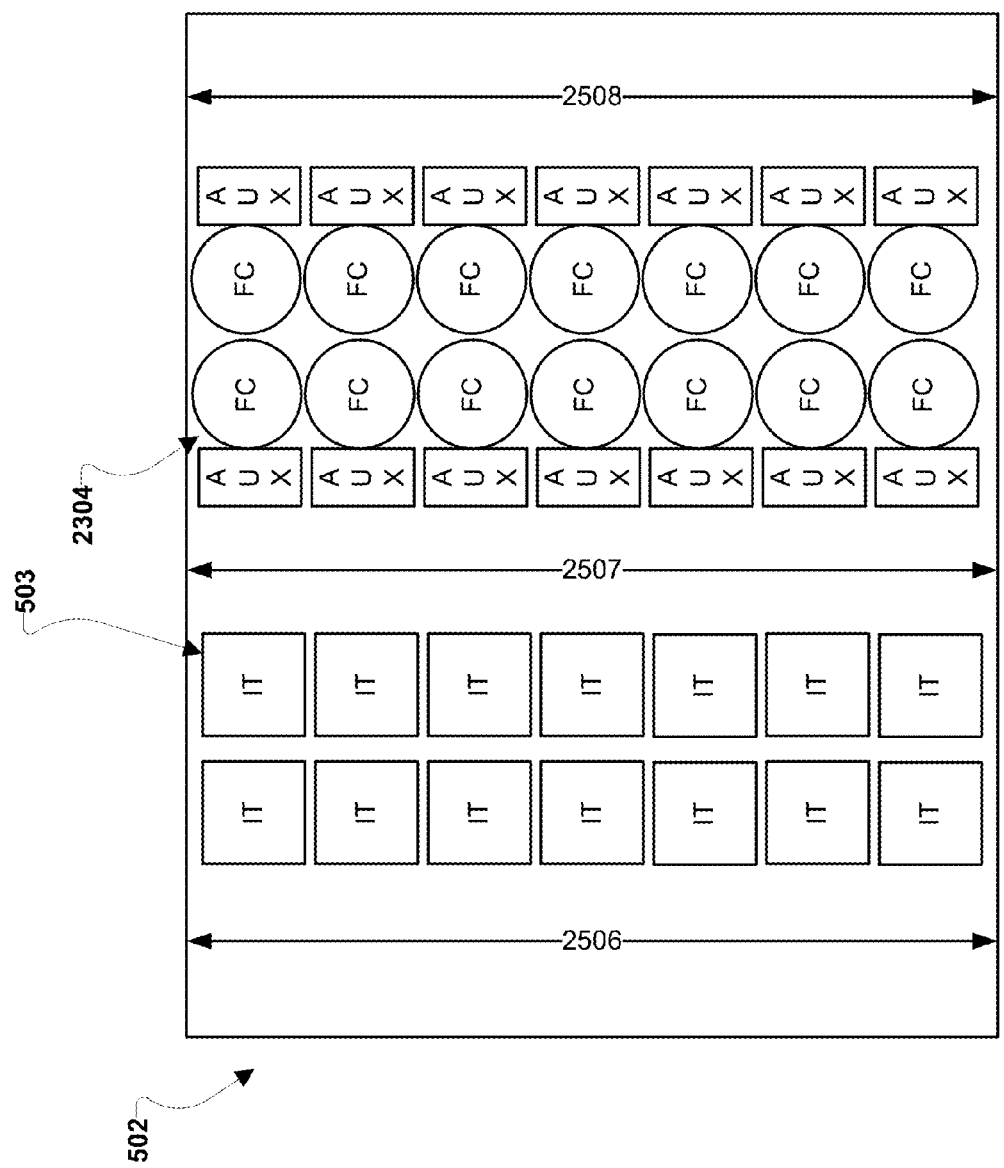

FIGS. 25A-25C illustrate various IT load 503 and fuel cell module 2304 arrangements suitable for use in the various embodiments in which fuel cell generators 501 and IT loads 503 are located on the same floors 502, 504, 506, and/or 508 of the data center 500. For ease of description, only one floor 502 of the data center is illustrated in FIGS. 25A-25C.

FIG. 25A illustrates two adjacent columns, each column containing both fuel cell modules 2304 and IT loads 503 arranged in the center of the floor 502 to create two aisles 2503 and 2502. In the two adjacent columns fuel cell modules 2304 and IT loads 503 may be arranged in any order, and the number of fuel cell modules 2304 may be different from the number of IT loads 503 in each column. IT loads 503 in one column may be arranged adjacent to IT loads 503 in the other column or adjacent to fuel cell modules 2304, and fuel cell modules 2304 may be arranged adjacent to fuel cell modules 2304 or IT loads 503 as well. FIG. 25B illustrates two adjacent columns, one of all fuel cell modules 2304 and one of all IT loads 503, arranged in a back to back configuration in the center of the floor 502 to create two aisles 2503 and 2502. FIG. 25C illustrates alternating rows of two columns of IT loads 503 and two columns of fuel cell modules 2304 arranged on the floor 502 to create three aisles 2506, 2507, and 2508. The IT loads 503 may be arranged in two back to back columns to form one row, and the fuel cell modules 2304 may be arranged in two back to back columns to form another row.

Figure 26:
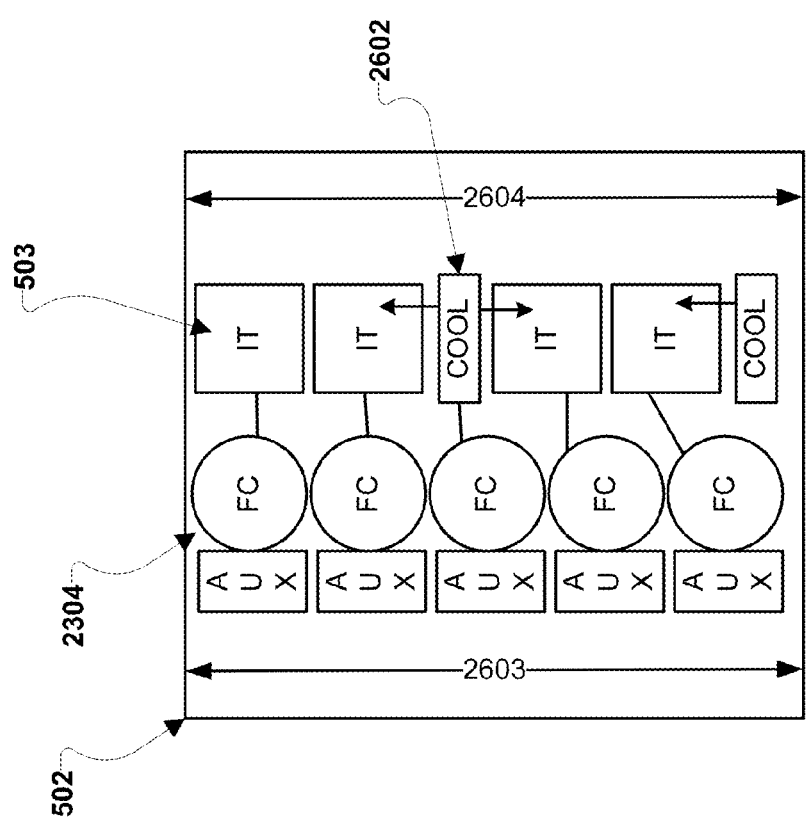
FIG. 26 illustrates a top view of a fuel cell generator, auxiliary device, IT load, and cooling device arrangement suitable for use in the various embodiments.

FIG. 26 illustrates an IT load 503, fuel cell module 2304, and cooling device 2602 arrangement suitable for use in the various embodiments in which fuel cell generators 501 and IT loads 503 are located on the same floors 502, 504, 506, and/or 508 of the data center 500. For ease of description, only one floor 502 of the data center is illustrated in FIG. 26. A cooling device 2602 may be any type cooling device, such as the cooling devices 1402, 1502, 1602, 2002, 2102, 2202 described above and/or other air conditioners, chillers, fans, etc. In an embodiment, the cooling device 2602 may direct cooling air to IT loads 503. The fuel cell modules 2304 may be arranged in a first column and the IT loads 503 and cooling devices 2602 may be arranged in a second column in the middle of the floor 502 to create two aisles 2603 and 2604. In an embodiment, the number of fuel cell modules 2304 may be equal to the total number of IT loads 503 and cooling devices 2602.

In an embodiment, one fuel cell module 2304 may be associated with each IT load 502 or cooling device 2602 and may power its respective IT load 503 or cooling device 2602, as shown by the connection lines. In this manner, some fuel cell modules 2304 may power IT loads 502 while other fuel cell modules 2304 may power cooling devices. In this configuration, each cooling device 2602 is used located between two IT loads 503 and is used to cool these adjacent IT loads 503 as shown by the arrows in FIG. 26.

Alternatively, the number of fuel cell modules 2304 may not equal to (e.g., may be smaller or larger than) the total number of IT loads 503 and cooling devices 2602. Thus, each fuel cell module 2304 may power more than one IT load 503, or more than one cooling device 2602, or at least one IT load 503 and at least one cooling device 2602. Alternatively, each IT load 503 and/or each cooling device 2602 may be powered by more than one fuel cell module 2304.

Figure 27:
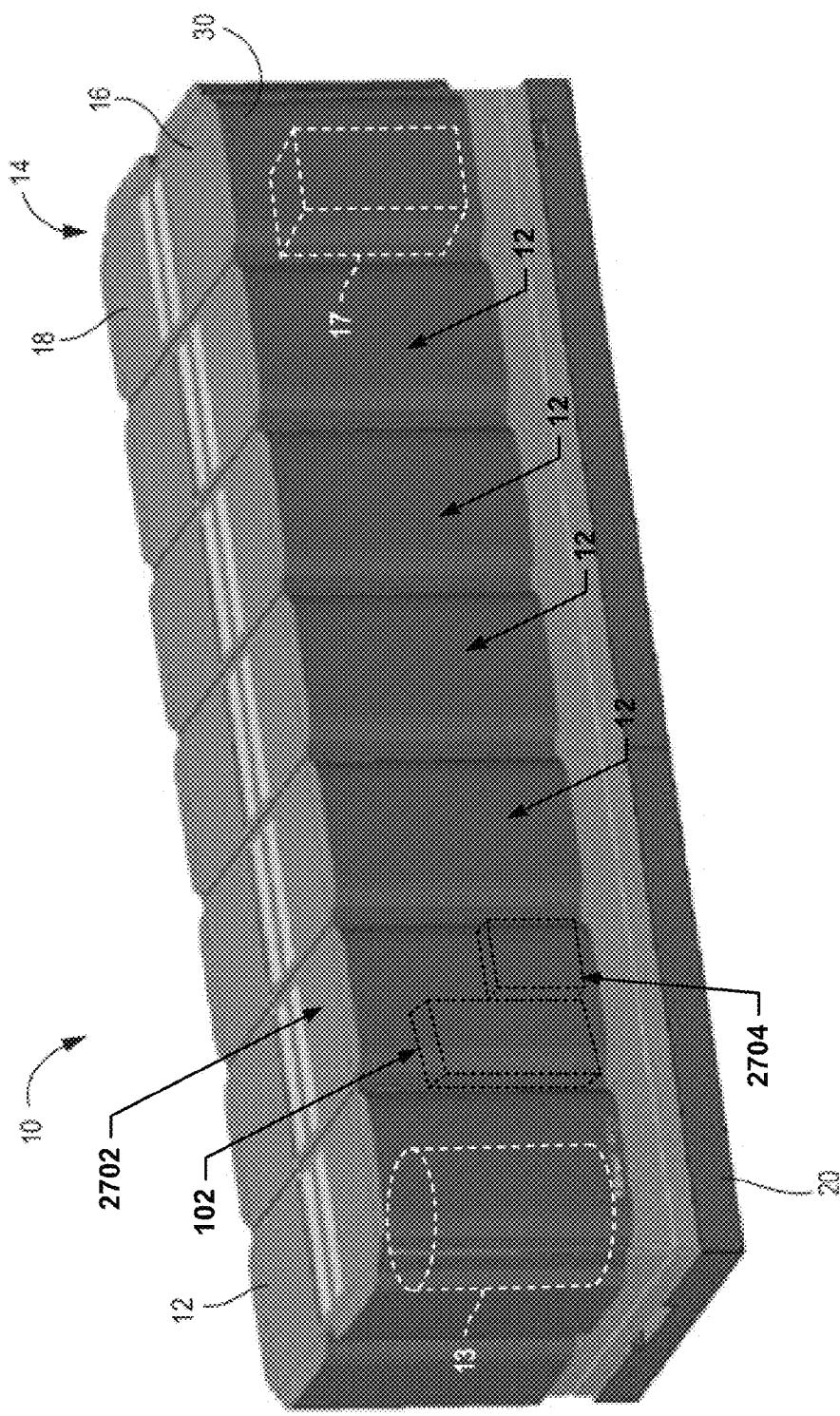
FIGS. 27 and 28 are isometric views of modular fuel cell system enclosures that may be used with the exemplary embodiments.

FIG. 27 illustrates a modular fuel cell system enclosure (i.e., fuel cell generator) according to an exemplary embodiment. In the modular fuel cell system enclosure, the IT load 102 may be in a separate module 2702 (i.e., cabinet) of the same enclosure as the power modules 12 of the modular fuel cell system enclosure. Thus, the IT load 102 and fuel cell hot boxes 13 are located in adjacent cabinets respective 2702, 12 of an enclosure 10 of a modular fuel cell system.

Figure 29:
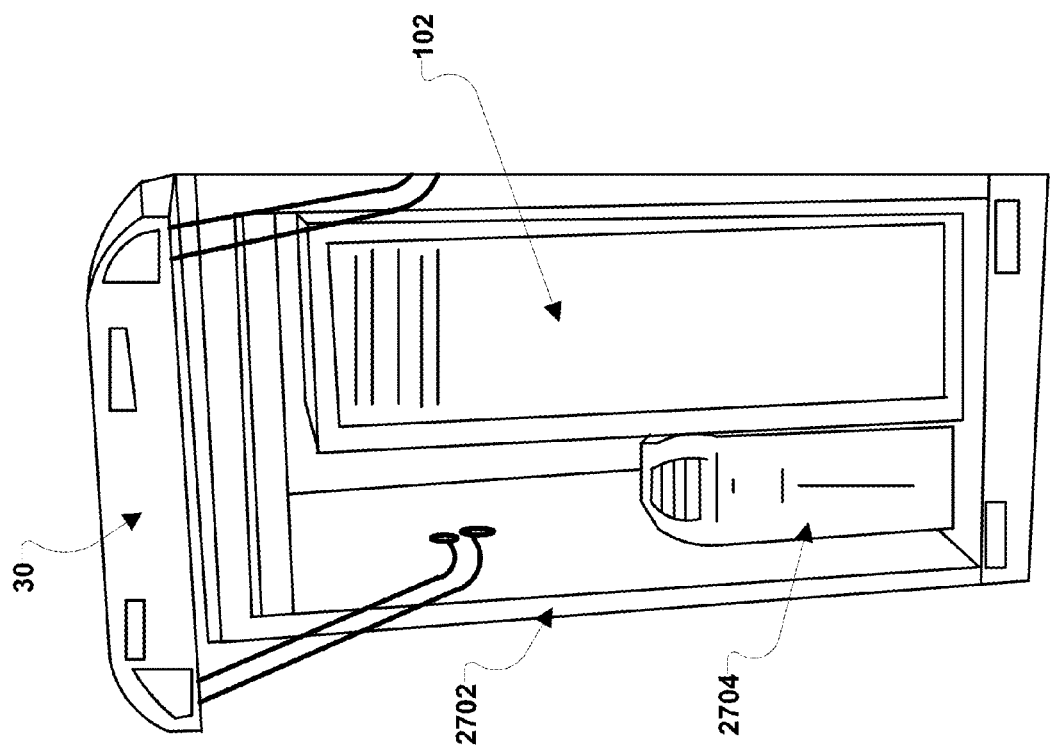
FIG. 29 is a schematic of an exemplary system of FIG. 27.

Optionally, as shown in FIGS. 27 and 29, a cooling device 2704, such as a chiller, may be located in the same cabinet 2702 as the IT load. The cooling device 2704 may provide cooling air to the IT load 102. For example, FIG. 29 shows a schematic of a cabinet 2702 with the door 30 open (located above the cabinet). A chiller 2704 is located on the side of the IT load 102 in the same cabinet 2704. The power modules 12 may provide power to the IT load 102 and/or cooling device 2704, but the IT load 102 and hot boxes 13 may be in different cabinets 12 and 2702, respectively.

Figure 28:
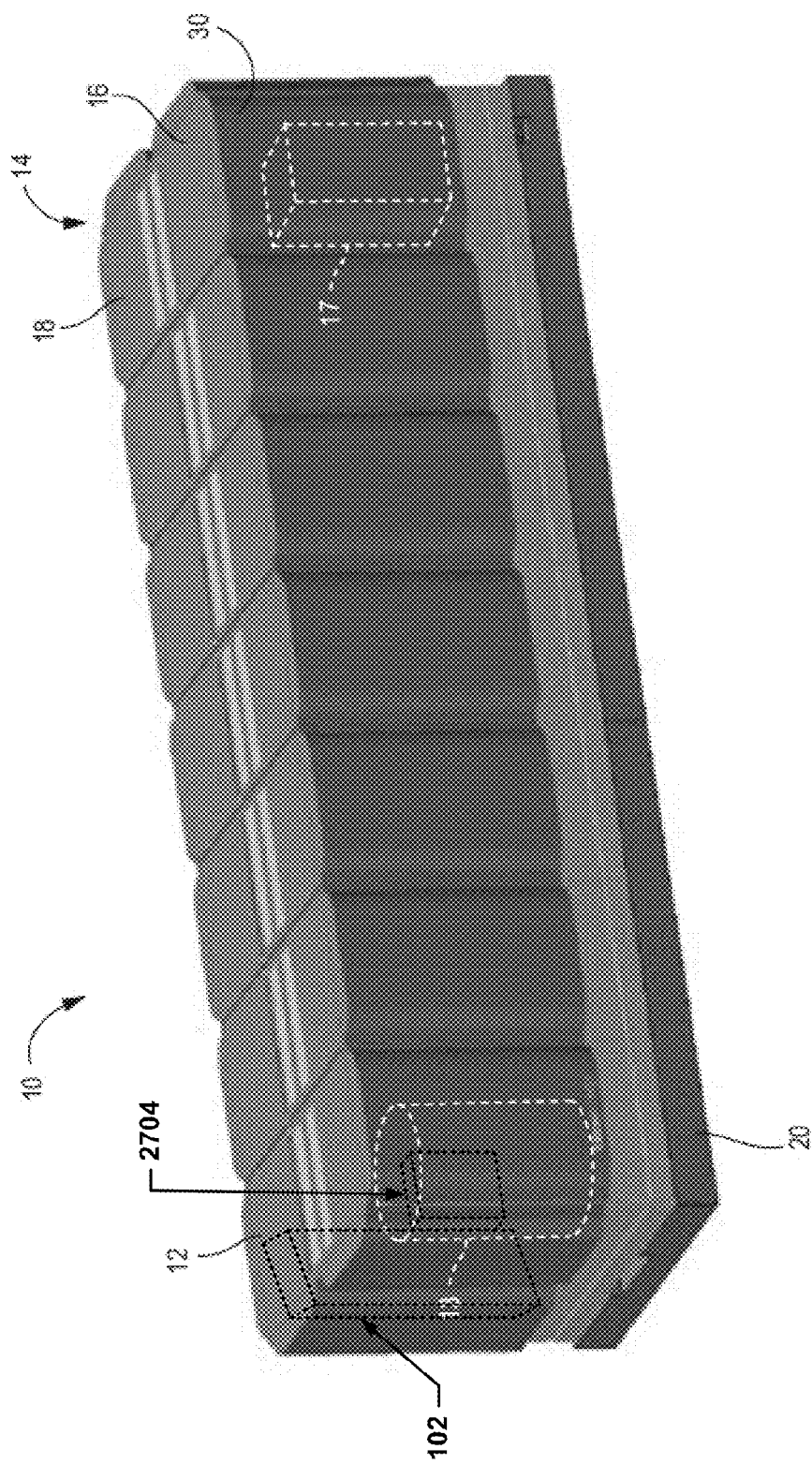

FIG. 28 illustrates a modular fuel cell system enclosure (i.e., fuel cell generator) according to another exemplary embodiment. The modular fuel cell system enclosure illustrated in FIG. 28 may be similar to the modular fuel cell system described in U.S. Provisional Patent Application Ser. No. 61/501,599, filed Jun. 27, 2011, entitled "Convergent Energized IT Apparatus for Commercial Use", which is incorporated herein by reference in its entirety, later filed as U.S. Patent Application Publication US 2012/0327592 claiming priority to U.S. Provisional Patent Application Ser. No. 61/501,599. In the modular fuel cell system enclosure illustrated in FIG. 28, the IT load 102, cooling device 2704, and fuel cell hot box 2704 may be in the same cabinet (i.e., power module 12). In an embodiment, access doors 30 on each side of the cabinet may enable the IT load 102 and cooling device 2704 to be accessed independently of the fuel cell hot box 13 through doors on opposite (e.g., front and back) sides of the cabinet.

Figure 30:
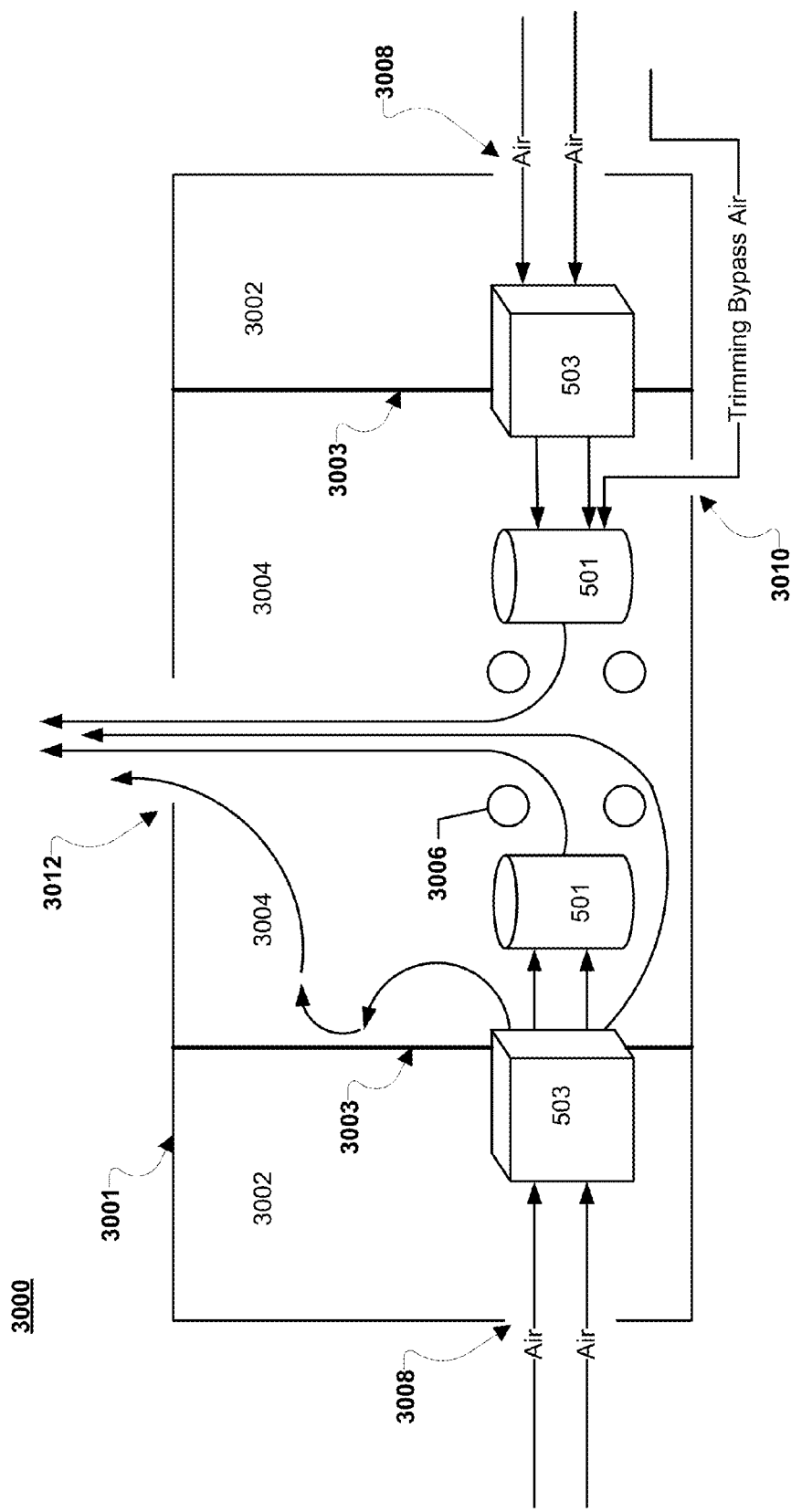
FIG. 30 is a cut-away side view of another embodiment data center.

FIG. 30 illustrates an embodiment data center 3000. In data center 3000 the building structure 3001 may include walls 3003 configured such that cooling air flow may not be allowed to bypass the IT loads 503 and flow back from an exhaust side of the IT loads 503 to an inlet side of the IT loads 503. The optional walls 3003 may be any type walls, such as a rigid barriers, flexible blockages, etc. While walls 3003 are illustrated as single walls, walls 3003 may be comprised of multiple walls. In an embodiment, the walls may run floor to ceiling and side to side creating a complete barrier separating the inlets of each of the IT loads 503 from the ventilation discharge side of the IT loads 503. By providing the walls 3003, a cold aisle 3002 at the inlet of each of the IT loads 503 may be created and a hot aisle 3004 at the ventilation discharge side of the IT loads 503 may be created. In an embodiment, the fuel cell generators 501 and ventilation blowers 3006 may be provided in the hot aisle 3004. In an embodiment, the cold aisle 3002 may be maintained at a temperature suitable for personnel to access the IT loads 503 while fuel cell generators 501 are in operation and the temperature of the hot aisle 3004 may be too high for personnel to enter the hot aisles 3004. In an embodiment in which cooling air passes from IT loads 503 then to fuel cell generators 501, the walls 3003 may separate a row of the IT loads 503 from a row of the fuel cell generators 501 such that the walls 3003 may allow the cooling air to pass from the air inlets 3008, through the row of IT loads 503 to the row of the fuel cell generators 501, but substantially prevent the air from passing back from the row of fuel cell generators 501 back to the row of IT loads 503. While all the air from the IT loads 503, may not pass to the fuel cell generators 501, the walls 3003 may direct the air to the exhaust conduit 3012, rather than back to the inlet side of the IT loads 503.

In an embodiment, air may be drawn into data center 3000 on one or more sides of the building structure 3001 through air inlet conduits 3008. In operation, ventilation blowers 3006 may blow air from the hot aisles 3004 out of the exhaust conduit 3012 and out of the building structure 3001. Heated air provided by the IT loads 503 into the fuel cell generators 501 may be used as the air inlet stream for the fuel cell hot box in the fuel cell generator 501. The positive pressure generated by the movement of air out of the hot aisles 3004 may draw air through the fuel cell generators 501, through the IT loads 503, and into the building structure 3001 through the air inlet conduits 3008. Additionally, a bypass air inlet 3010 may be provided in the building structure 3001 to provide cool air to the electronics of the fuel cell generators 501 without first passing the air through the IT loads 503. In this manner, if the fuel cell generator 501 electronics require air with a lower temperature than the process exhaust of the IT loads 503, the trimming bypass air may be provided by the bypass air inlet 3010 directly to the fuel cell generators 501. In an embodiment, the positive pressure created by ventilation blowers 3006 may draw the trimming bypass air in through the bypass air inlet 3010.

Figure 31:
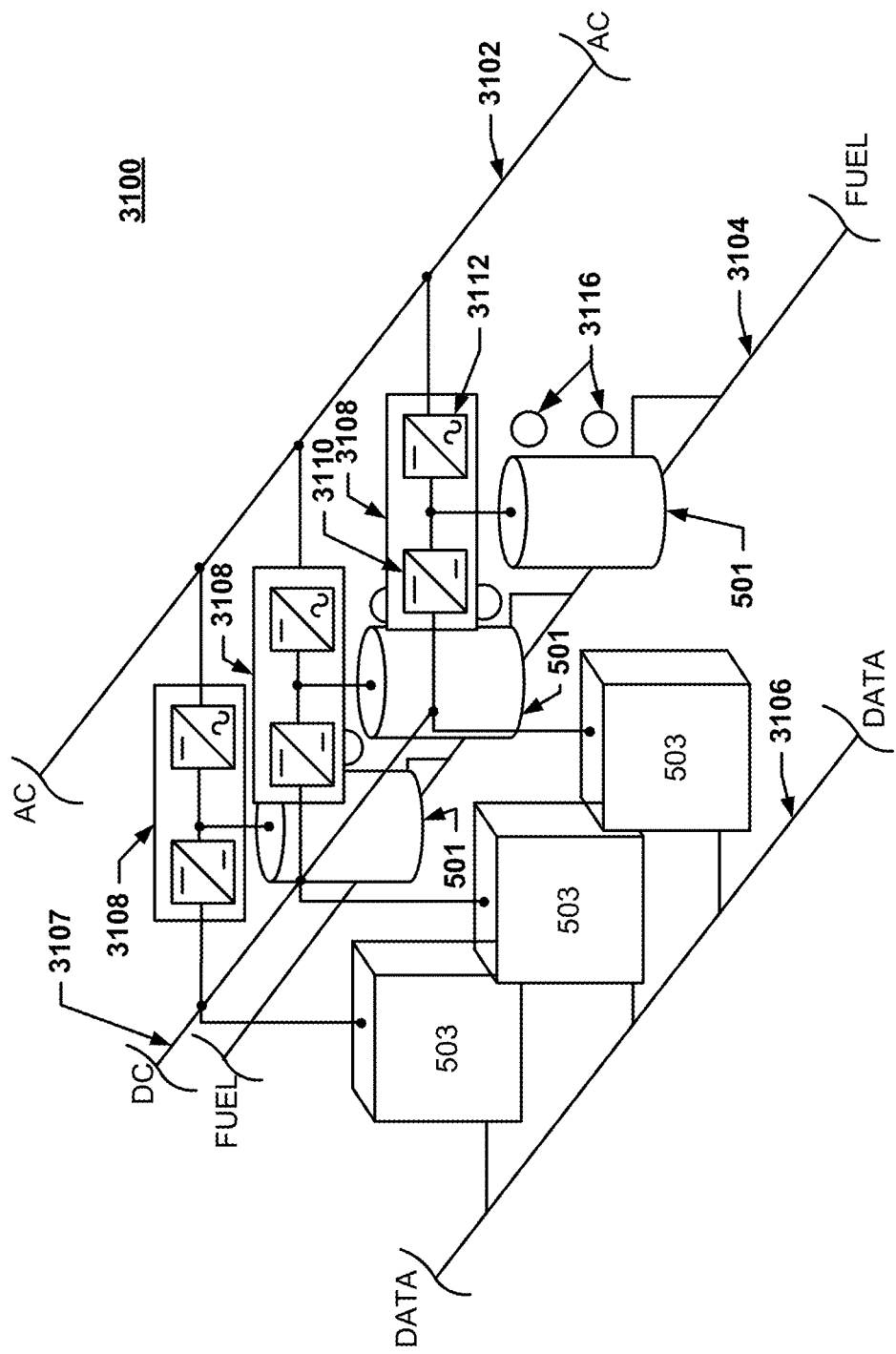
FIG. 31 is a block diagram of another data center according to another embodiment.

FIG. 31 illustrates examplary internal connections between fuel cell generators 501 and IT loads 501 in a data center 3100 according to an embodiment. The building structure and other features of the data center 3100 are removed for clarity. While illustrated as a single floor data center 3100, the connections described apply equally to multiple floor data centers with IT loads 503 and fuel cell generators 501 located on the same and/or different floors. Additionally, while three IT loads 503 and three fuel cell generators 501 are illustrated, the connections described apply equally to any number of IT loads 503 and fuel cell generators 501 connected together.

In data center 3100, rows of fuel cell generators 501 may receive fuel from a fuel supply conduit 3104. Each fuel cell generator 501 may be electrically connected with its own power electronics device 3108. In an embodiment, power electronics device 3108 may include a DC/DC converter 3110 (e.g., a boost/buck converter) and an AC/DC converter 3112. The power electronics device 3108 may also be electrically connected to an AC network 3102 (e.g., an AC grid connected bus) and a DC bus 3107 electrically connecting the IT loads 503 and the various power electronics devices 3108. The IT loads 503 may each be connected to a data bus 3106. In an embodiment, the fuel supply conduit 3104 and/or the data bus 3106 may be located inside the floor on which the IT loads 503 and/or the fuel cell generators 501 are located. In an embodiment, the AC network 3102 and/or the DC bus 3107 may be located over the fuel cell generators 501 and/or in the ceiling. Auxiliary devices, such as blowers 3116 may circulate fuel and/or air throughout the data center 3100. In operation, the fuel cell generators 501 may be operated to convert fuel provided from the fuel supply conduit 3104 to DC and provide the DC to the power electronics device 3108. The power electronics device 3108 may be controlled, such as by a controller configured with logic, to provide DC to the DC bus 3107 and thereby, to the IT loads 503. In this manner, the fuel cell generator 501 may provide power to the IT loads 503. Additionally, the power electronics device 3108 may receive AC from the AC network 3102. The power electronics device 3108 may be controlled, such as by a controller configured with logic, to convert the AC to DC and provide the DC to the DC bus 3107 and thereby, to the IT loads 503 and/or provide the DC to the fuel cell generator 501 (e.g., during start-up and/or to convert electricity to fuel in pump mode). Further, the power electronics device 3108 may be controlled, such as by a controller configured with logic, to convert the DC received from the fuel cell generator 501 to AC and provide the AC to the AC network 3102 (e.g., to provide/sell power to the grid). The IT loads 503 may use the power received from the AC network 3102 and/or fuel cell generators 503 via the power electronics devices 3108 to operate and may exchange data via the data bus 3106.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more block/flow diagrams have been used to describe exemplary embodiments. The use of block/flow diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements may be implemented using computing devices (such as computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A method for operating a data center, comprising
a plurality of information technology (IT) loads,
a plurality of fuel cell generators electrically coupled to the plurality of IT loads,
a building structure housing the plurality of fuel cell generators and the plurality of IT loads, wherein at least one of:
  the plurality of fuel cell generators and the plurality of IT loads are laterally separated and are located on a same floor of the building structure, or
  the plurality of fuel cell generators are located on a first floor of the building structure and none of the plurality of fuel cell generators are located on a second floor of the building structure, and the plurality of IT loads are located on the second floor and none of the plurality of fuel cell generators are located on the first floor, and
a cooling device, the method comprising:
operating the plurality of fuel cell generators to provide power to the plurality of IT loads;
providing a process exhaust stream from at least one of the plurality of fuel cell generators or the plurality of IT loads; and
using the process exhaust stream to cool at least one of the plurality of fuel cell generators or the plurality of IT loads.

2. The method of claim 1, wherein:
providing the process exhaust stream comprises providing the process exhaust stream from the plurality of fuel cell generators; and
using the process exhaust stream comprises using the process exhaust stream to cool the plurality of IT loads.

3. The method of claim 1, wherein:
providing the process exhaust stream comprises providing the process exhaust stream from the plurality of IT loads; and
using the process exhaust stream comprises using the process exhaust stream to cool the plurality of fuel cell generators.

4. The method of claim 1, further comprising:
monitoring the plurality of IT loads;
controlling an operation of the plurality of fuel cell generators to provide power to an energy storage device coupled to the plurality of IT loads; and
controlling an operation of the energy storage device to power to the plurality of IT loads.

5. The method of claim 1, wherein the building structure includes an air inlet conduit, an air filter coupled to the air inlet conduit, a fan, and an air exhaust conduit, the method further comprising:
operating the fan to draw air into the building structure via the air inlet conduit and circulate the air within the building structure;
filtering the air from the air inlet conduit to create filtered air;
providing the filtered air to the plurality of fuel cell generators or the plurality of IT loads; and
exhausting the air from the building structure via the air exhaust conduit.

6. The method of claim 5, further comprising:
exhausting a fuel exhaust stream from the plurality of fuel cell generators out a first side of the building structure different from a second side of the building structure from which the air inlet conduit draws the air; and
exhausting the process exhaust stream from the plurality of IT loads and the plurality of fuel cell generators out a third side of the building structure different from the second side of the building structure from which the air inlet conduit draws the air and the first side of the building structure from which the fuel exhaust stream from the plurality of fuel cell generators is exhausted.

7. The method of claim 5, wherein the at least one of: the plurality of fuel cell generators and the plurality of IT loads are laterally separated and are located on a same floor of the building structure, or the plurality of fuel cell generators are located on a first floor of the building structure and none of the plurality of fuel cell generators are located on a second floor of the building structure, and the plurality of IT loads are located on the second floor and none of the plurality of IT loads are located on the first floor is the plurality of fuel cell generators and the plurality of IT loads are laterally separated and are located on a same floor of the building structure, and
wherein the building structure comprises a first building portion housing the plurality of IT loads and a second building portion housing the plurality of fuel cell generators, the first building portion and a second building portion are two separate building portions connected together by a connection structure, the method further comprising:
passing the air from the first building portion to the second building portion via the connection structure.

8. The method of claim 7, further comprising maintaining the air temperature in the connection structure at 50 to 70 degrees Celsius.

9. The method of claim 7, further comprising: providing hot air exhausted from each of the plurality of IT loads to an air inlet of each of the plurality of fuel cell generators.

10. The method of claim 5, wherein each of the plurality of IT loads are one or more of a server, a computer, a router, or an IT rack.

11. The method of claim 1, wherein the plurality of IT loads is cooled by absorptive cooling.

12. The method of claim 1, wherein the plurality of IT loads is cooled by compression cooling.

13. The method of claim 1, further comprising:
removing water from the process exhaust stream of the plurality of fuel cell generators; and
cooling the plurality of IT loads using the removed water by evaporative cooling.

14. The method of claim 1, wherein the building structure further comprises a first electrically grounded metal skin and a second electrically grounded metal skin which is separately ground from the first electrically grounded metal skin and surrounds the first electrically grounded metal skin, wherein the ground of the second electrically grounded metal skin is isolated in a ground vault.

15. The method of claim 14, further comprising:
drawing air into the building structure via an air inlet conduit through at least a first metal mesh placed over an opening of both the first electrically grounded metal skin and the second electrically grounded metal skin and at least a second metal mesh placed between the first electrically grounded metal skin and the second electrically grounded metal skin.

16. The method of claim 1, further comprising:
determining a minimum runtime for each of the plurality of fuel cell generators;
providing a fuel storage for each of the plurality of fuel cell generators;
storing an amount of fuel in each fuel storage selected to provide the minimum runtime for a respective one of the plurality of fuel cell generators; and
cooling the plurality of IT loads using heat removal from the stored fuel.

17. The method of claim 16, wherein the heat removal from the stored fuel occurs during conversion of the stored fuel from a liquid to a gas or during expansion of the stored fuel.

18. A method for operating a data center, comprising
a plurality of information technology (IT) loads,
a plurality of fuel cell generators electrically coupled to the plurality of IT loads,
a building structure housing the plurality of fuel cell generators and the plurality of IT loads, wherein at least one of:
the plurality of fuel cell generators and the plurality of IT loads are laterally separated and are located on a same floor of the building structure, or
the plurality of fuel cell generators are located on a first floor of the building structure and none of the plurality of fuel cell generators are located on a second floor of the building structure, and the plurality of IT loads are located on the second floor and none of the plurality of IT loads are located on the first floor, and
a cooling device, the method comprising:
operating the fuel cell generator to provide power to the plurality of IT loads;
operating the cooling device to cool at least one of the plurality of fuel cell generators or the plurality of IT loads.

19. The method of claim 18, wherein the cooling device cools the plurality of fuel cell generators.

20. The method of claim 18, wherein the cooling device cools the plurality of IT loads.

21. The method of claim 18, wherein the cooling device cools both the plurality of fuel cell generators and the plurality of IT loads.

22. The method of claim 21, wherein the at least one of: the plurality of fuel cell generators and the plurality of IT loads are laterally separated and are located on a same floor of the building structure, or the plurality of fuel cell generators are located on a first floor of the building structure and none of the plurality of fuel cell generators are located on a second floor of the building structure, and the plurality of IT loads are located on the second floor and none of the plurality of IT loads are located on the first floor is the plurality of fuel cell generators and the plurality of IT loads are laterally separated and are located on a same floor of the building structure, and
wherein the plurality of fuel cell generators and the plurality of IT loads are located in a staggered arrangement or in a back to back arrangement.

23. The method of claim 22, wherein the cooling device comprises at least one fan which draws in cooling air from outside of the building structure, and the step of cooling both the plurality of IT loads and the plurality of fuel cell generators comprises passing the cooling air from the at least one fan through the plurality of IT loads and then past the plurality of fuel cell generators followed by exhausting the air through a roof of the building structure.

24. The method of claim 23, further comprising a separating wall which separates a row of the plurality of IT loads from a row of the plurality of fuel cell generators such that the wall allows the cooling air to pass from the at least one fan through the row of plurality of IT loads to the row of the plurality of fuel cell generators but substantially prevents the air from passing back from the row of plurality of fuel cell generators back to the row of plurality of IT loads.

25. The method of claim 21, wherein the at least one of: the plurality of fuel cell generators and the plurality of IT loads are laterally separated and are located on a same floor of the building structure, or the plurality of fuel cell generators are located on a first floor of the building structure and none of the plurality of fuel cell generators are located on a second floor of the building structure, and the plurality of IT loads are located on the second floor and none of the plurality of IT loads are located on the first floor is the plurality of fuel cell generators are located on a first floor of the building structure and none of the plurality of fuel cell generators are located on a second floor of the building structure, and the plurality of IT loads are located on the second floor and none of the plurality of IT loads are located on the first floor, and
wherein the building structure includes an air inlet conduit, an air filter coupled to the air inlet conduit, the cooling device comprising a fan, and an air exhaust conduit, the method further comprising:
operating the fan to draw air into the building structure via the air inlet conduit and circulate the air within the building structure;
filtering the air from the air inlet conduit to create filtered air;
providing the filtered air to the plurality of fuel cell generators or the plurality of IT loads; and
exhausting the air from the building structure via the air exhaust conduit.

26. The method of claim 25, wherein the plurality of fuel cell generators or the plurality of IT loads are arranged in rows to form a plurality of fuel cell generators aisles between the rows of the plurality of fuel cell generators or a plurality of IT load aisles between the rows of the plurality of IT loads, the method further comprising:
providing the filtered air down the plurality of fuel cell generators aisles or the plurality of IT loads aisles; and
exhausting the air out a roof or a side of the building different from the side of the building structure the air inlet conduit draws the air in from.

27. The method of claim 26, wherein:
a first portion of the aisles between the rows of the plurality of IT loads are intake aisles configured to receive the air from the air inlet conduit, the intake aisles having no outlet to the air exhaust conduit;
a second portion of the aisles between the rows of the plurality of IT loads are outlet aisles configured to exhaust the air to the air exhaust conduit, the outlet aisles having no inlets to the air inlet conduit; and
consecutive aisles are alternatively intake aisles and outlet aisles, the method further comprising:
providing the air entering the building structure passes from the air inlet conduit, down the intake aisles, across the plurality of IT loads, down the outlet aisles, out the air exhaust conduit, and out of the building structure.

28. The method of claim 18, wherein the at least one of: the plurality of fuel cell generators and the plurality of IT loads are laterally separated and are located on a same floor of the building structure, or the plurality of fuel cell generators are located on a first floor of the building structure and none of the plurality of fuel cell generators are located on a second floor of the building structure, and the plurality of IT loads are located on the second floor and none of the plurality of IT loads are located on the first floor is the plurality of fuel cell generators are located on a first floor of the building structure and none of the plurality of fuel cell generators are located on a second floor of the building structure, and the plurality of IT loads are located on the second floor and none of the plurality of IT loads are located on the first floor, the method further comprising:
controlling access to the first floor and the second floor by different security protocols; and
paging a security team, wiping data, writing-out master boot sectors, triggering a local electromagnetic pulse, shutting down a server, or shutting down power in response to a security violation on the first floor or the second floor.

29. The method of claim 18, further comprising:
converting enthalpy of the plurality of fuel cell generators process exhaust stream to work energy; and
converting the work energy to power for the plurality of IT loads.

30. The method of claim 29, wherein the enthalpy of the process exhaust stream is converted to the work energy at least in part by a turbine coupled to a generator, a reciprocating heat engine, a Stirling engine, thermoelectric devices, or pyroelectric devices.

31. The method of claim 18, wherein:
the plurality of IT loads and the plurality of fuel cell generators occupy more than 95% of a usable space in the building structure.

32. The method of claim 18, wherein the cooling device and a respective one of the plurality of IT loads are located in a same cabinet of a modular fuel cell system enclosure.

* * * * *